US009590631B2

(12) United States Patent
Masuoka et al.

(10) Patent No.: US 9,590,631 B2
(45) Date of Patent: Mar. 7, 2017

(54) SEMICONDUCTOR DEVICE

(71) Applicant: Unisantis Electronics Singapore Pte. Ltd., Singapore (SG)

(72) Inventors: Fujio Masuoka, Tokyo (JP); Masamichi Asano, Musashino (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/214,940

(22) Filed: Jul. 20, 2016

(65) Prior Publication Data

US 2016/0344389 A1 Nov. 24, 2016

Related U.S. Application Data

(63) Continuation of application No. PCT/JP2014/061240, filed on Apr. 22, 2014.

(51) Int. Cl.

| | |
|---|---|
| ***G11C 8/00*** | (2006.01) |
| ***H03K 19/0948*** | (2006.01) |
| ***H01L 27/105*** | (2006.01) |
| ***H01L 27/02*** | (2006.01) |
| ***H01L 29/423*** | (2006.01) |
| ***H03K 19/20*** | (2006.01) |

(52) U.S. Cl.

CPC ..... *H03K 19/0948* (2013.01); *H01L 27/0207* (2013.01); *H01L 27/105* (2013.01); *H01L 29/42356* (2013.01); *H03K 19/20* (2013.01)

(58) Field of Classification Search

CPC ....... H03K 19/20; G11C 8/10; G11C 2213/75

USPC ......................................... 326/104–105, 108

See application file for complete search history.

(56) References Cited

U.S. PATENT DOCUMENTS

| | | | | |
|---|---|---|---|---|
| 5,703,617 A * | 12/1997 | Callahan, Jr. | G09G 3/2011 | 326/105 |
| 5,793,695 A * | 8/1998 | Kohno | G11C 8/10 | 365/189.11 |
| 6,144,584 A * | 11/2000 | Kunori | G11C 16/0408 | 257/E21.682 |
| 6,852,578 B2 * | 2/2005 | Chang | G11C 11/412 | 257/256 |
| 8,039,893 B2 | 10/2011 | Masuoka et al. | | |

(Continued)

FOREIGN PATENT DOCUMENTS

| | | |
|---|---|---|
| JP | H06-119795 A | 4/1994 |
| JP | 2003-249098 A | 9/2003 |
| JP | 2008-300558 A | 12/2008 |
| JP | 2011-108702 A | 6/2011 |

(Continued)

OTHER PUBLICATIONS

Yoshizawa, H., "CMOS OP AMP Kairo Jitsumu Sekkei No Kiso", *CMOS OP Amplifier Circuit, Basis of Practical Design*, CQ Publishing Co., Ltd., May 15, 2007, 8 pages. (English language translation included).

(Continued)

*Primary Examiner* — Jason M Crawford

(74) *Attorney, Agent, or Firm* — Brinks Gilson & Lione

(57) ABSTRACT

A semiconductor device includes a 2-input NAND decoder and an inverter that have six MOS transistors arranged in a line. The MOS transistors of the decoder are formed in a planar silicon layer disposed on a substrate and each have a structure in which a drain, a gate, and a source are arranged vertically and the gate surrounds a silicon pillar. The planar silicon layer includes a first active region having a first conductivity type and a second active region having a second conductivity type. The first and second active regions are connected to each other via a silicon layer on a surface of the planar silicon layer.

28 Claims, 74 Drawing Sheets

SELECTED FIGURE

2-INPUT NAND DECODER ARRANGED IN A LINE

(56) References Cited

U.S. PATENT DOCUMENTS

| | | | | |
|---|---|---|---|---|
| 9,019,768 | B1 * | 4/2015 | Lee | G11C 16/0483 365/185.05 |
| 2003/0156485 | A1 | 8/2003 | Tomita et al. | |
| 2005/0047209 | A1 * | 3/2005 | Masuoka | G11C 16/0483 365/185.13 |
| 2010/0213525 | A1 | 8/2010 | Masuoka et al. | |
| 2011/0115011 | A1 | 5/2011 | Masuoka et al. | |
| 2015/0206588 | A1 * | 7/2015 | Masuoka | G11C 16/08 257/329 |
| 2016/0042783 | A1 * | 2/2016 | Masuoka | H01L 27/092 365/154 |

FOREIGN PATENT DOCUMENTS

| | | | |
|---|---|---|---|
| JP | 4756221 | B | 8/2011 |
| JP | 5031809 | B | 9/2012 |
| JP | 5130596 | B | 1/2013 |
| WO | WO 2009/096465 | A1 | 8/2009 |
| WO | WO 2009/096468 | A1 | 8/2009 |
| WO | WO 2011/043402 | A1 | 4/2011 |

OTHER PUBLICATIONS

International Search Report, and English language translation thereof, in corresponding International Application No. PCT/JP2014/061240, dated Jun. 3, 2014, 8 pages.

English language translation of International Preliminary Report on Patentability in corresponding International Application No. PCT/JP2014/061240, dated Nov. 3, 2016, 6 pages.

* cited by examiner

2-INPUT NAND DECODER ARRANGED IN A LINE

2-INPUT NAND DECODER ARRANGED IN A LINE
FIG. 2A SELECTED FIGURE
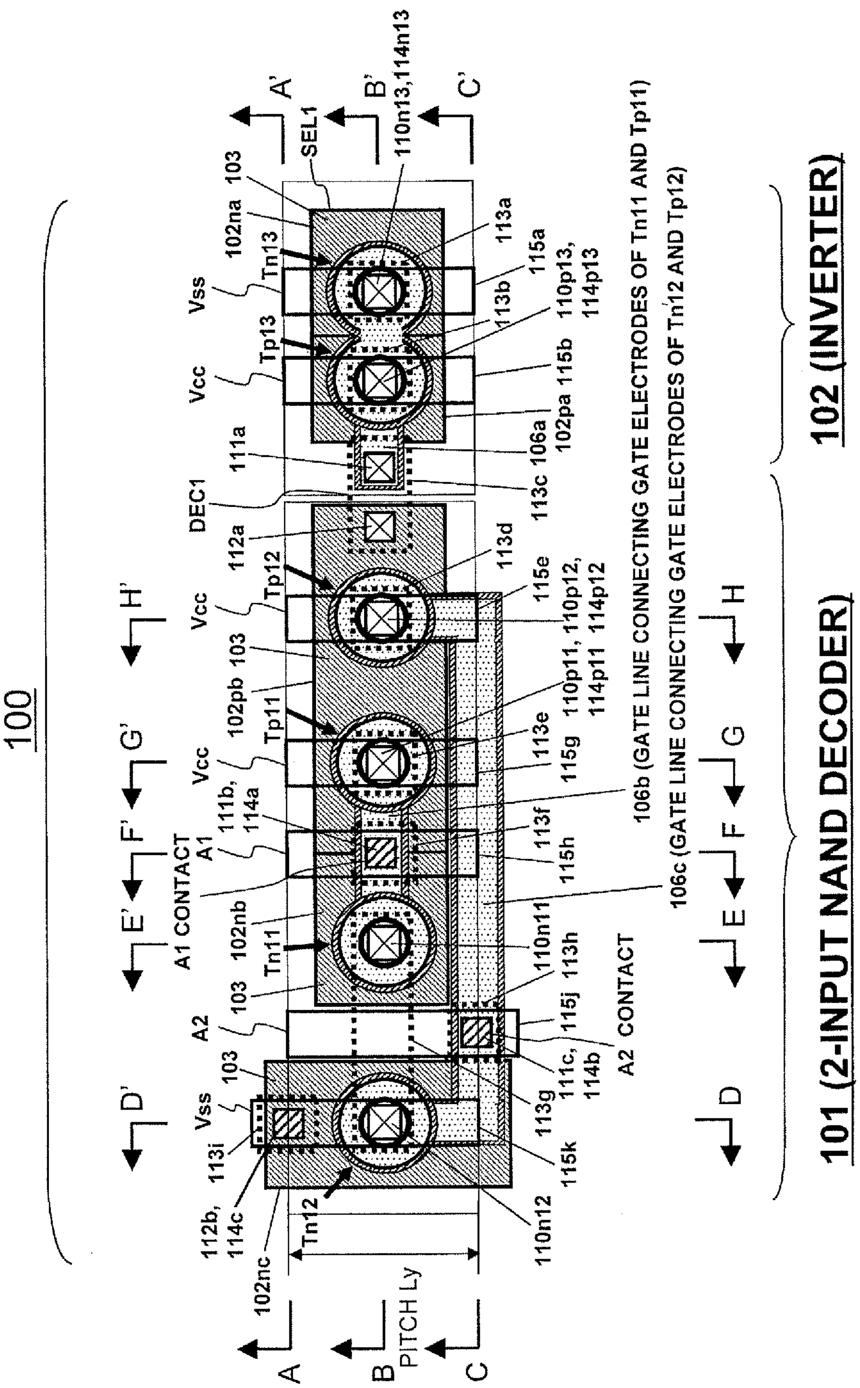

2-INPUT NAND DECODER ARRANGED IN A LINE

VIEW ILLUSTRATING ONLY TRANSISTORS AND GATE LINES

CROSS-SECTION ALONG A-A'

CROSS-SECTION ALONG B-B'

8-DECODER CONFIGURATION WITH ADDRESS SIGNAL LINES A1 TO A6

FIG. 5

2-INPUT NAND DECODER ARRANGED IN A LINE

ADDRESS MAP

| | A1 | A2 | A3 | A4 | A5 | A6 |
|---|---|---|---|---|---|---|
| DEC1 / SEL1 | O | - | O | - | - | - |
| DEC2 / SEL2 | - | O | O | - | - | - |
| DEC3 / SEL3 | O | - | - | O | - | - |
| DEC4 / SEL4 | - | O | - | O | - | - |
| DEC5 / SEL5 | O | - | - | - | O | - |
| DEC6 / SEL6 | - | O | - | - | O | - |
| DEC7 / SEL7 | O | - | - | - | - | O |
| DEC8 / SEL8 | - | O | - | - | - | O |

O : Contact

BLOCKS 100-1 TO 100-4 AMONG 8 BLOCKS

2-INPUT NAND DECODER ARRANGED IN A LINE

BLOCKS 100-5 TO 100-8 AMONG 8 BLOCKS

2-INPUT NAND DECODER ARRANGED IN A LINE

VIEW ILLUSTRATING TRANSISTORS AND GATE LINES

2-INPUT NAND DECODER ARRANGED IN A LINE

2-INPUT NAND DECODER ARRANGED IN A LINE

CROSS-SECTION ALONG A-A'

CROSS-SECTION ALONG B-B'

CROSS-SECTION ALONG C-C'

CROSS-SECTION ALONG D-D'

2-INPUT NAND DECODER ARRANGED IN A LINE

CROSS-SECTION ALONG E-E'

2-INPUT NAND DECODER ARRANGED IN A LINE

CROSS-SECTION ALONG F-F'

2-INPUT NAND DECODER ARRANGED IN A LINE

CROSS-SECTION ALONG G-G'

2-INPUT NAND DECODER ARRANGED IN A LINE
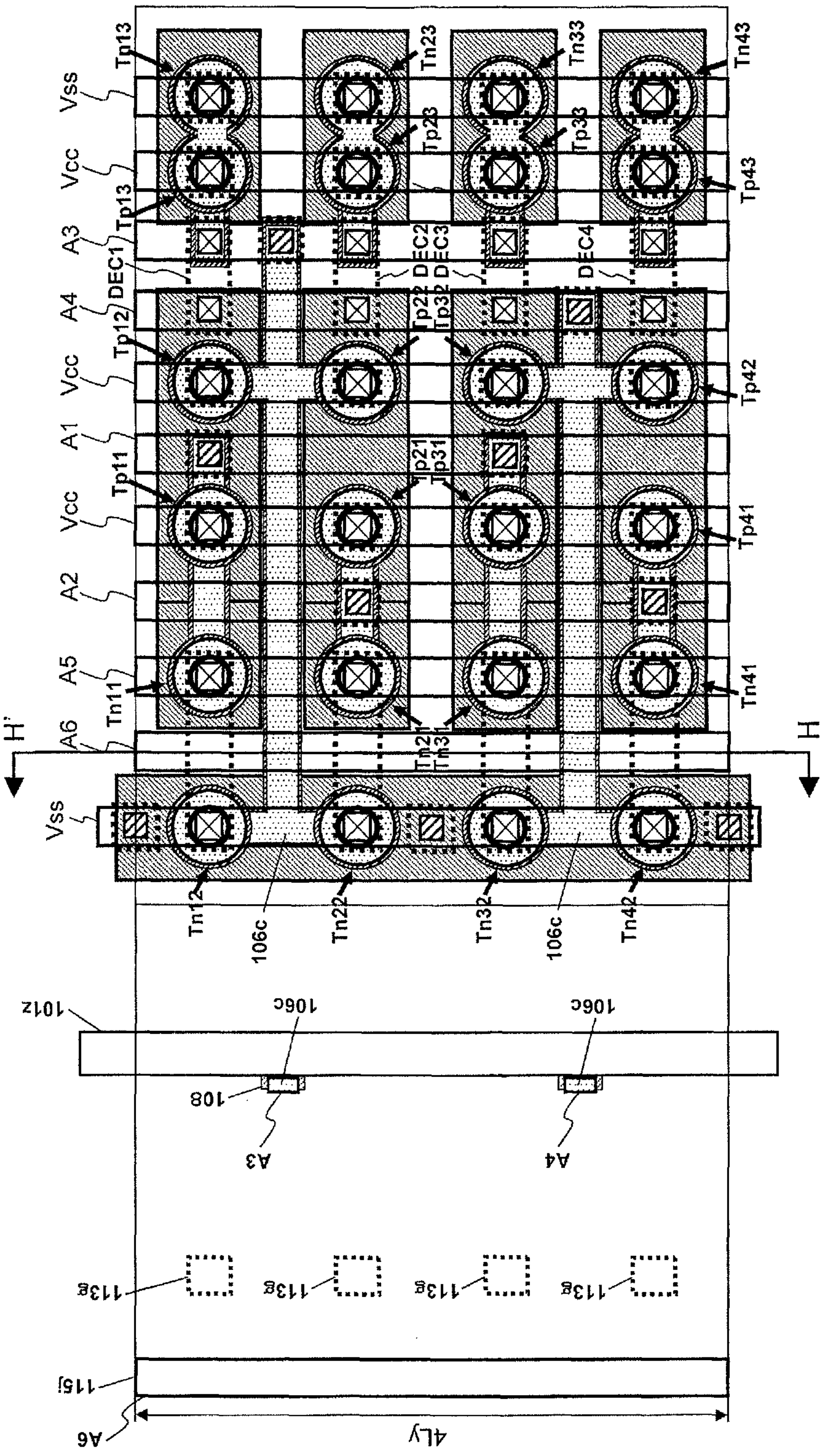
FIG. 7H CROSS-SECTION ALONG H-H'

2-INPUT NAND DECODER ARRANGED IN A LINE

CROSS-SECTION ALONG J-J'

2-INPUT NAND DECODER ARRANGED IN A LINE
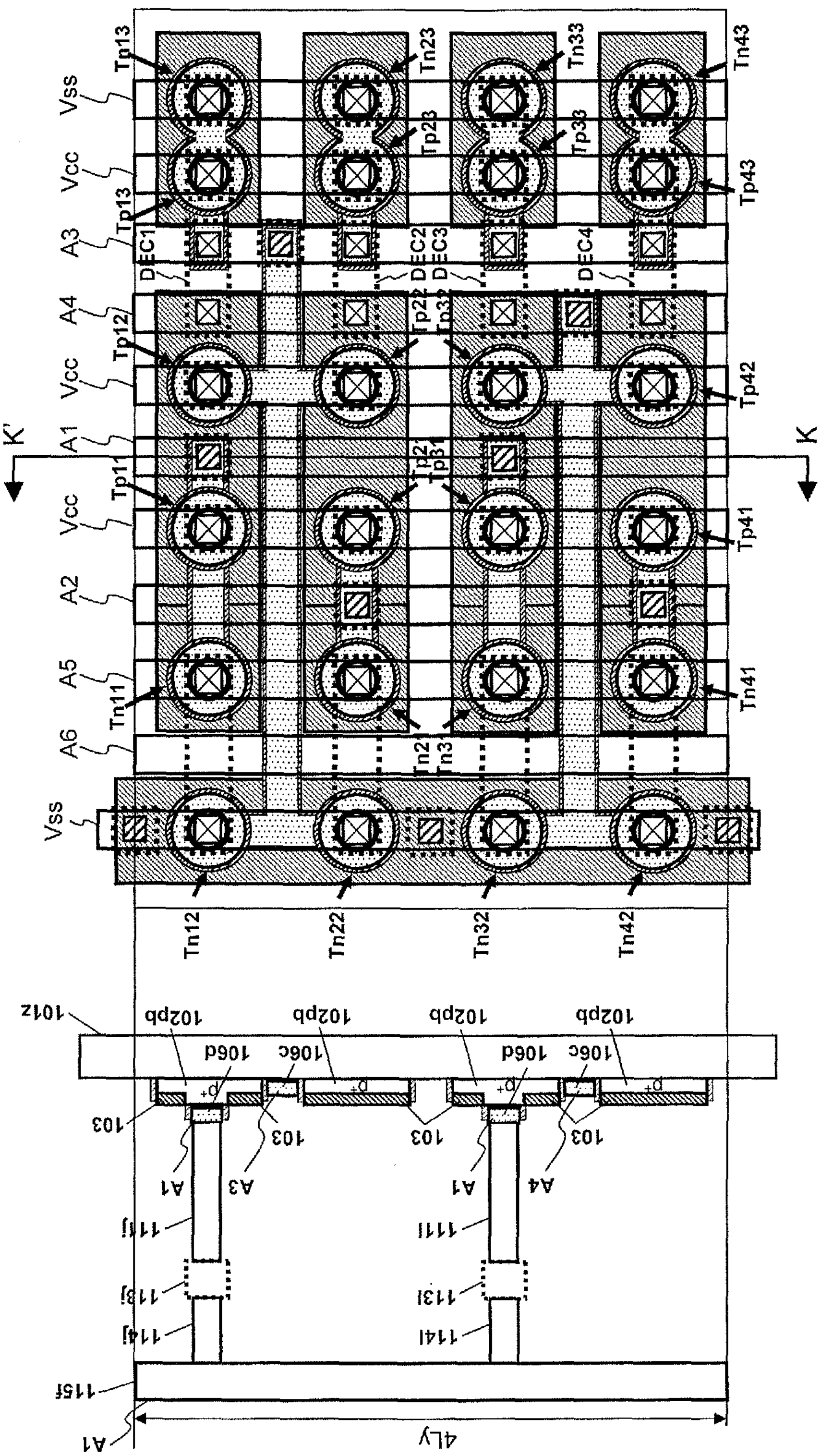
FIG. 7K CROSS-SECTION ALONG K-K'

2-INPUT NAND DECODER ARRANGED IN A LINE

CROSS-SECTION ALONG M-M'

2-INPUT NAND DECODER ARRANGED IN A LINE

CROSS-SECTION ALONG N-N'

2-INPUT NAND DECODER ARRANGED IN A LINE

CROSS-SECTION ALONG P-P'

2-INPUT NAND DECODER ARRANGED IN A LINE

CROSS-SECTION ALONG Q-Q'

2-INPUT NAND DECODER ARRANGED IN A LINE

CROSS-SECTION ALONG R-R'

2-INPUT NAND DECODER ARRANGED IN A LINE

2-INPUT NAND DECODER ARRANGED IN A LINE

CROSS-SECTION ALONG A-A'

CROSS-SECTION ALONG B-B'

CROSS-SECTION ALONG C-C'

2-INPUT NAND DECODER ARRANGED IN A LINE

CROSS-SECTION ALONG D-D'

2-INPUT NAND DECODER ARRANGED IN A LINE

CROSS-SECTION ALONG E-E'

2-INPUT NAND DECODER ARRANGED IN A LINE

CROSS-SECTION ALONG F-F'

2-INPUT NAND DECODER ARRANGED IN A LINE

CROSS-SECTION ALONG G-G'

2-INPUT NAND DECODER ARRANGED IN A LINE

CROSS-SECTION ALONG H-H'

2-INPUT NAND DECODER ARRANGED IN A LINE

CROSS-SECTION ALONG I-I'

2-INPUT NAND DECODER ARRANGED IN A LINE

CROSS-SECTION ALONG J-J'

EIGHT DECODERS IN 16-DECODER CONFIGURATION WITH ADDRESS SIGNAL LINES A1 TO A8

FIG. 12

2-INPUT NAND DECODER ARRANGED IN A LINE

ADDRESS MAP

| | A1 | A2 | A3 | A4 | A5 | A6 | A7 | A8 |
|---|---|---|---|---|---|---|---|---|
| DEC1 / SEL1 | ○ | - | - | - | ○ | - | - | - |
| DEC2 / SEL2 | - | ○ | - | - | ○ | - | - | - |
| DEC3 / SEL3 | - | - | ○ | - | ○ | - | - | - |
| DEC4 / SEL4 | - | - | - | ○ | ○ | - | - | - |
| DEC5 / SEL5 | ○ | - | - | - | - | ○ | - | - |
| DEC6 / SEL6 | - | ○ | - | - | - | ○ | - | - |
| DEC7 / SEL7 | - | - | ○ | - | - | ○ | - | - |
| DEC8 / SEL8 | - | - | - | ○ | - | ○ | - | - |
| DEC9 / SEL9 | ○ | - | - | - | - | - | ○ | - |
| DEC10 / SEL10 | - | ○ | - | - | - | - | ○ | - |
| DEC11 / SEL11 | - | - | ○ | - | - | - | ○ | - |
| DEC12 / SEL12 | - | - | - | ○ | - | - | ○ | - |
| DEC13 / SEL13 | ○ | - | - | - | - | - | - | ○ |
| DEC14 / SEL14 | - | ○ | - | - | - | - | - | ○ |
| DEC15 / SEL15 | - | - | ○ | - | - | - | - | ○ |
| DEC16 / SEL16 | - | - | - | ○ | - | - | - | ○ |

○ : Contact

FIG. 13B BLOCKS 200-5 TO 200-8
2-INPUT NAND DECODER ARRANGED IN A LINE
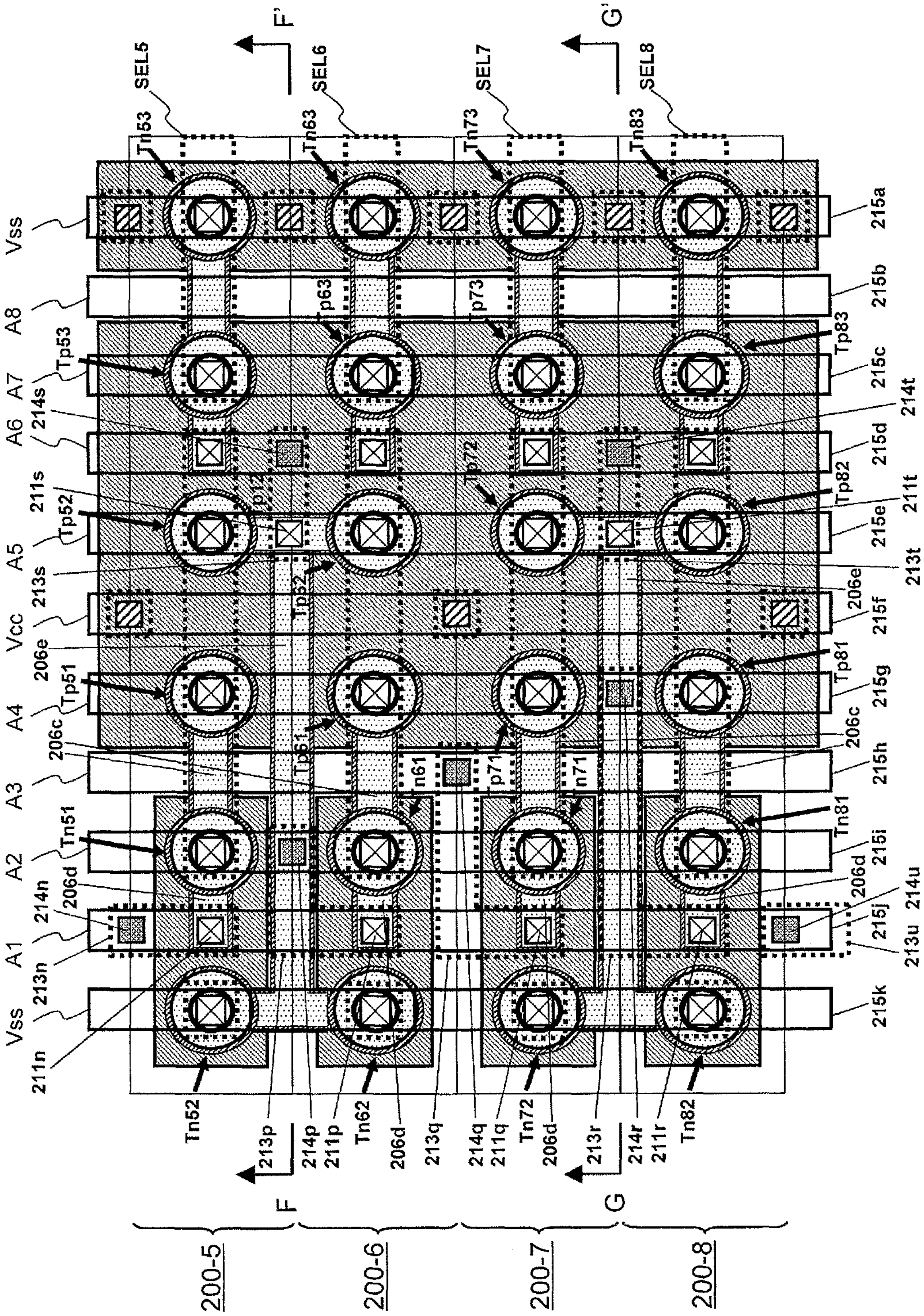

BLOCKS 200-9 TO 200-12

2-INPUT NAND DECODER ARRANGED IN A LINE

BLOCKS 200-13 TO 200-16

2-INPUT NAND DECODER ARRANGED IN A LINE

CONTACTS AND FIRST METAL LINES IN FIG. 13A

2-INPUT NAND DECODER ARRANGED IN A LINE

CONTACTS AND FIRST METAL LINES IN FIG. 13D

2-INPUT NAND DECODER ARRANGED IN A LINE

CROSS-SECTION ALONG A-A'

CROSS-SECTION
ALONG B-B'

CROSS-SECTION ALONG C-C'

CROSS-SECTION ALONG D-D'

CROSS-SECTION ALONG E-E'

CROSS-SECTION ALONG F-F'

CROSS-SECTION ALONG G-G'

CROSS-SECTION ALONG H-H'

CROSS-SECTION
ALONG I-I'

CROSS-SECTION
ALONG J-J'

CROSS-SECTION ALONG K-K'

2-INPUT NAND DECODER ARRANGED IN A LINE
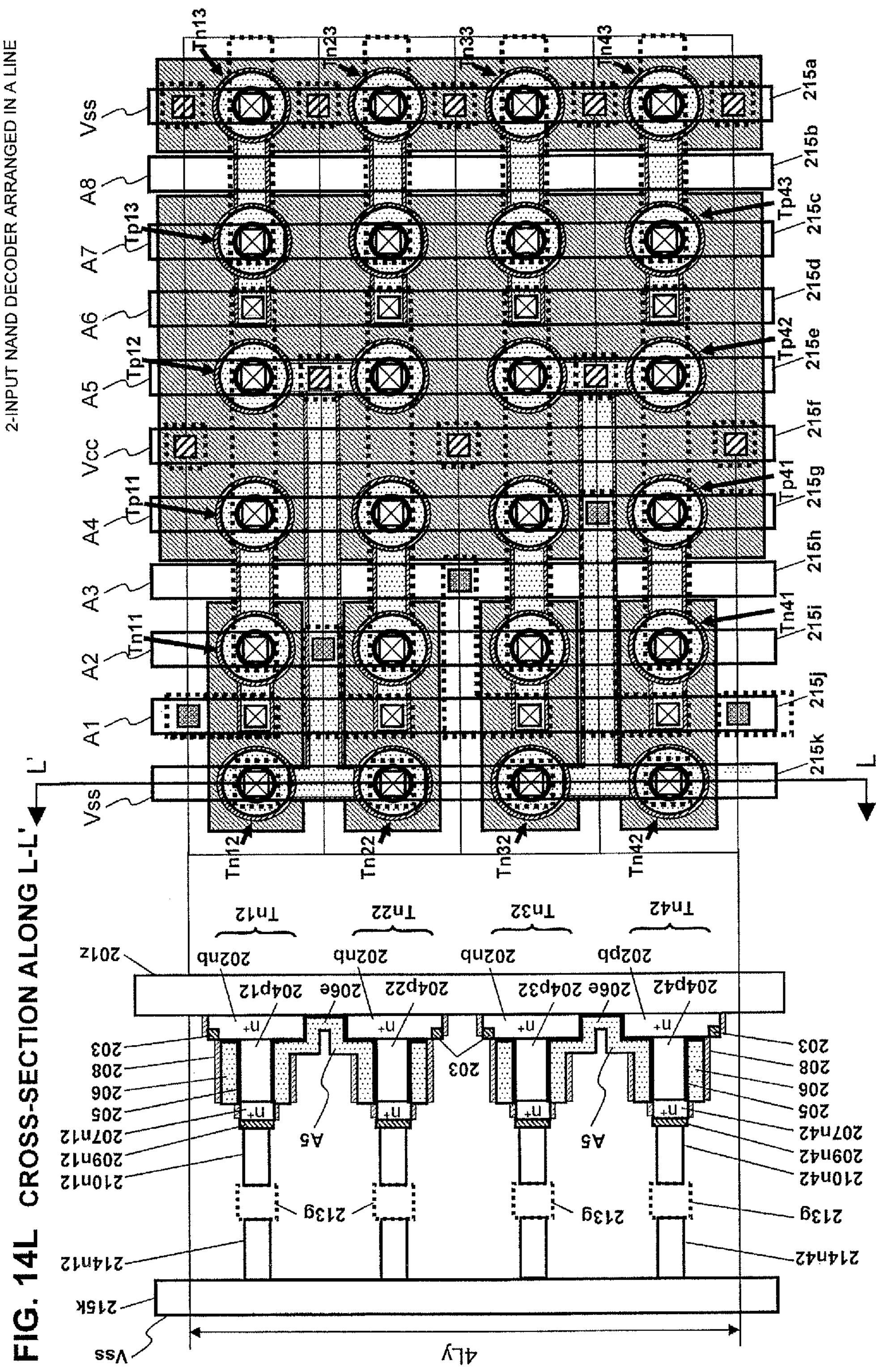
FIG. 14L CROSS-SECTION ALONG L-L'

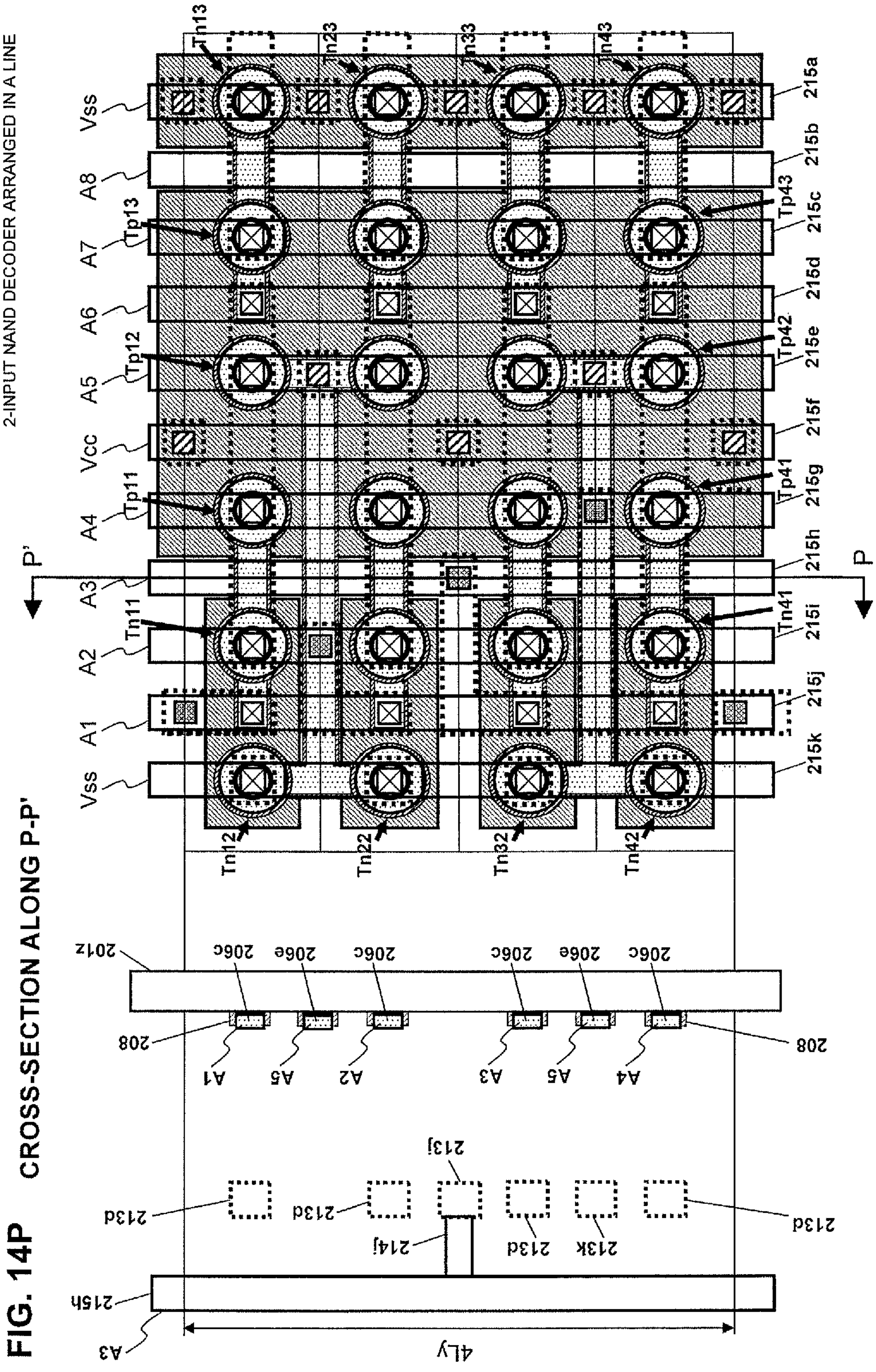
FIG. 14P CROSS-SECTION ALONG P-P'

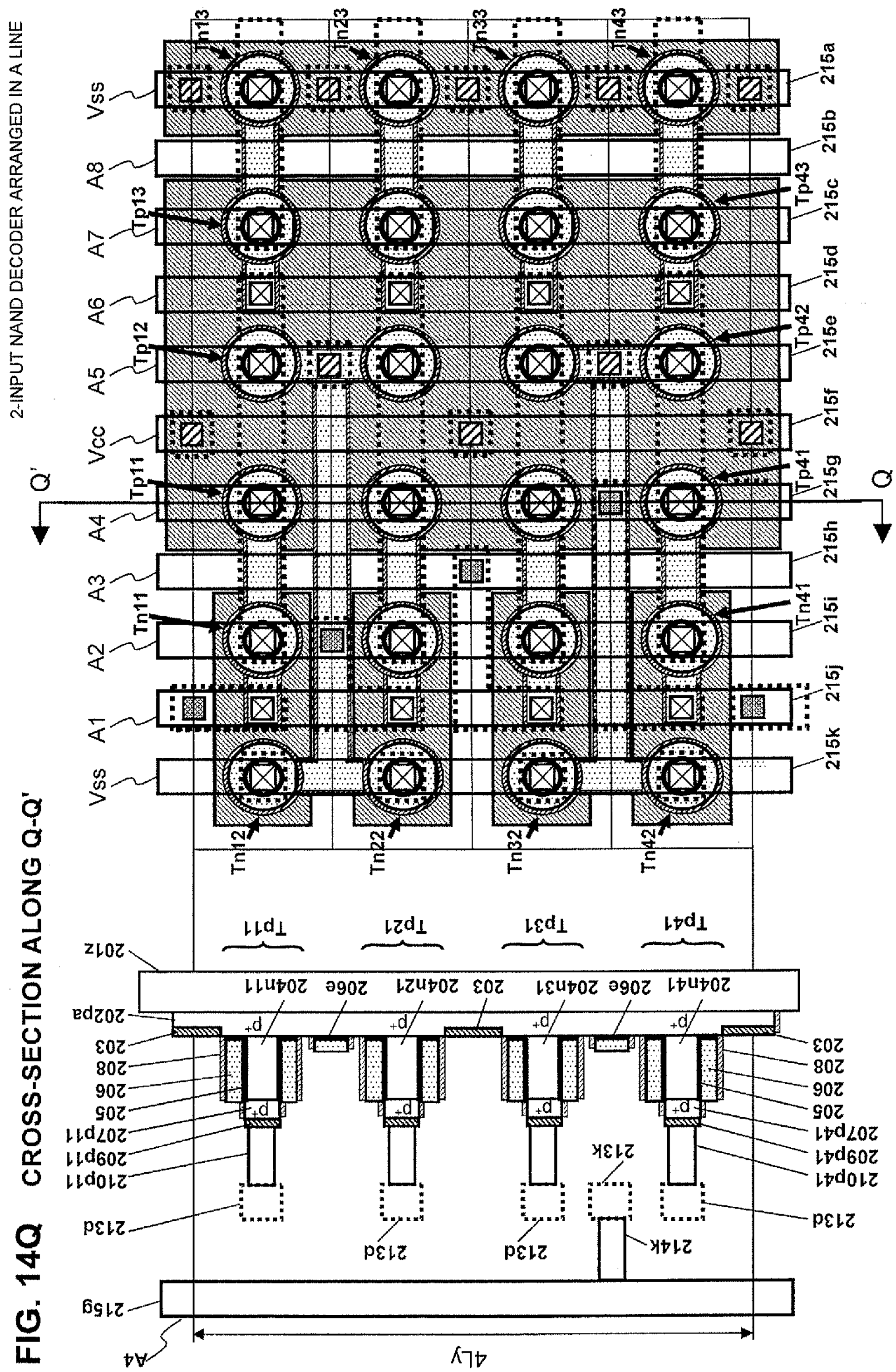
FIG. 14Q CROSS-SECTION ALONG Q-Q'

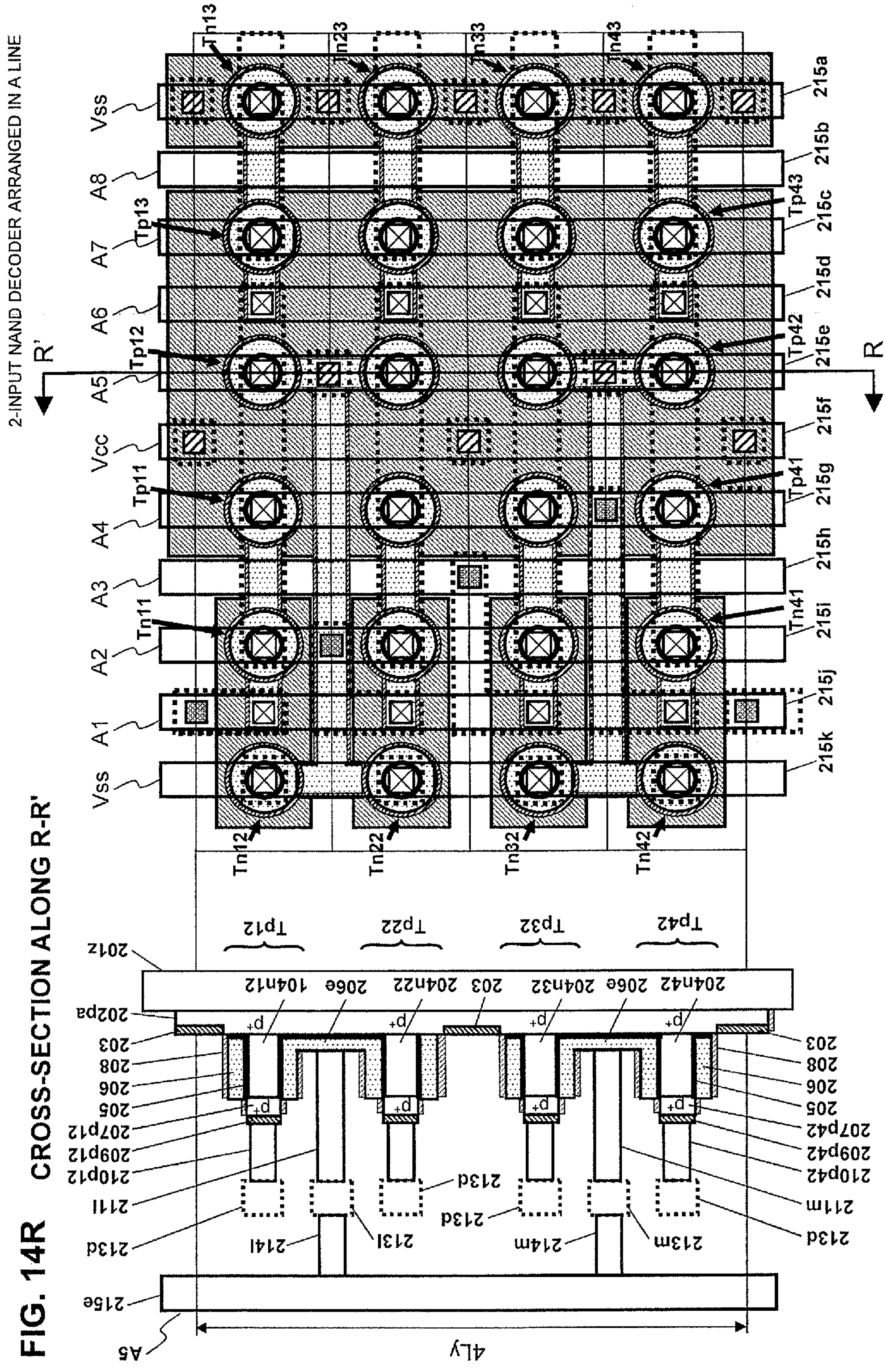
FIG. 14R CROSS-SECTION ALONG R-R'

2-INPUT NAND DECODER ARRANGED IN A LINE
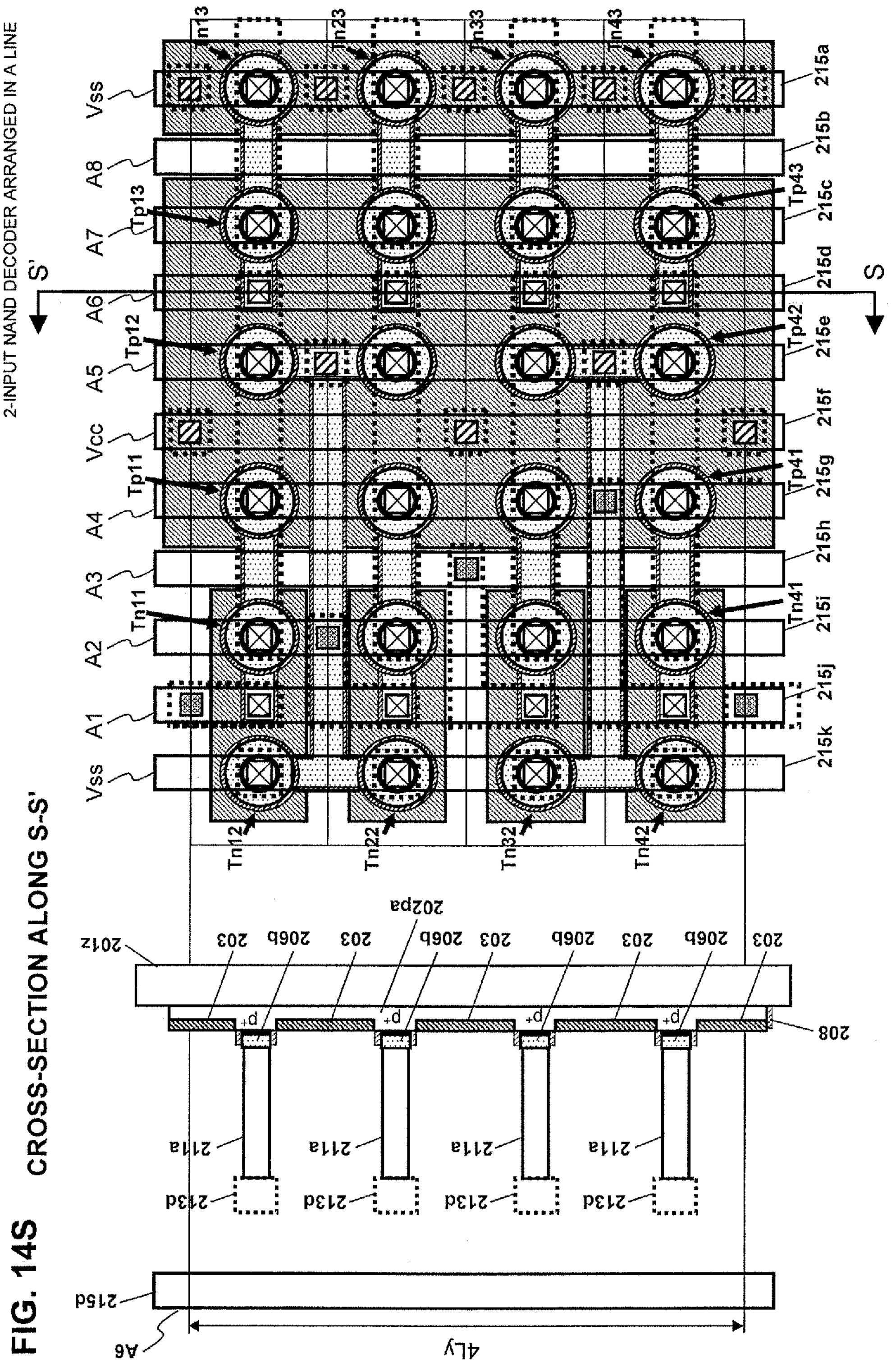
FIG. 14S CROSS-SECTION ALONG S-S'

2-INPUT NAND DECODER ARRANGED IN A LINE

SEMICONDUCTOR DEVICE

RELATED APPLICATIONS

The present application is a continuation of International Application PCT/JP2014/061240, with an international filing date of Apr. 22, 2014, the entire contents of which are incorporated herein by reference.

BACKGROUND OF THE INVENTION

1. Field of the Invention

The present invention relates to a semiconductor device.

2. Description of the Related Art

With the recent increase in the integration of semiconductor integrated circuits, semiconductor chips having as large a number of transistors as 1,000,000,000 (1 Giga (G)), have been developed for state-of-the-art micro-processing units (MPUs). As disclosed by Hirokazu YOSHIZAWA in "Shi mosu opi anpu kairo jitsumu sekkei no kiso (Fundamentals on CMOS OP amp circuit design for practical use)", CQ Publishing Co., Ltd., p. 23, traditional transistors formed in a planar manner, called planar transistors, require complete isolation of an n-well region that forms a p-channel metal-oxide semiconductor (PMOS) and a p-type silicon substrate (or p-well region) that forms an n-channel metal-oxide semiconductor (NMOS) from each other. In addition, the n-well region and the p-type silicon substrate require body terminals for applying potentials thereto, which will contribute to a further increase in the area of the transistors.

To address the issues described above, a surrounding gate transistor (SGT) having a structure in which a source, a gate, and a drain are arranged in a direction perpendicular to a substrate and in which the gate surrounds an island-shaped semiconductor layer has been proposed, and a method for manufacturing an SGT and a complementary metal-oxide semiconductor (CMOS) inverter, a NAND circuit, or a static random access memory (SRAM) cell which employs SGTs are disclosed. See, for example, Japanese Patent No. 5130596, Japanese Patent No. 5031809, Japanese Patent No. 4756221, and International Publication No. WO2009/096465.

FIGS. 15, 16, and 17 illustrate a circuit diagram and layout diagrams of an inverter that employs SGTs.

FIG. 15 is a circuit diagram of the inverter. The symbol Qp denotes a p-channel MOS transistor (hereinafter referred to as a "PMOS transistor"), the symbol Qn denotes an n-channel MOS transistor (hereinafter referred to as an "NMOS transistor"), the symbol IN denotes an input signal, the symbol OUT denotes an output signal, the symbol Vcc denotes a power supply, and the symbol Vss denotes a reference power supply.

FIG. 16 illustrates a plan view of the layout of the inverter illustrated in FIG. 15, which is formed by SGTs. FIG. 17 illustrates a cross-sectional view taken along the cut-line A-A' in the plan view of FIG. 16.

In FIGS. 16 and 17, planar silicon layers 2*p* and 2*n* are formed on top of an insulating film such as a buried oxide (BOX) film layer 1 disposed on a substrate. The planar silicon layers 2*p* and 2*n* are formed as a p+ diffusion layer and an n+ diffusion layer, respectively, through impurity implantation or the like. Reference numeral 3 denotes a silicide layer disposed on surfaces of the planar silicon layers (2*p* and 2*n*). The silicide layer 3 connects the planar silicon layers 2*p* and 2*n* to each other. Reference numeral 4*n* denotes an n-type silicon pillar, and reference numeral 4*p* denotes a p-type silicon pillar. Reference numeral 5 denotes a gate insulating film that surrounds the silicon pillars 4*n* and 4*p*. Reference numeral 6 denotes a gate electrode, and reference numeral 6*a* denotes a gate line. A p+ diffusion layer 7*p* and an n+ diffusion layer 7*n* are formed in top portions of the silicon pillars 4*n* and 4*p*, respectively, through impurity implantation or the like. Reference numeral 8 denotes a silicon nitride film for protecting the gate insulating film 5 and the like, and reference numerals 9*p* and 9*n* denote silicide layers for connection to the p+ diffusion layer 7*p* and the n+ diffusion layer 7*n*, respectively. Reference numerals 10*p* and 10*n* denote contacts that respectively connect the silicide layers 9*p* and 9*n* to metal lines 13*a* and 13*b*. Reference numeral 11 denotes a contact that connects the gate line 6*a* to a metal line 13*c*.

The silicon pillar 4*n*, the diffusion layer 2*p*, the diffusion layer 7*p*, the gate insulating film 5, and the gate electrode 6 constitute the PMOS transistor Qp. The silicon pillar 4*p*, the diffusion layer 2*n*, the diffusion layer 7*n*, the gate insulating film 5, and the gate electrode 6 constitute the NMOS transistor Qn. The diffusion layers 7*p* and 7*n* serve as sources, and the diffusion layers 2*p* and 2*n* serve as drains. The power supply Vcc is supplied to the metal line 13*a*, and the reference power supply Vss is supplied to the metal line 13*b*. The input signal IN is connected to the metal line 13*c*. The output signal OUT is output from the silicide layer 3, which connects the drain of the PMOS transistor Qp, or the diffusion layer 2*p*, to the drain of the NMOS transistor Qn, or the diffusion layer 2*n*.

In the inverter illustrated in FIGS. 15, 16, and 17, which employs SGTs, the PMOS transistor and the NMOS transistor are structurally isolated completely from each other. This configuration eliminates the need for isolation of wells, unlike planar transistors. In addition, the silicon pillars act as floating bodies. This configuration eliminates the need for any body terminals for supplying potentials to the wells unlike planar transistors. The layout (arrangement) of the inverter is thus compact.

SUMMARY OF THE INVENTION

The present invention provides a semiconductor device that takes advantage of the features of SGTs described above and that includes a decoder with a minimum area.

(1) To this end, according to an aspect of the present invention, a semiconductor device includes a NAND decoder and an inverter. The NAND decoder and the inverter include six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The NAND decoder includes a first p-channel MOS transistor, a second p-channel MOS transistor, a first n-channel MOS transistor, and a second n-channel MOS transistor. The inverter includes a third p-channel MOS transistor and a third n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The drain regions of the first p-channel MOS transistor, the second p-channel MOS transistor, and the first n-channel MOS transistor are located closer to the substrate than the silicon pillars of the first p-channel MOS transistor, the second p-channel MOS transistor, and the first n-channel MOS transistor, respectively, and are connected to one another via silicide regions to form a first output terminal. The source region of the second n-channel MOS transistor is located closer to the substrate than the silicon pillar of the second n-channel MOS transistor. The source region of the first n-channel MOS transistor is connected to the drain region of the second n-channel MOS transistor via a contact. The source regions of the first p-channel MOS transistor and the second p-channel MOS transistor are connected to a power supply line via contacts. The source region of the second n-channel MOS transistor is connected to a reference power supply line via a silicide region. The gate of the third p-channel MOS transistor and the gate of the third n-channel MOS transistor are connected to each other and are connected to the first output terminal. The drain region of the third p-channel MOS transistor and the drain region of the third n-channel MOS transistor are connected to each other to form a second output terminal. The source region of the third p-channel MOS transistor and the source region of the third n-channel MOS transistor are respectively connected to the power supply line and the reference power supply line. The NAND decoder further includes a first address signal line and a second address signal line. The gate of the first p-channel MOS transistor and the gate of the first n-channel MOS transistor, which are connected to each other, are connected to the first address signal line. The gate of the second p-channel MOS transistor and the gate of the second n-channel MOS transistor, which are connected to each other, are connected to the second address signal line. The power supply line, the reference power supply line, the first address signal line, and the second address signal line are arranged to extend in a second direction perpendicular to the first direction.

(2) The six transistors may be arranged in a line in an order of one of the third n-channel MOS transistor and the third p-channel MOS transistor, the other of the third n-channel MOS transistor and the third p-channel MOS transistor, the second p-channel MOS transistor, the first p-channel MOS transistor, the first n-channel MOS transistor, and the second n-channel MOS transistor.

(3) The gate of the first p-channel MOS transistor and the gate of the first n-channel MOS transistor may be connected to each other by using a line of a first metal wiring layer arranged to extend in the first direction and may be connected to the first address signal line, which is formed of a line of a second metal wiring layer arranged to extend in the second direction. The gate of the second p-channel MOS transistor and the gate of the second n-channel MOS transistor may be connected to each other by using a line of the first metal wiring layer arranged to extend in the first direction and may be connected to the second address signal line, which is formed of a line of the second metal wiring layer arranged to extend in the second direction.

(4) According to another aspect of the present invention, a semiconductor device includes j first address signal lines, the number of which is equal to j, k second address signal lines, the number of which is equal to k, and j×k pairs of NAND decoders and inverters, the number of which is given by j×k. Each of the j×k pairs of NAND decoders and inverters includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The NAND decoder in each of the j×k pairs at least includes a first p-channel MOS transistor, a second p-channel MOS transistor, a first n-channel MOS transistor, and a second n-channel MOS transistor. The inverter in each of the j×k pairs includes a third p-channel MOS transistor and a third n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The drain regions of the first p-channel MOS transistor, the second p-channel MOS transistor, and the first n-channel MOS transistor are located closer to the substrate than the silicon pillars of the first p-channel MOS transistor, the second p-channel MOS transistor, and the first n-channel MOS transistor, respectively, and are connected to one another via silicide regions to form a first output terminal. The source region of the second n-channel MOS transistor is located closer to the substrate than the silicon pillar of the second re-channel MOS transistor. The source region of the first n-channel MOS transistor is connected to the drain region of the second n-channel MOS transistor via a contact. The source regions of the first p-channel MOS transistor and the second p-channel MOS transistor are connected to a power supply line via contacts. The source region of the second n-channel MOS transistor is connected to a reference power supply line via a silicide region. The gate of the third p-channel MOS transistor and the gate of the third n-channel MOS transistor are connected to each other and are connected to the first output terminal. The drain region of the third p-channel MOS transistor and the drain region of the third n-channel MOS transistor are connected to each other to form a second output terminal. The source region of the third p-channel MOS transistor and the source region of the third n-channel MOS transistor are respectively connected to the power supply line and the reference power supply line. Each of the j×k pairs of NAND decoders and inverters is configured such that the gate of the first p-channel MOS transistor and the gate of the first n-channel MOS transistor, which are connected to each other, are connected to any one of the j first address signal lines, and the gate of the second p-channel MOS transistor and the gate of the second n-channel MOS transistor, which are connected to each other, are connected to any one of the k second address signal lines. The power supply line, the reference power supply line, the j first address signal lines, and the k second address signal lines are arranged to extend in a second direction perpendicular to the first direction.

(5) The six transistors may be arranged in a line in an order of one of the third n-channel MOS transistor and the third p-channel MOS transistor, the other of the third n-channel MOS transistor and the third p-channel MOS transistor, the second p-channel MOS transistor, the first p-channel MOS transistor, the first n-channel MOS transistor, and the second n-channel MOS transistor.

(6) Each of the j×k pairs of NAND decoders and inverters may be configured such that the gate of the first p-channel MOS transistor and the gate of the first n-channel MOS transistor are connected to each other by using a line of a first metal wiring layer arranged to extend in the first direction and are connected to any one of the j first address signal lines, each of which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to any one of the k second address signal lines, each of which is formed of a line of the second metal wiring layer arranged to extend in the second direction.

(7) According to still another aspect of the present invention, a semiconductor device includes a NAND decoder and an inverter. The NAND decoder and the inverter include six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The NAND decoder includes a first p-channel MOS transistor, a second p-channel MOS transistor, a first n-channel MOS transistor, and a second n-channel MOS transistor. The inverter includes a third p-channel MOS transistor and a third n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The source regions of the first p-channel MOS transistor, the second p-channel MOS transistor, and the first n-channel MOS transistor are located closer to the substrate than the silicon pillars of the first p-channel MOS transistor, the second p-channel MOS transistor, and the first n-channel MOS transistor. The drain region of the second n-channel MOS transistor is located closer to the substrate than the silicon pillar of the second n-channel MOS transistor. The drain regions of the first p-channel MOS transistor, the second p-channel MOS transistor, and the first n-channel MOS transistor are connected to one another via contacts to form a first output terminal. The source region of the first n-channel MOS transistor is connected to the drain region of the second n-channel MOS transistor via a silicide region. The source regions of the first p-channel MOS transistor and the second p-channel MOS transistor are connected to a power supply line via silicide regions. The source region of the second n-channel MOS transistor is connected to a reference power supply line via a contact. The gate of the third p-channel MOS transistor and the gate of the third n-channel MOS transistor are connected to each other and are connected to the first output terminal. The drain region of the third p-channel MOS transistor and the drain region of the third n-channel MOS transistor are connected to each other to form a second output terminal. The source region of the third p-channel MOS transistor and the source region of the third n-channel MOS transistor are respectively connected to the power supply line and the reference power supply line. The NAND decoder further includes a first address signal line and a second address signal line. The gate of the first p-channel MOS transistor and the gate of the first n-channel MOS transistor, which are connected to each other, are connected to the first address signal line. The gate of the second p-channel MOS transistor and the gate of the second n-channel MOS transistor, which are connected to each other, are connected to the second address signal line. The power supply line, the reference power supply line, the first address signal line, and the second address signal line are arranged to extend in a second direction perpendicular to the first direction.

(8) The six transistors may be arranged in a line in an order of one of the third n-channel MOS transistor and the third p-channel MOS transistor, the other of the third n-channel MOS transistor and the third p-channel MOS transistor, the second p-channel MOS transistor, the first p-channel MOS transistor, the first n-channel MOS transistor, and the second n-channel MOS transistor.

(9) The source regions of the third p-channel MOS transistor and the third n-channel MOS transistor may be located closer to the substrate than the silicon pillars of the third p-channel MOS transistor and the third n-channel MOS transistor, and the six transistors may be arranged in a line in an order of the third n-channel MOS transistor, the third p-channel MOS transistor, the second p-channel MOS transistor, the first p-channel MOS transistor, the first n-channel MOS transistor, and the second n-channel MOS transistor.

(10) The gate of the first p-channel MOS transistor and the gate of the first n-channel MOS transistor may be connected to each other by using a line of a first metal wiring layer arranged to extend in the first direction and may be connected to the first address signal line, which is formed of a line of a second metal wiring layer arranged to extend in the second direction. The gate of the second p-channel MOS transistor and the gate of the second n-channel MOS transistor may be connected to each other by using a line of the first metal wiring layer arranged to extend in the first direction and may be connected to the second address signal line, which is formed of a line of the second metal wiring layer arranged to extend in the second direction.

(11) According to still another aspect of the present invention, a semiconductor device includes j first address signal lines, the number of which is equal to j, k second address signal lines, the number of which is equal to k, and j×k pairs of NAND decoders and inverters, the number of which is given by j×k. Each of the j×k pairs of NAND decoders and inverters includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The NAND decoder in each of the j×k pairs at least includes a first p-channel MOS transistor, a second p-channel MOS transistor, a first n-channel MOS transistor, and a second n-channel MOS transistor. The inverter in each of the j×k pairs includes a third p-channel MOS transistor and a third n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The source regions of the first p-channel MOS transistor, the second p-channel MOS transistor, and the first n-channel MOS transistor are located closer to the substrate than the silicon pillars of the first p-channel MOS transistor, the second p-channel MOS transistor, and the first n-channel MOS transistor. The drain region of the second n-channel MOS transistor is located closer to the substrate than the silicon pillar of the second n-channel MOS transistor. The drain regions of the first p-channel MOS transistor, the second p-channel MOS transistor, and the first n-channel MOS transistor are connected to one another via contacts to form a first output terminal. The source region of the first n-channel MOS transistor is connected to the drain region of the second n-channel MOS transistor via a silicide region. The source regions of the first p-channel MOS transistor and the second p-channel MOS transistor are connected to a power supply line via silicide regions. The source region of the second n-channel MOS transistor is connected to a reference power supply line via a contact. The gate of the third p-channel MOS transistor and the gate of the third n-channel MOS transistor are connected to each other and are connected to the first output terminal. The drain region of the third p-channel MOS transistor and the drain region of the third n-channel MOS transistor are connected to each other to form a second output terminal. The source region of the third p-channel MOS transistor and the source region of the third n-channel MOS transistor are respectively connected to the power supply line and the reference power supply line. Each of the j×k pairs of NAND decoders and inverters is configured such that the gate of the first p-channel MOS transistor and the gate of the first n-channel MOS transistor, which are connected to each other, are connected to any one of the j first address signal lines, and the gate of the second p-channel MOS transistor and the gate of the second n-channel MOS transistor, which are connected to each other, are connected to any one of the k second address signal lines. The power supply line, the reference power supply line, the j first address signal lines, and the k second address signal lines are arranged to extend in a second direction perpendicular to the first direction.

(12) The six transistors may be arranged in a line in an order of one of the third n-channel MOS transistor and the third p-channel MOS transistor, the other of the third n-channel MOS transistor and the third p-channel MOS transistor, the second p-channel MOS transistor, the first p-channel MOS transistor, the first n-channel MOS transistor, and the second n-channel MOS transistor.

(13) In each of the j×k pairs of NAND decoders and inverters, the source regions of the third p-channel MOS transistor and the third n-channel MOS transistor may be located closer to the substrate than the silicon pillars of the third p-channel MOS transistor and the third n-channel MOS transistor, and the six transistors may be arranged in a line in an order of the third n-channel MOS transistor, the third p-channel MOS transistor, the second p-channel MOS transistor, the first p-channel MOS transistor, the first n-channel MOS transistor, and the second n-channel MOS transistor.

(14) The source regions of the first p-channel MOS transistors, the second p-channel MOS transistors, and the third p-channel MOS transistors in the j×k pairs of NAND decoders and inverters may be connected in common via a silicide layer.

(15) Each of the j×k pairs of NAND decoders and inverters may be configured such that the gate of the first p-channel MOS transistor and the gate of the first n-channel MOS transistor are connected to each other by using a line of a first metal wiring layer arranged to extend in the first direction and are connected to any one of the j first address signal lines, each of which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to any one of the k second address signal lines, each of which is formed of a line of the second metal wiring layer arranged to extend in the second direction.

(16) According to still another aspect of the present invention, a semiconductor device includes a NAND decoder. The NAND decoder includes four transistors, each having a source, a drain, and a gate arranged in a layered manner in a direction perpendicular to a substrate, the four transistors being arranged on the substrate in a line in a first direction. Each of the four transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The NAND decoder includes a first p-channel MOS transistor, a second p-channel MOS transistor, a first n-channel MOS transistor, and a second n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The drain regions of the first p-channel MOS transistor, the second p-channel MOS transistor, and the first n-channel MOS transistor are located closer to the substrate than the silicon pillars of the first p-channel MOS transistor, the second p-channel MOS transistor, and the first n-channel MOS transistor, respectively, and are connected to one another via silicide regions to form a first output terminal. The source region of the second n-channel MOS transistor is located closer to the substrate than the silicon pillar of the second n-channel MOS transistor. The source region of the first n-channel MOS transistor is connected to the drain region of the second n-channel MOS transistor via a contact. The source regions of the first p-channel MOS transistor and the second p-channel MOS transistor are connected to a power supply line via contacts. The source region of the second n-channel MOS transistor is connected to a reference power supply line via a silicide region. The decoder further includes a first address signal line and a second address signal line. The gate of the first p-channel MOS transistor and the gate of the first n-channel MOS transistor, which are connected to each other, are connected to the first address signal line. The gate of the second p-channel MOS transistor and the gate of the second n-channel MOS transistor, which are connected to each other, are connected to the second address signal line. The power supply line, the reference power supply line, the first address signal line, and the second address signal line are arranged to extend in a second direction perpendicular to the first direction.

(17) The four transistors may be arranged in a line in an order of the second p-channel MOS transistor, the first p-channel MOS transistor, the first n-channel MOS transistor, and the second n-channel MOS transistor.

(18) The gate of the first p-channel MOS transistor and the gate of the first n-channel MOS transistor may be connected to each other by using a line of a first metal wiring layer arranged to extend in the first direction and may be connected to the first address signal line, which is formed of a line of a second metal wiring layer arranged to extend in the second direction. The gate of the second p-channel MOS transistor and the gate of the second n-channel MOS transistor may be connected to each other by using a line of the first metal wiring layer arranged to extend in the first direction and may be connected to the second address signal line, which is formed of a line of the second metal wiring layer arranged to extend in the second direction.

(19) According to still another aspect of the present invention, a semiconductor device includes j first address signal lines, the number of which is equal to j, k second address signal lines, the number of which is equal to k, and j×k NAND decoders, the number of which is given by j×k. Each of the j×k NAND decoders includes four transistors, each having a source, a drain, and a gate arranged in a layered manner in a direction perpendicular to a substrate, the four transistors being arranged on the substrate in a line in a first direction. Each of the four transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The NAND decoder at least includes a first p-channel MOS transistor, a second p-channel MOS transistor, a first n-channel MOS transistor, and a second n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The drain regions of the first p-channel MOS transistor, the second p-channel MOS transistor, and the first n-channel MOS transistor are located closer to the substrate than the silicon pillars of the first p-channel MOS transistor, the second p-channel MOS transistor, and the first n-channel MOS transistor, respectively, and are connected to one another via silicide regions to form a first output terminal. The source region of the second n-channel MOS transistor is located closer to the substrate than the silicon pillar of the second n-channel MOS transistor. The source region of the first n-channel MOS transistor is connected to the drain region of the second n-channel MOS transistor via a contact. The source regions of the first p-channel MOS transistor and the second p-channel MOS transistor are connected to a power supply line via contacts. The source region of the second re-channel MOS transistor is connected to a reference power supply line via a silicide region. Each of the j×k NAND decoders is configured such that the gate of the first p-channel MOS transistor and the gate of the first n-channel MOS transistor, which are connected to each other, are connected to any one of the j first address signal lines, and the gate of the second p-channel MOS transistor and the gate of the second n-channel MOS transistor, which are connected to each other, are connected to any one of the k second address signal lines. The power supply line, the reference power supply line, the j first address signal lines, and the k second address signal lines are arranged to extend in a second direction perpendicular to the first direction.

(20) The four transistors may be arranged in a line in an order of the second p-channel MOS transistor, the first p-channel MOS transistor, the first re-channel MOS transistor, and the second n-channel MOS transistor.

(21) Each of the j×k NAND decoders may be configured such that the gate of the first p-channel MOS transistor and the gate of the first n-channel MOS transistor are connected to each other by using a line of a first metal wiring layer arranged to extend in the first direction and are connected to any one of the j first address signal lines, each of which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to any one of the k second address signal lines, each of which is formed of a line of the second metal wiring layer arranged to extend in the second direction.

(22) According to still another aspect of the present invention, a semiconductor device includes a NAND decoder. The NAND decoder includes four transistors, each having a source, a drain, and a gate arranged in a layered manner in a direction perpendicular to a substrate, the four transistors being arranged on the substrate in a line in a first direction. Each of the four transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The NAND decoder includes a first p-channel MOS transistor, a second p-channel MOS transistor, a first n-channel MOS transistor, and a second n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The source regions of the first p-channel MOS transistor, the second p-channel MOS transistor, and the first n-channel MOS transistor are located closer to the substrate than the silicon pillars of the first p-channel MOS transistor, the second p-channel MOS transistor, and the first n-channel MOS transistor. The drain region of the second n-channel MOS transistor is located closer to the substrate than the silicon pillar of the second n-channel MOS transistor. The drain regions of the first p-channel MOS transistor, the second p-channel MOS transistor, and the first n-channel MOS transistor are connected to one another via contacts to form a first output terminal. The source region of the first n-channel MOS transistor is connected to the drain region of the second n-channel MOS transistor via a silicide region. The source regions of the first p-channel MOS transistor and the second p-channel MOS transistor are connected to a power supply line via silicide regions. The source region of the second n-channel MOS transistor is connected to a reference power supply line via a contact. The NAND decoder further includes a first address signal line and a second address signal line. The gate of the first p-channel MOS transistor and the gate of the first n-channel MOS transistor, which are connected to each other, are connected to the first address signal line. The gate of the second p-channel MOS transistor and the gate of the second n-channel MOS transistor, which are connected to each other, are connected to the second address signal line. The power supply line, the reference power supply line, the first address signal line, and the second address signal line are arranged to extend in a second direction perpendicular to the first direction.

(23) The four transistors may be arranged in a line in an order of the second p-channel MOS transistor, the first p-channel MOS transistor, the first re-channel MOS transistor, and the second n-channel MOS transistor.

(24) The gate of the first p-channel MOS transistor and the gate of the first n-channel MOS transistor may be connected to each other by using a line of a first metal wiring layer arranged to extend in the first direction and may be connected to the first address signal line, which is formed of a line of a second metal wiring layer arranged to extend in the second direction. The gate of the second p-channel MOS transistor and the gate of the second n-channel MOS transistor may be connected to each other by using a line of the first metal wiring layer arranged to extend in the first direction and may be connected to the second address signal line, which is formed of a line of the second metal wiring layer arranged to extend in the second direction.

(25) According to still another aspect of the present invention, a semiconductor device includes j first address signal lines, the number of which is equal to j, k second address signal lines, the number of which is equal to k, and j×k NAND decoders, the number of which is given by j×k. Each of the j×k NAND decoders includes four transistors, each having a source, a drain, and a gate arranged in a layered manner in a direction perpendicular to a substrate, the four transistors being arranged on the substrate in a line in a first direction. Each of the four transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. Each of the j×k NAND decoders at least includes a first p-channel MOS transistor, a second p-channel MOS transistor, a first n-channel MOS transistor, and a second n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The source regions of the first p-channel MOS transistor, the second p-channel MOS transistor, and the first n-channel MOS transistor are located closer to the substrate than the silicon pillars of the first p-channel MOS transistor, the second p-channel MOS transistor, and the first n-channel MOS transistor. The drain region of the second n-channel MOS transistor is located closer to the substrate than the silicon pillar of the second n-channel MOS transistor. The drain regions of the first p-channel MOS transistor, the second p-channel MOS transistor, and the first n-channel MOS transistor are connected to one another via contacts to form a first output terminal. The source region of the first n-channel MOS transistor is connected to the drain region of the second re-channel MOS transistor via a silicide region. The source regions of the first p-channel MOS transistor and the second p-channel MOS transistor are connected to a power supply line via silicide regions. The source region of the second n-channel MOS transistor is connected to a reference power supply line via a contact. Each of the j×k NAND decoders is configured such that the gate of the first p-channel MOS transistor and the gate of the first n-channel MOS transistor, which are connected to each other, are connected to any one of the j first address signal lines, and the gate of the second p-channel MOS transistor and the gate of the second n-channel MOS transistor, which are connected to each other, are connected to any one of the k second address signal lines. The power supply line, the reference power supply line, the j first address signal lines, and the k second address signal lines are arranged to extend in a second direction perpendicular to the first direction.

(26) The four transistors may be arranged in a line in an order of the second p-channel MOS transistor, the first p-channel MOS transistor, the first n-channel MOS transistor, and the second n-channel MOS transistor.

(27) The source regions of the first p-channel MOS transistors and the second p-channel MOS transistors in the j×k NAND decoders may be connected in common via a silicide layer.

(28) Each of the j×k NAND decoders may be configured such that the gate of the first p-channel MOS transistor and the gate of the first n-channel MOS transistor are connected to each other by using a line of a first metal wiring layer arranged to extend in the first direction and are connected to any one of the j first address signal lines, each of which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to any one of the k second address signal lines, each of which is formed of a line of the second metal wiring layer arranged to extend in the second direction.

BRIEF DESCRIPTION OF THE DRAWINGS

FIG. 2A is a plan view of the decoder according to the first exemplary embodiment of the present invention.

FIG. 5 is an address map of the decoder according to the second exemplary embodiment of the present invention.

FIG. 7H is a cross-sectional view of the decoder according to the second exemplary embodiment of the present invention.

FIG. 7K is a cross-sectional view of the decoder according to the second exemplary embodiment of the present invention.

FIG. 12 is an address map of the decoder according to the fourth exemplary embodiment of the present invention.

FIG. 13B is a plan view of the decoder according to the fourth exemplary embodiment of the present invention.

FIG. 14L is a cross-sectional view of the decoder according to the fourth exemplary embodiment of the present invention.

FIG. 14P is a cross-sectional view of the decoder according to the fourth exemplary embodiment of the present invention.

FIG. 14Q is a cross-sectional view of the decoder according to the fourth exemplary embodiment of the present invention.

FIG. 14R is a cross-sectional view of the decoder according to the fourth exemplary embodiment of the present invention.

FIG. 14S is a cross-sectional view of the decoder according to the fourth exemplary embodiment of the present invention.

DETAILED DESCRIPTION OF THE PREFERRED EMBODIMENTS

Equivalent Circuit Applicable to Exemplary Embodiment of Present Invention

Figure 1:
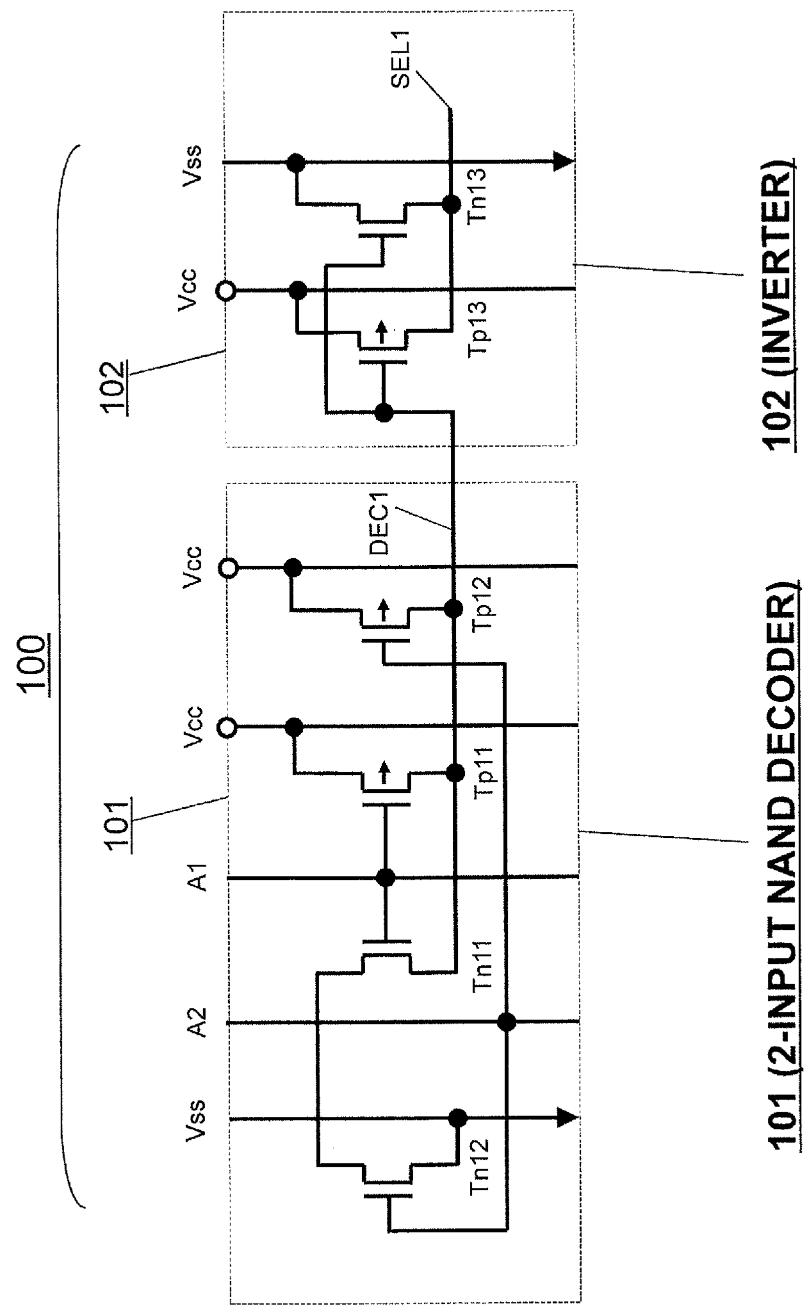
FIG. 1 is an equivalent circuit diagram illustrating a decoder according to a first exemplary embodiment of the present invention.

FIG. 1 illustrates an equivalent circuit diagram of a 2-input NAND decoder formed by using a 2-input NAND circuit applicable to the present invention and an inverter. Reference numerals Tp11, Tp12, and Tp13 denote PMOS transistors formed of SGTs, and reference numerals Tn11, Tn12, and Tn13 denote NMOS transistors formed of SGTs. The sources of the PMOS transistors Tp11 and Tp12 are connected to a power supply Vcc, and the drains of the PMOS transistors Tp11 and Tp12 are connected in common to an output terminal DEC1. The drain of the NMOS transistor Tn11 is connected to the output terminal DEC1, and the source of the NMOS transistor Tn11 is connected to the drain of the NMOS transistor Tn12. The source of the NMOS transistor Tn12 is connected to a reference power supply Vss. An address signal line A1 is connected to the gate of the PMOS transistor Tp11 and the gate of the NMOS transistor Tn11, and an address signal line A2 is connected to the gate of the PMOS transistor Tp12 and the gate of the NMOS transistor Tn12.

Further, the drain of the PMOS transistor Tp13 and the drain of the NMOS transistor Tn13 are connected in common to serve as an output SEL1. The power supply Vcc is supplied to the source of the PMOS transistor Tp13, and the reference power supply Vss is supplied to the source of the NMOS transistor Tn13. The PMOS transistors Tp11 and Tp12 and the NMOS transistors Tn11 and Tn12 constitute a 2-input NAND decoder 101, and the PMOS transistor Tp13 and the NMOS transistor Tn13 constitute an inverter 102. The NAND decoder 101 and the inverter 102 constitute a decoder 100 with a positive logic output (the output of a selected decoder is logic “1”).

First Exemplary Embodiment

Figure 2B:
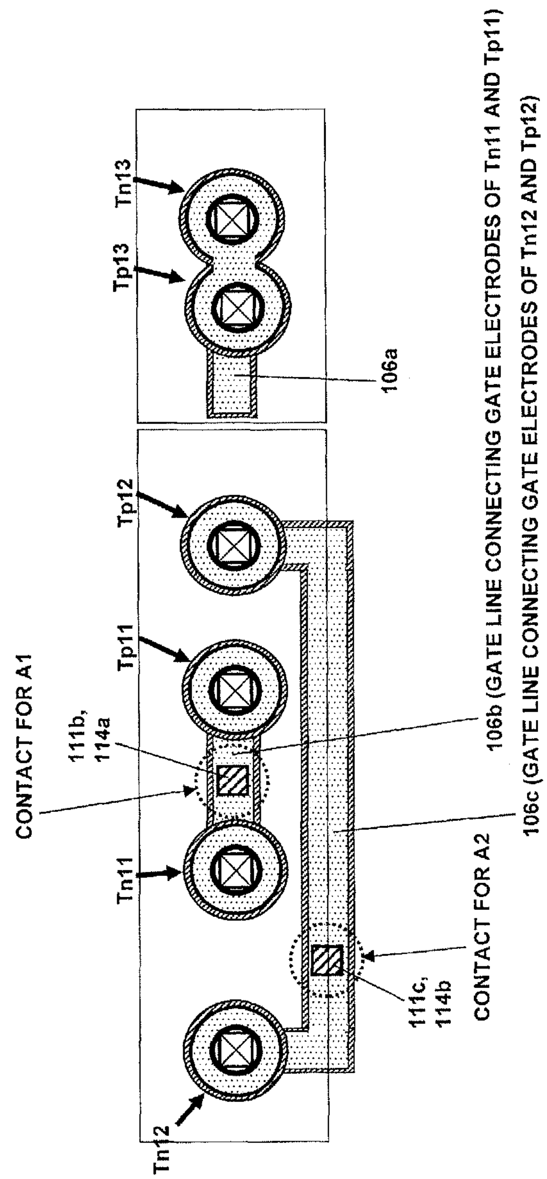
FIG. 2B is a plan view of the decoder according to the first exemplary embodiment of the present invention.
Figure 3A:
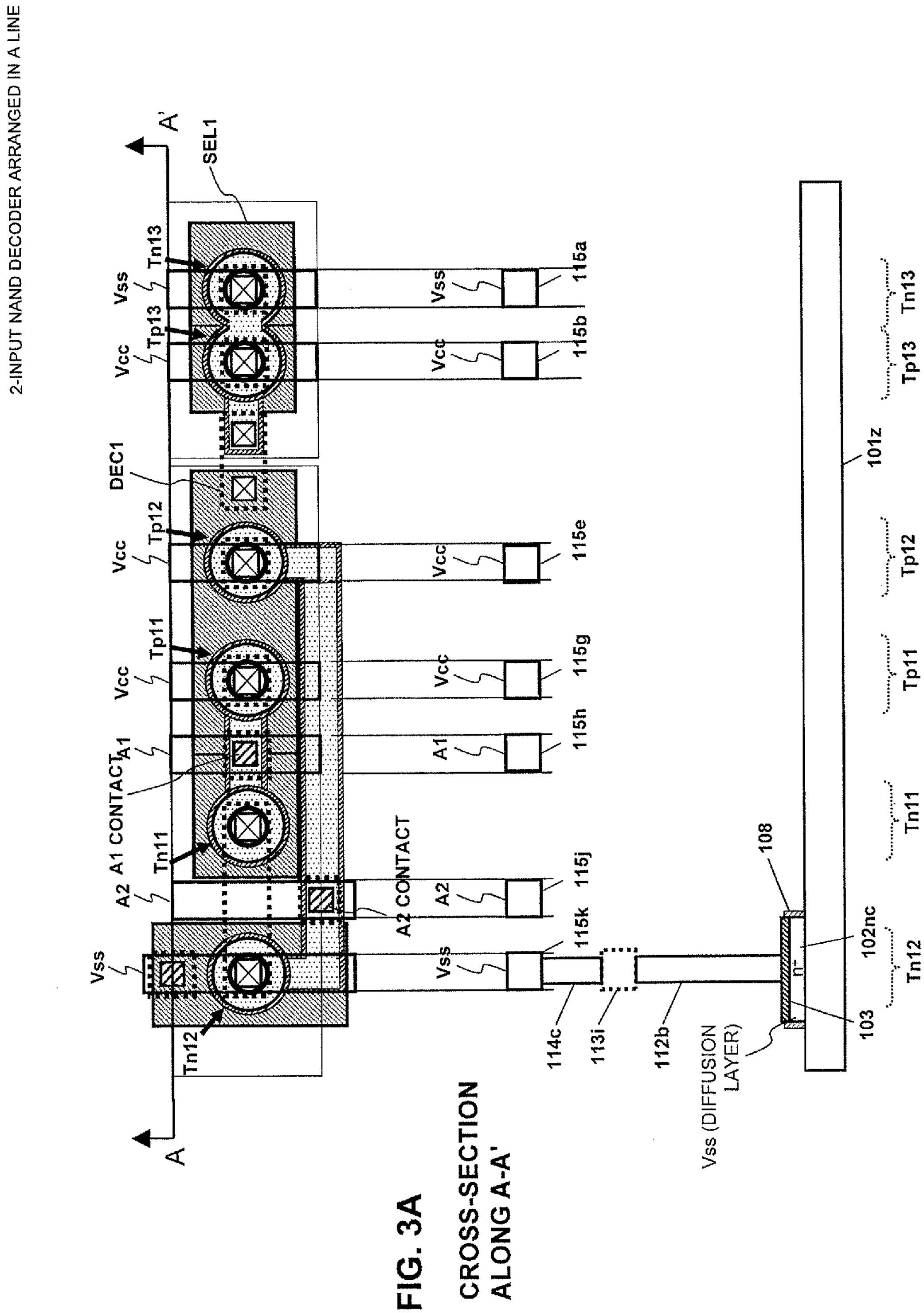
FIG. 3A is a cross-sectional view of the decoder according to the first exemplary embodiment of the present invention.
Figure 3B:
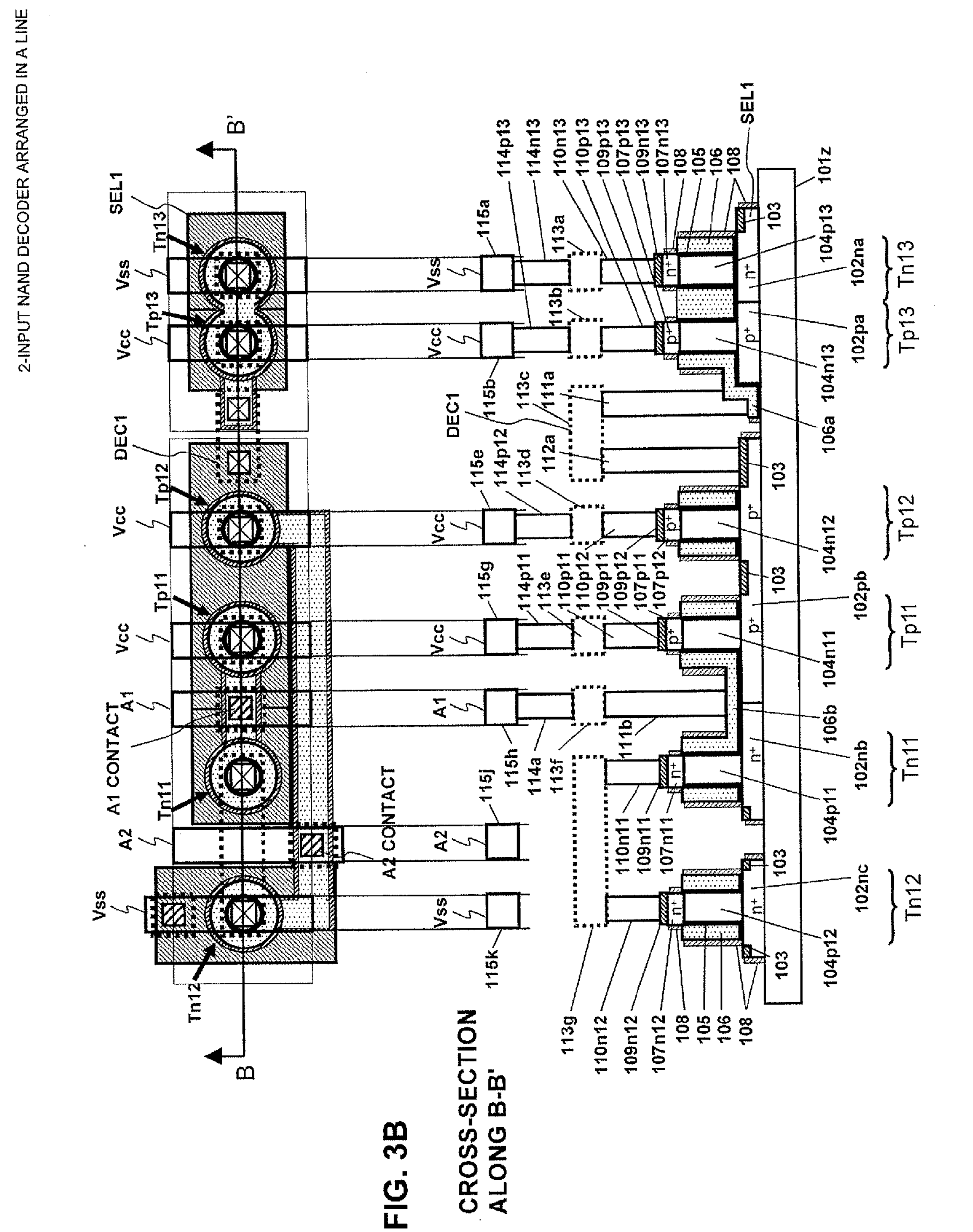
FIG. 3B is a cross-sectional view of the decoder according to the first exemplary embodiment of the present invention.
Figure 3C:
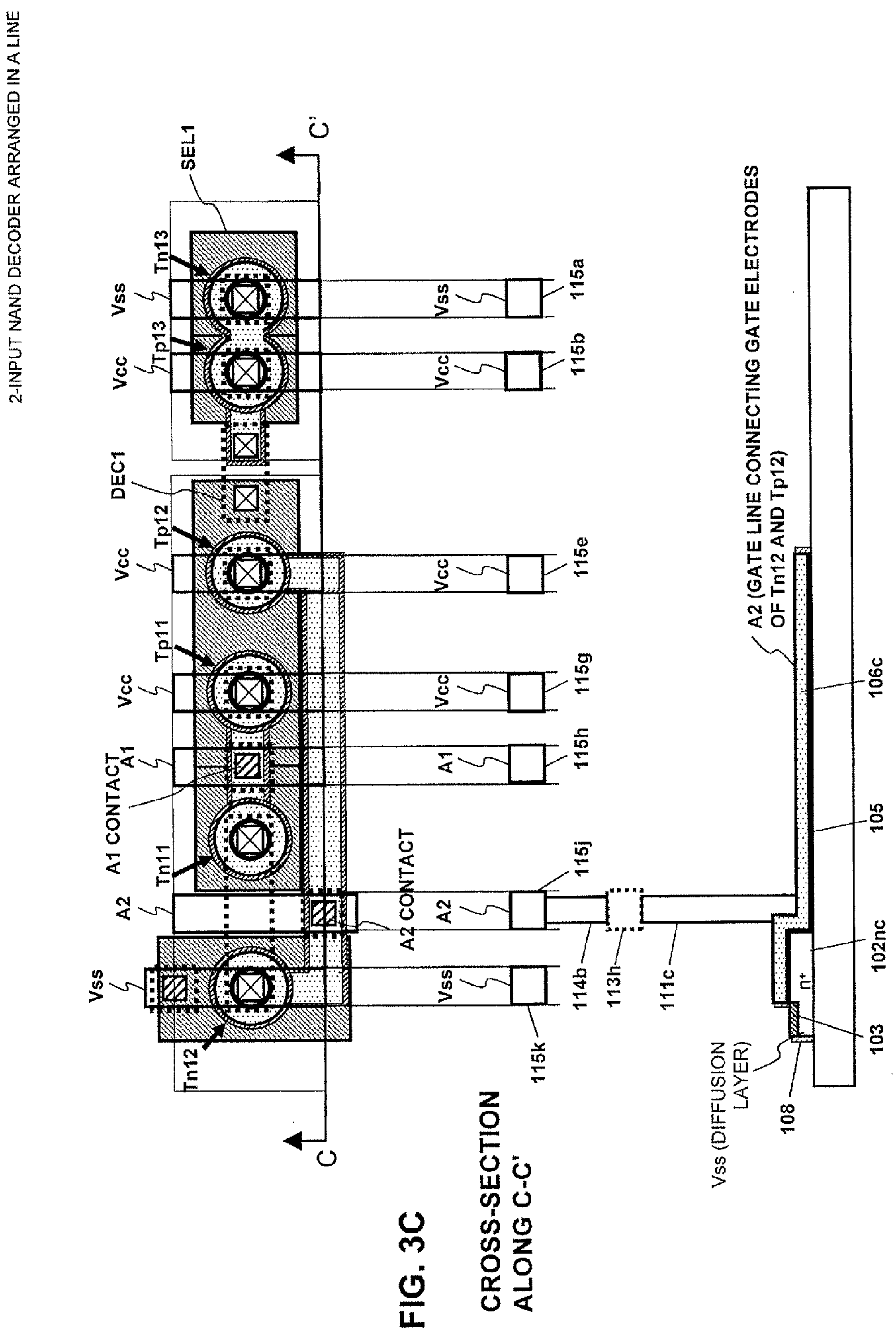
FIG. 3C is a cross-sectional view of the decoder according to the first exemplary embodiment of the present invention.
Figure 3D:
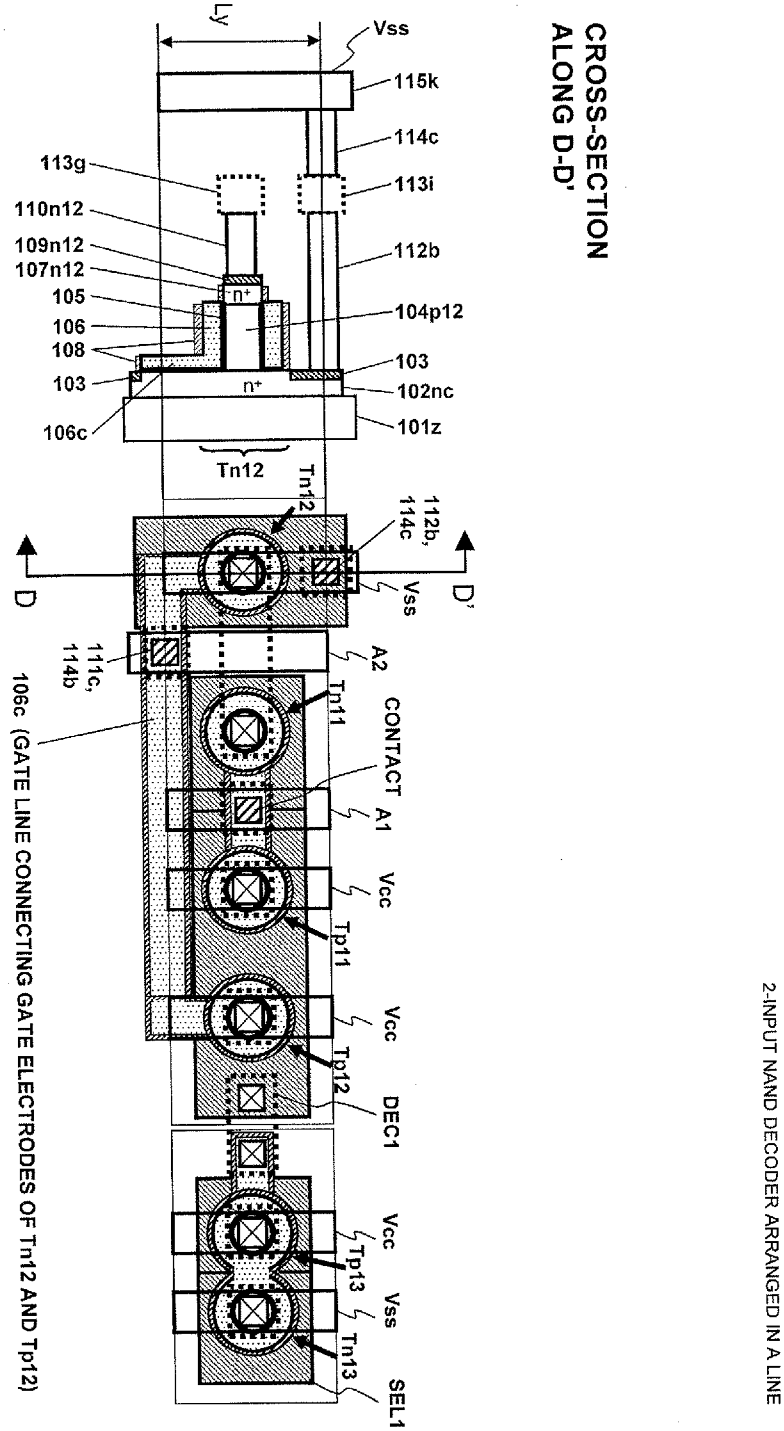
FIG. 3D is a cross-sectional view of the decoder according to the first exemplary embodiment of the present invention.
Figure 3E:
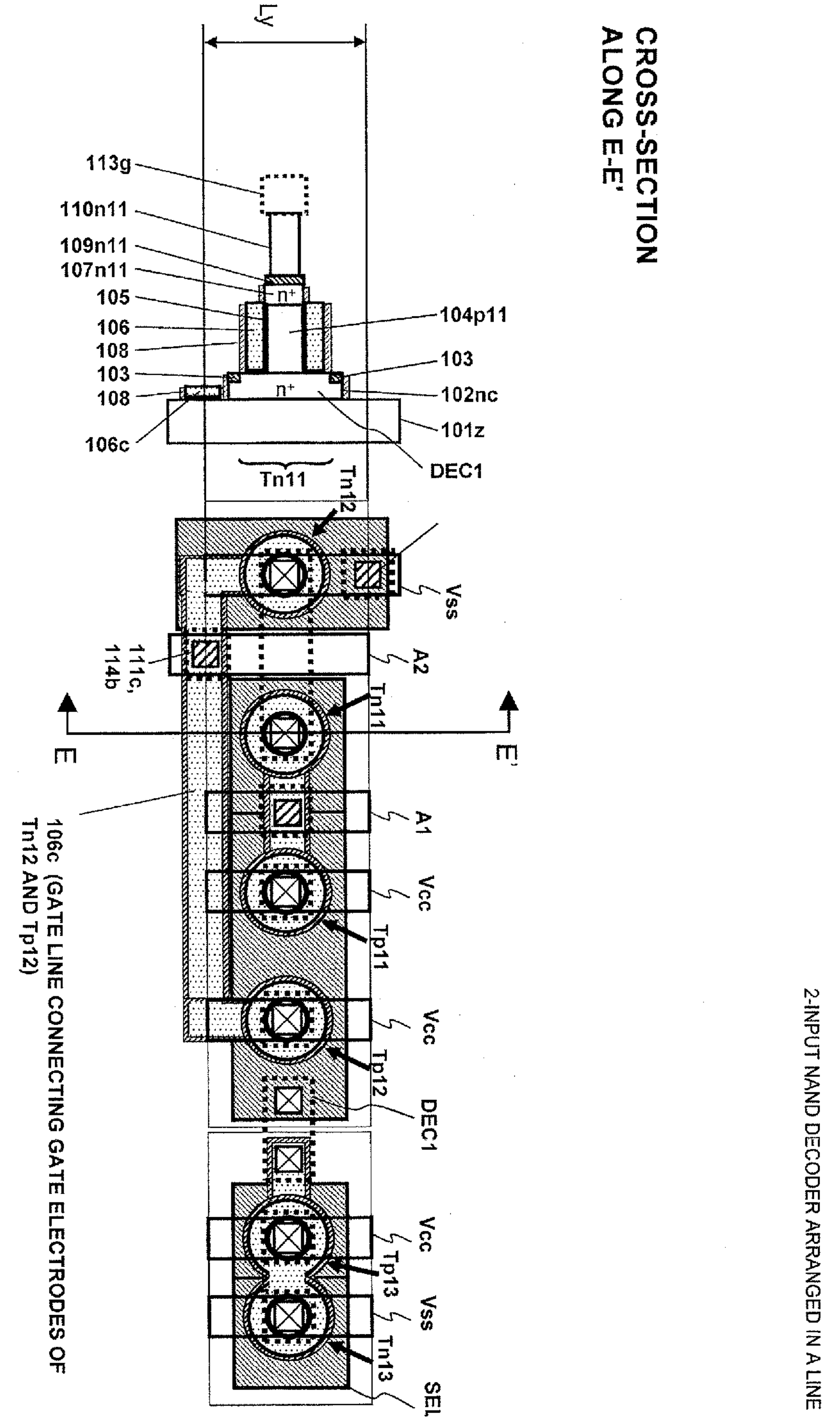
FIG. 3E is a cross-sectional view of the decoder according to the first exemplary embodiment of the present invention.
Figure 3F:
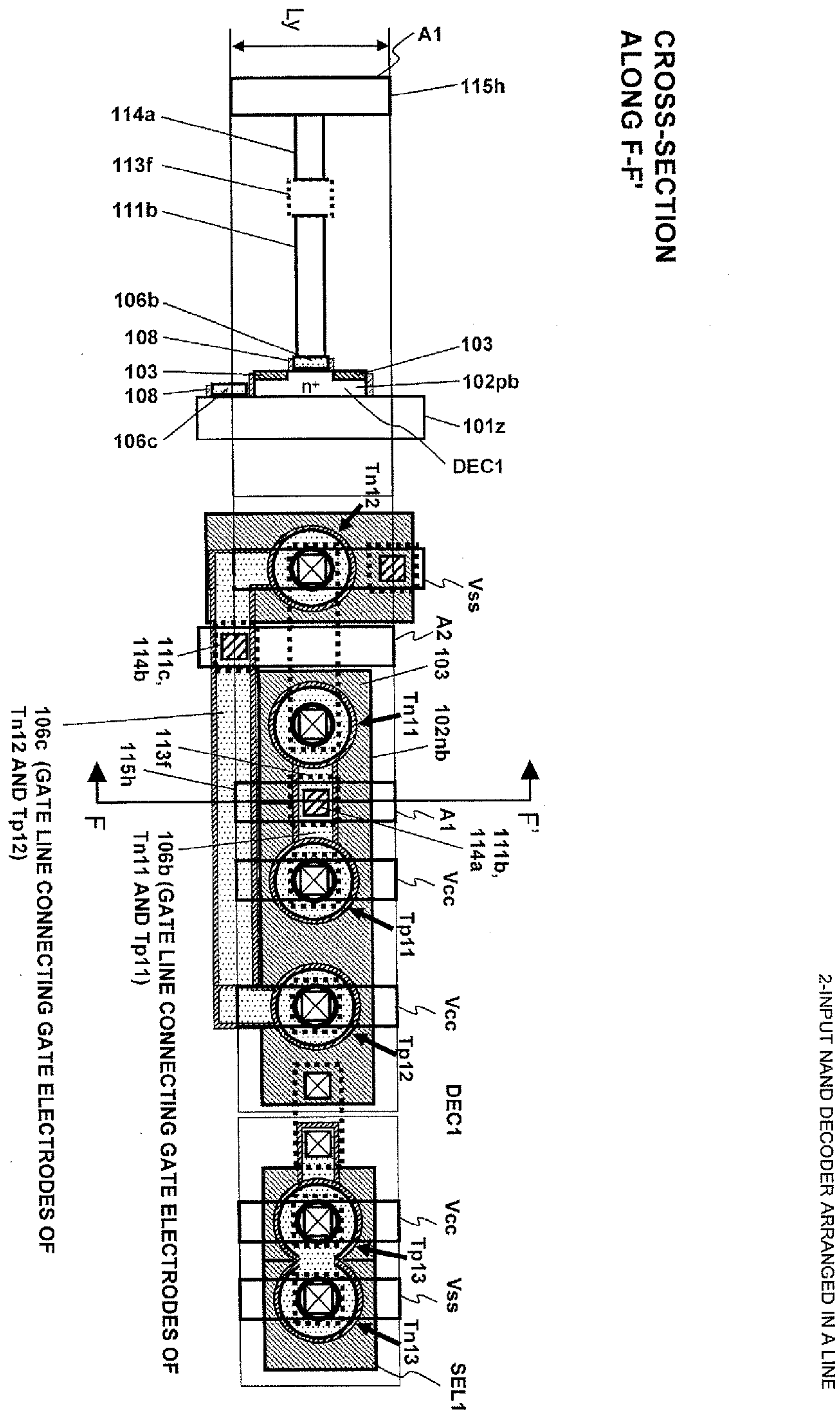
FIG. 3F is a cross-sectional view of the decoder according to the first exemplary embodiment of the present invention.
Figure 3G:
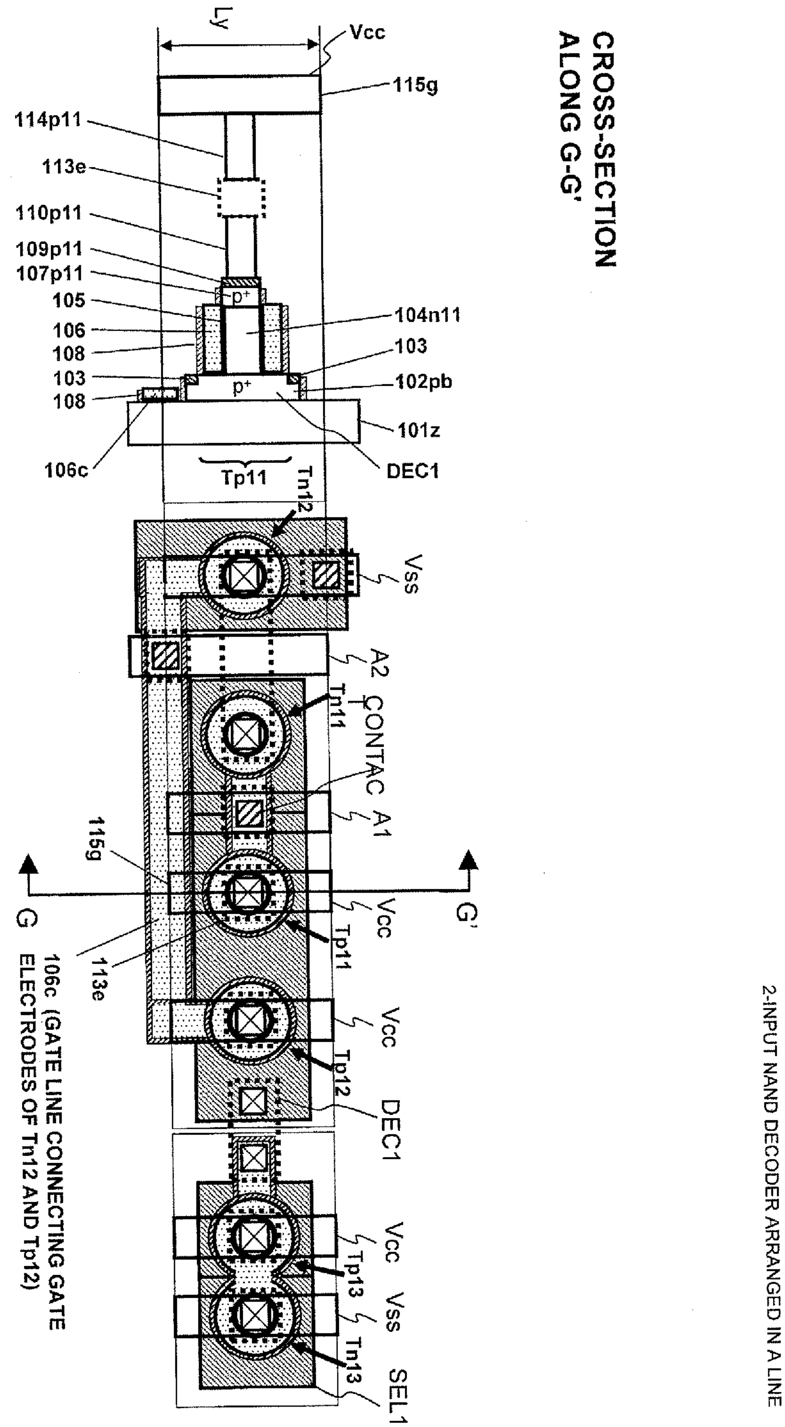
FIG. 3G is a cross-sectional view of the decoder according to the first exemplary embodiment of the present invention.
Figure 3H:
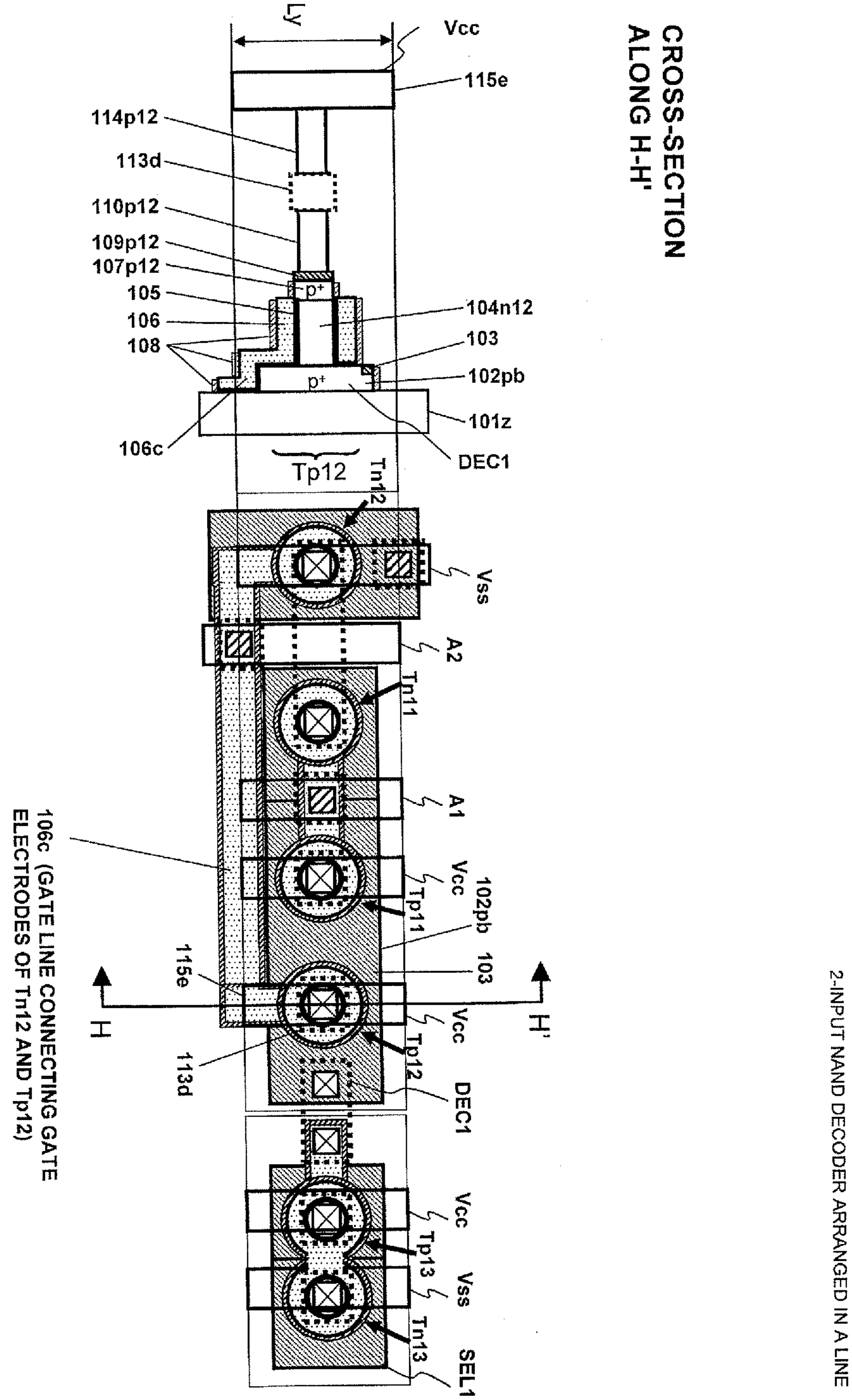
FIG. 3H is a cross-sectional view of the decoder according to the first exemplary embodiment of the present invention.

FIGS. 2A and 2B and FIGS. 3A to 3H illustrate a first exemplary embodiment as an exemplary embodiment in which the equivalent circuit illustrated in FIG. 1 is applied to the present invention. FIG. 2A is a plan view of the layout (arrangement) of the 2-input NAND decoder 101 and the inverter 102 according to this exemplary embodiment, and FIG. 2B is a plan view illustrating transistors and gate lines in FIG. 2A. FIG. 3A is a cross-sectional view taken along the cut-line A-A' in FIG. 2A, FIG. 3B is a cross-sectional view taken along the cut-line B-B' in FIG. 2A, FIG. 3C is a cross-sectional view taken along the cut-line C-C' in FIG. 2A, FIG. 3D is a cross-sectional view taken along the cut-line D-D' in FIG. 2A, FIG. 3E is a cross-sectional view taken along the cut-line E-E' in FIG. 2A, FIG. 3F is a cross-sectional view taken along the cut-line F-F' in FIG. 2A, FIG. 3G is a cross-sectional view taken along the cut-line G-G' in FIG. 2A, and FIG. 3H is a cross-sectional view taken along the cut-line H-H' in FIG. 2A.

Figure 16:
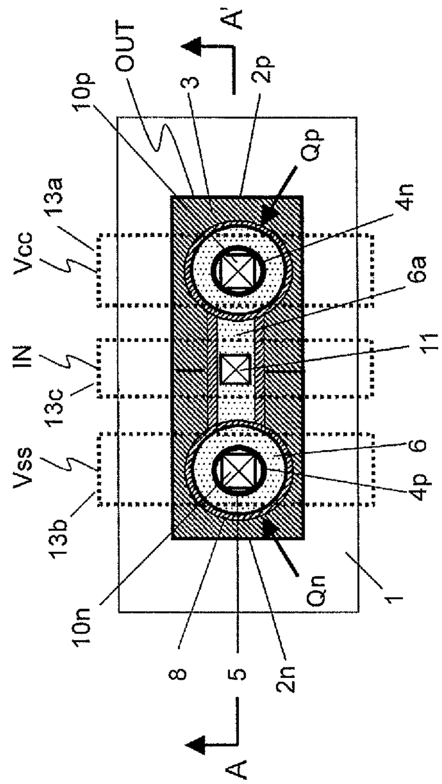
FIG. 16 is a plan view of a traditional inverter constituted by SGTs.
Figure 17:
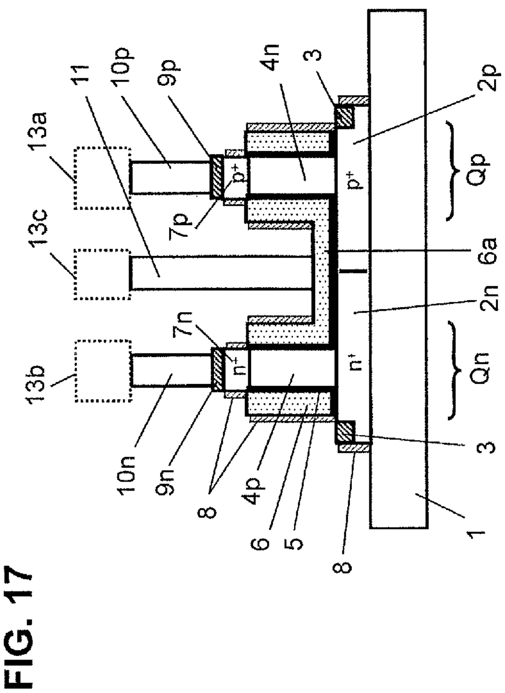
FIG. 17 is a cross-sectional view of the traditional inverter constituted by SGTs.
Figure 15:
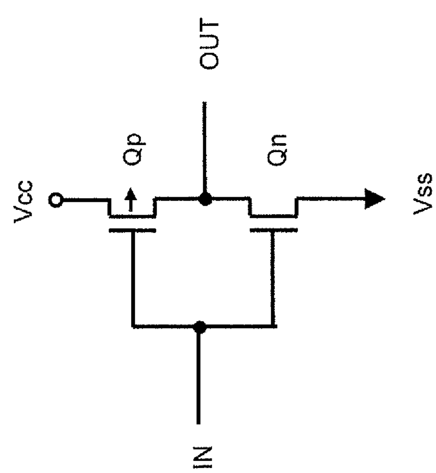
FIG. 15 illustrates an equivalent circuit of an inverter of related art.

In FIGS. 2A and 2B and FIGS. 3A to 3H, portions having the same or substantially the same structures as those illustrated in FIGS. 15, 16, and 17 are denoted by equivalent reference numerals in the 100s.

In FIG. 2A, six SGTs constituting the NAND decoder 101 and the inverter 102 illustrated in FIG. 1, namely, the NMOS transistor Tn13, the PMOS transistors Tp13, Tp12, and Tp11, and the NMOS transistors Tn11 and Tn12, are arranged in a line in a lateral direction (defined as a “first direction”) from right to left in this figure.

Further provided in a longitudinal direction (defined as a “second direction perpendicular to the first direction”) in this figure are lines 115*a*, 115*b*, 115*e*, 115*g*, 115*h*, 115*j*, and 115*k* of a second metal wiring layer described below. The lines 115*a*, 115*b*, 115*e*, 115*g*, 115*h*, 115*j*, and 115*k* are arranged to extend in the longitudinal direction (the second direction), and respectively form a reference power supply Vss, a power supply Vcc, a power supply Vcc, a power supply Vcc, an address signal line A1, an address signal line A2, and a reference power supply Vss.

Planar silicon layers 102*pa*, 102*pb*, 102*na*, 102*nb*, and 102*nc* are formed on top of an insulating film such as a buried oxide (BOX) film layer 101*z* disposed on a substrate. The planar silicon layers 102*pa*, 102*pb*, 102*na*, 102*nb*, and 102*nc* are formed as a p+ diffusion layer, a p+ diffusion layer, an n+ diffusion layer, an n+ diffusion layer, and an n+ diffusion layer, respectively, through impurity implantation or the like. Reference numeral 103 denotes a silicide layer disposed on surfaces of the planar silicon layers (102*pa*, 102*pb*, 102*na*, 102*nb*, and 102*nc*). The silicide layer 103 connects the planar silicon layers 102*pa* and 102*na* to each other, and also connects the planar silicon layers 102*pb* and 102*nb* to each other. Reference numerals 104*n*11, 104*n*12, and 104*n*13 denote n-type silicon pillars, and reference numerals 104*p*11, 104*p*12, and 104*p*13 denote p-type silicon pillars. Reference numeral 105 denotes a gate insulating film that surrounds the silicon pillars 104*n*11, 104*n*12, 104*n*13, 104*p*11, 104*p*12, and 104*p*13. Reference numeral 106 denotes a gate electrode, and reference numerals 106*a*, 106*b*, and 106*c* denote gate lines. The gate insulating film 105 is also formed to underlie the gate electrode 106 and the gate lines 106*a*, 106*b*, and 106*c*.

In top portions of the silicon pillars 104*n*11, 104*n*12, and 104*n*13, p+ diffusion layers 107*p*11, 107*p*12, and 107*p*13 are respectively formed through impurity implantation or the like. In top portions of the silicon pillars 104*p*11, 104*p*12, and 104*p*13, n+ diffusion layers 107*n*11, 107*n*12, and 107*n*13 are respectively formed through impurity implantation or the like. Reference numeral 108 denotes a silicon nitride film for protecting the gate insulating film 105, and reference numerals 109*p*11, 109*p*12, 109*p*13, 109*n*11, 109*n*12, and 109*n*13 denote silicide layers to be respectively connected to the p+ diffusion layers 107*p*11, 107*p*12, and 107*p*13 and the n+ diffusion layers 107*n*11, 107*n*12, and 107*n*13.

Reference numerals 110*p*11, 110*p*12, 110*p*13, 110*n*11, 110*n*12, and 110*n*13 denote contacts that respectively connect the silicide layers 109*p*11, 109*p*12, 109*p*13, 109*n*11, 109*n*12, and 109*n*13 to lines 113*e*, 113*d*, 113*b*, 113*g*, 113*g*, and 113*a* of a first metal wiring layer. Reference numeral 111*a* denotes a contact that connects the gate line 106*a* to a line 113*c* of the first metal wiring layer, reference numeral 111*b* denotes a contact that connects the gate line 106*b* to a line 113*f* of the first metal wiring layer, and reference numeral 111*c* denotes a contact that connects the gate line 106*c* to a line 113*h* of the first metal wiring layer. Reference numeral 112*a* denotes a contact that connects the silicide layer 103 connected to the p+ diffusion layer 102*pb* to the line 113*c* of the first metal wiring layer, and reference numeral 112*b* denotes a contact that connects the silicide layer 103 connected to the n+ diffusion layer 102*nc* to a line 113*i* of the first metal wiring layer.

Reference numeral 114*p*11 denotes a contact that connects the line 113*e* of the first metal wiring layer to the line 115*g* of the second metal wiring layer, reference numeral 114*p*12 denotes a contact that connects the line 113*d* of the first metal wiring layer to the line 115*e* of the second metal wiring layer, reference numeral 114*p*13 denotes a contact that connects the line 113*b* of the first metal wiring layer to the line 115*b* of the second metal wiring layer, reference numeral 114*n*13 denotes a contact that connects the line 113*a* of the first metal wiring layer to the line 115*a* of the second metal wiring layer, reference numeral 114*a* denotes a contact that connects the line 113*f* of the first metal wiring layer to the line 115*h* of the second metal wiring layer, reference numeral 114*b* denotes a contact that connects the line 113*h* of the first metal wiring layer to the line 115*j* of the second metal wiring layer, and reference numeral 114*c* denotes a contact that connects the line 113*i* of the first metal wiring layer to the line 115*k* of the second metal wiring layer.

The silicon pillar 104*n*11, the lower diffusion layer 102*pb*, the upper diffusion layer 107*p*11, the gate insulating film 105, and the gate electrode 106 constitute the PMOS transistor Tp11. The silicon pillar 104*n*12, the lower diffusion layer 102*pb*, the upper diffusion layer 107*p*12, the gate insulating film 105, and the gate electrode 106 constitute the PMOS transistor Tp12. The silicon pillar 104*n*13, the lower diffusion layer 102*pa*, the upper diffusion layer 107*p*13, the gate insulating film 105, and the gate electrode 106 constitute the PMOS transistor Tp13. The silicon pillar 104*p*11, the lower diffusion layer 102*nb*, the upper diffusion layer 107*n*11, the gate insulating film 105, and the gate electrode 106 constitute the NMOS transistor Tn11. The silicon pillar 104*p*12, the lower diffusion layer 102*nc*, the upper diffusion layer 107*n*12, the gate insulating film 105, and the gate electrode 106 constitute the NMOS transistor Tn12. The silicon pillar 104*p*13, the lower diffusion layer 102*na*, the upper diffusion layer 107*n*13, the gate insulating film 105, and the gate electrode 106 constitute the NMOS transistor Tn13.

Further, the gate line 106*b* is connected to the gate electrode 106 of the PMOS transistor Tp11 and the gate electrode 106 of the NMOS transistor Tn11, and the gate line 106*c* is connected to the gate electrode 106 of the PMOS transistor Tp12 and the gate electrode 106 of the NMOS transistor Tn12. The gate electrode 106 of the PMOS transistor Tp13 and the gate electrode 106 of the NMOS transistor Tn13 are connected in common to which the gate line 106*a* is connected.

The lower diffusion layers 102*pb* and 102*nb* are connected to each other by using the silicide layer 103 to serve as a common drain of the PMOS transistor Tp11, the PMOS transistor Tp12, and the NMOS transistor Tn11, and are connected to an output DEC1. The upper diffusion layer 107*p*11, which is the source of the PMOS transistor Tp11, is connected to the line 113*e* of the first metal wiring layer via the silicide layer 109*p*11 and the contact 110*p*11. The line 113*e* of the first metal wiring layer is connected to the line 115*g* of the second metal wiring layer via the contact 114*p*11, and the power supply Vcc is supplied to the line 115*g* of the second metal wiring layer.

The upper diffusion layer 107*p*12, which is the source of the PMOS transistor Tp12, is connected to the line 113*d* of the first metal wiring layer via the silicide layer 109*p*12 and the contact 110*p*12. The line 113*d* of the first metal wiring layer is connected to the line 115*e* of the second metal wiring layer via the contact 114*p*12, and the power supply Vcc is supplied to the line 115*e* of the second metal wiring layer.

The upper diffusion layer 107*n*11, which is the source of the NMOS transistor Tn11, is connected to the line 113*g* of the first metal wiring layer via the silicide layer 109*n*11 and the contact 110*n*11. The upper diffusion layer 107*n*12, which is the drain of the NMOS transistor Tn12, is connected to the line 113*g* of the first metal wiring layer via the silicide layer 109*n*12 and the contact 110*n*12.

Here, the source of the NMOS transistor Tn11 and the drain of the NMOS transistor Tn12 are connected to each other via the line 113*g* of the first metal wiring layer. Further, the lower diffusion layer 102*nc* serves as the source of the NMOS transistor Tn12, and is connected to the line 113*i* of the first metal wiring layer via the silicide layer 103 and the contact 112*b*. The line 113*i* of the first metal wiring layer is connected to the line 115*k* of the second metal wiring layer via the contact 114*c*, and the reference power supply Vss is supplied to the line 115*k* of the second metal wiring layer.

The lower diffusion layer 102*pa*, which is the drain of the PMOS transistor Tp13, and the lower diffusion layer 102*na*, which is the drain of the NMOS transistor Tn13, are connected in common via the silicide layer 103 to serve as an output SEL1.

The upper diffusion layer 107*p*13, which is the source of the PMOS transistor Tp13, is connected to the line 113*b* of the first metal wiring layer via the silicide layer 109*p*13 and the contact 110*p*13. The line 113*b* of the first metal wiring layer is connected to the line 115*b* of the second metal wiring layer via the contact 114*p*13, and the power supply Vcc is supplied to the line 115*b* of the second metal wiring layer.

The upper diffusion layer 107*n*13, which is the source of the NMOS transistor Tn13, is connected to the line 113*a* of the first metal wiring layer via the silicide layer 109*n*13 and the contact 110*n*13. The line 113*a* of the first metal wiring layer is connected to the line 115*a* of the second metal wiring layer via the contact 114*n*13, and the reference power supply Vss is supplied to the line 115*a* of the second metal wiring layer. Further, the gate line 106*a*, which is common to the PMOS transistor Tp13 and the NMOS transistor Tn13, is connected to the silicide layer 103, which is the output DEC1, via the contact 111*a*, the line 113*c* of the first metal wiring layer, and the contact 112*a*.

The line 115*h* of the second metal wiring layer is supplied with an address signal A1. The line 115*h* of the second metal wiring layer is connected to the gate line 106*b* via the contact 114*a*, the line 113*f* of the first metal wiring layer, and the contact 111*b*, and accordingly the address signal A1 is supplied to the gate electrode 106 of the PMOS transistor Tp11 and the gate electrode 106 of the NMOS transistor Tn11.

The line 115*j* of the second metal wiring layer is supplied with an address signal A2. The line 115*j* of the second metal wiring layer is connected to the gate line 106*c* via the contact 114*b*, the line 113*h* of the first metal wiring layer, and the contact 111*c*, and accordingly the address signal A2 is supplied to the gate electrode 106 of the PMOS transistor Tp12 and the gate electrode 106 of the NMOS transistor Tn12.

It is to be noted that, in FIG. 2A, a size in the longitudinal direction (the second direction) is a minimum processing size determined by the size of an SGT, a margin between an SGT and a lower diffusion layer, and an interval between diffusion layers, and is defined as Ly. That is, a plurality of decoders 100 can be arranged vertically adjacent to one another at a minimum pitch (minimum interval) Ly.

According to this exemplary embodiment, six SGTs constituting a 2-input NAND decoder and an inverter are arranged in a line in a first direction, and the power supply Vcc, the reference power supply Vss, and the address signal lines A1 and A2 are arranged to extend in a second direction perpendicular to the first direction. This configuration provides a semiconductor device including a 2-input NAND decoder and an inverter with a reduced area without using any extra lines or contact regions.

Equivalent Circuit Applicable to Exemplary Embodiment of Present Invention

Figure 4:
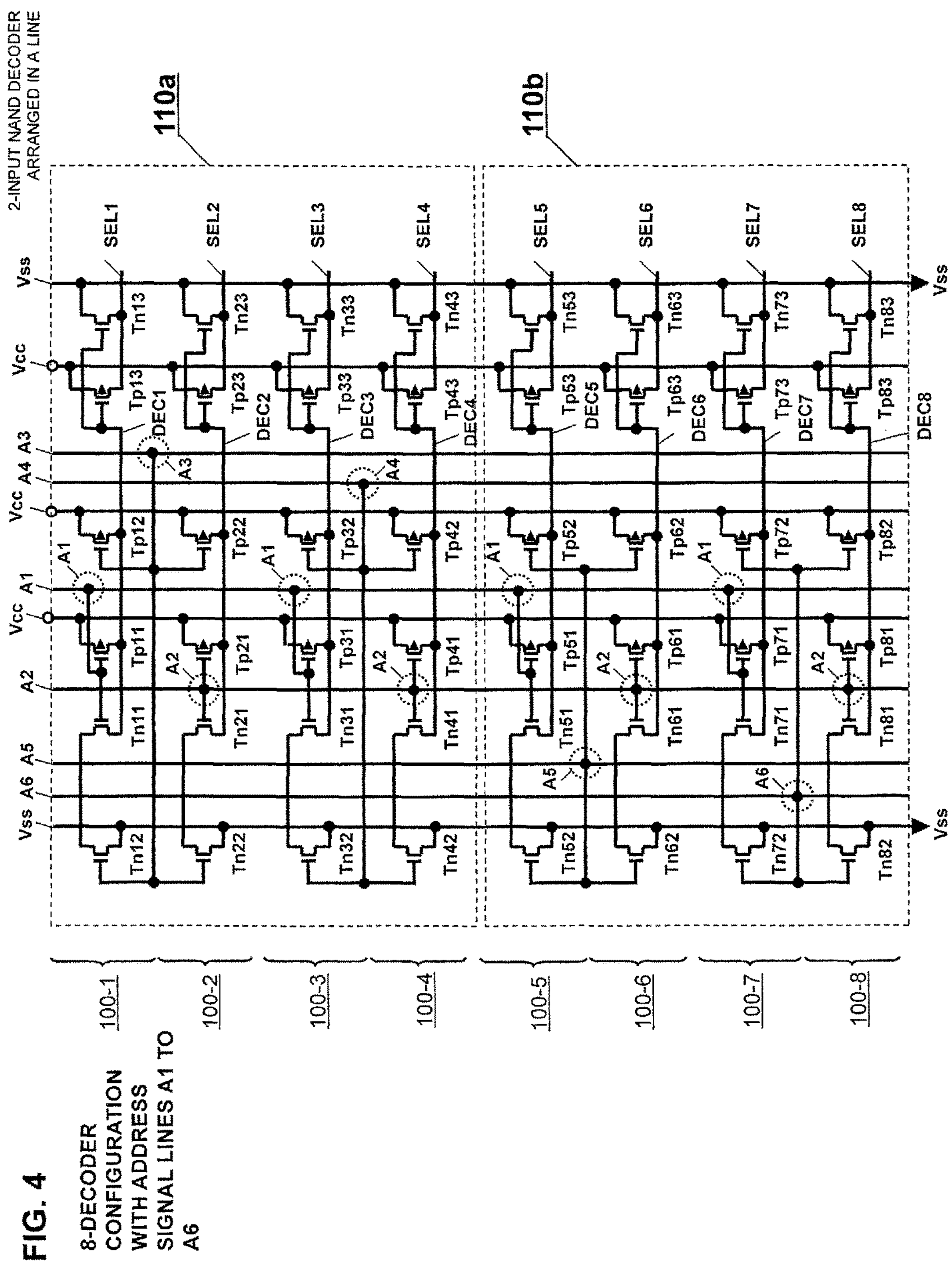
FIG. 4 is an equivalent circuit diagram illustrating a decoder according to a second exemplary embodiment of the present invention.

FIG. 4 illustrates an equivalent circuit diagram of decoders, each constructed by arranging a plurality of 2-input NAND decoders and a plurality of inverters applicable to the present invention.

Six address signal lines A1, A2, A3, A4, A5, and A6 are provided, in which the address signal lines A1 and A2 are selectively connected to the gate of the PMOS transistor Tp11 and the gate of the NMOS transistor Tn11 and the address signal lines A3, A4, A5, and A6 are selectively connected to the gate of the PMOS transistor Tp12 and the gate of the NMOS transistor Tn12. Eight decoders 100-1 to 100-8 are formed by using the six address signals A1 to A6. The address signal lines A1 and A3 are connected to the decoder 100-1. The address signal lines A2 and A3 are connected to the decoder 100-2. The address signal lines A1 and A4 are connected to the decoder 100-3. The address signal lines A2 and A4 are connected to the decoder 100-4. The address signal lines A1 and A5 are connected to the decoder 100-5. The address signal lines A2 and A5 are connected to the decoder 100-6. The address signal lines A1 and A6 are connected to the decoder 100-7. The address signal lines A2 and A6 are connected to the decoder 100-8.

Portions at which address signal lines are connected are indicated by the broken-line circles.

As illustrated in a second exemplary embodiment described below, the address signal line A3 is connected in common to the decoders 100-1 and 100-2, the address signal line A4 is connected in common to the decoders 100-3 and 100-4, the address signal line A5 is connected in common to the decoders 100-5 and 100-6, and the address signal line A6 are connected in common to the decoders 100-7 and 100-8.

FIG. 5 illustrates an address map of the eight decoders illustrated in FIG. 4. An address signal line to be connected to each of the decoder outputs DEC1/SEL1 to DEC8/SEL8 is marked with a circle. Connections are made by using contacts, as described below.

Second Exemplary Embodiment

Figure 6A:
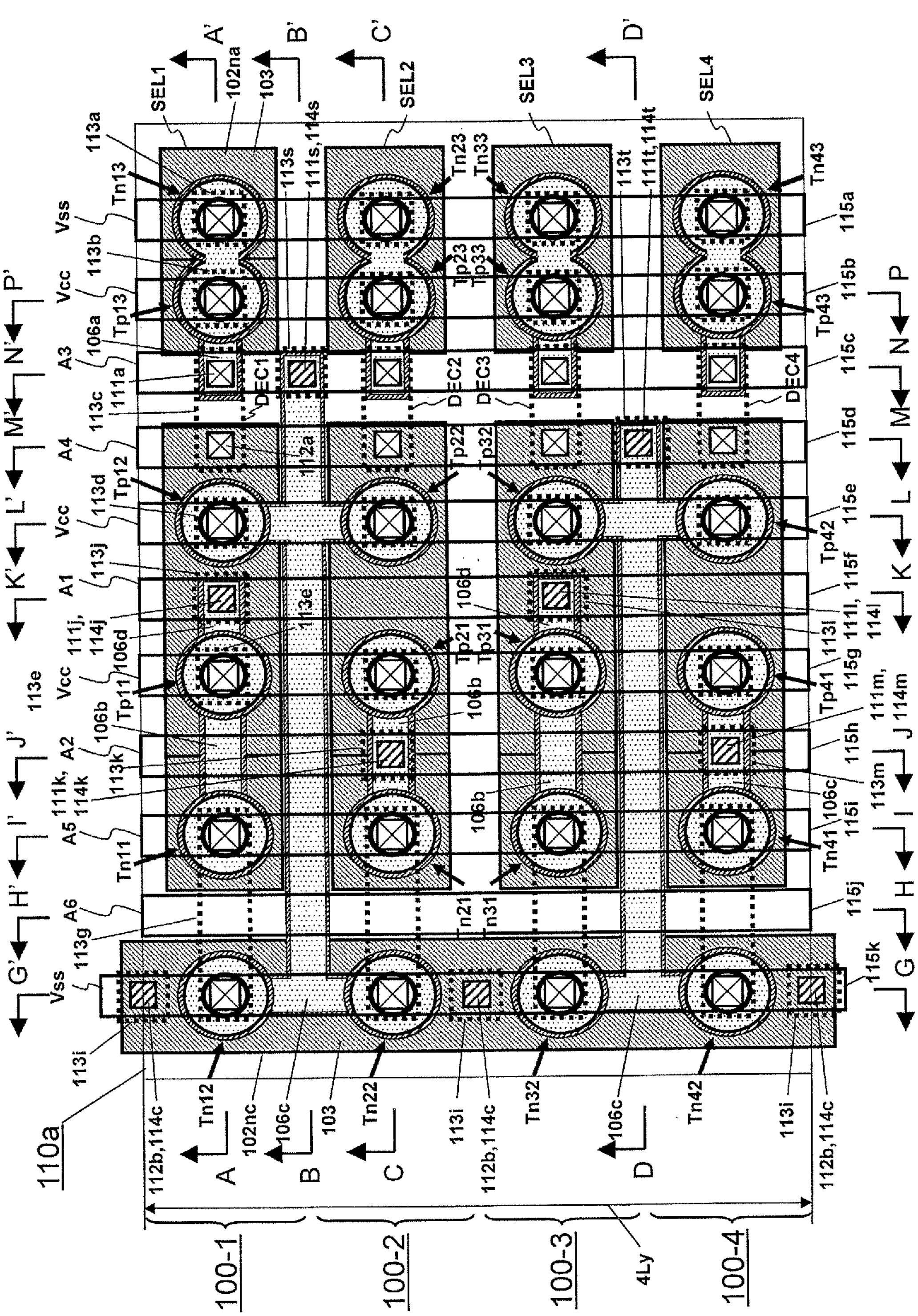
FIG. 6A is a plan view of the decoder according to the second exemplary embodiment of the present invention.
Figure 6B:
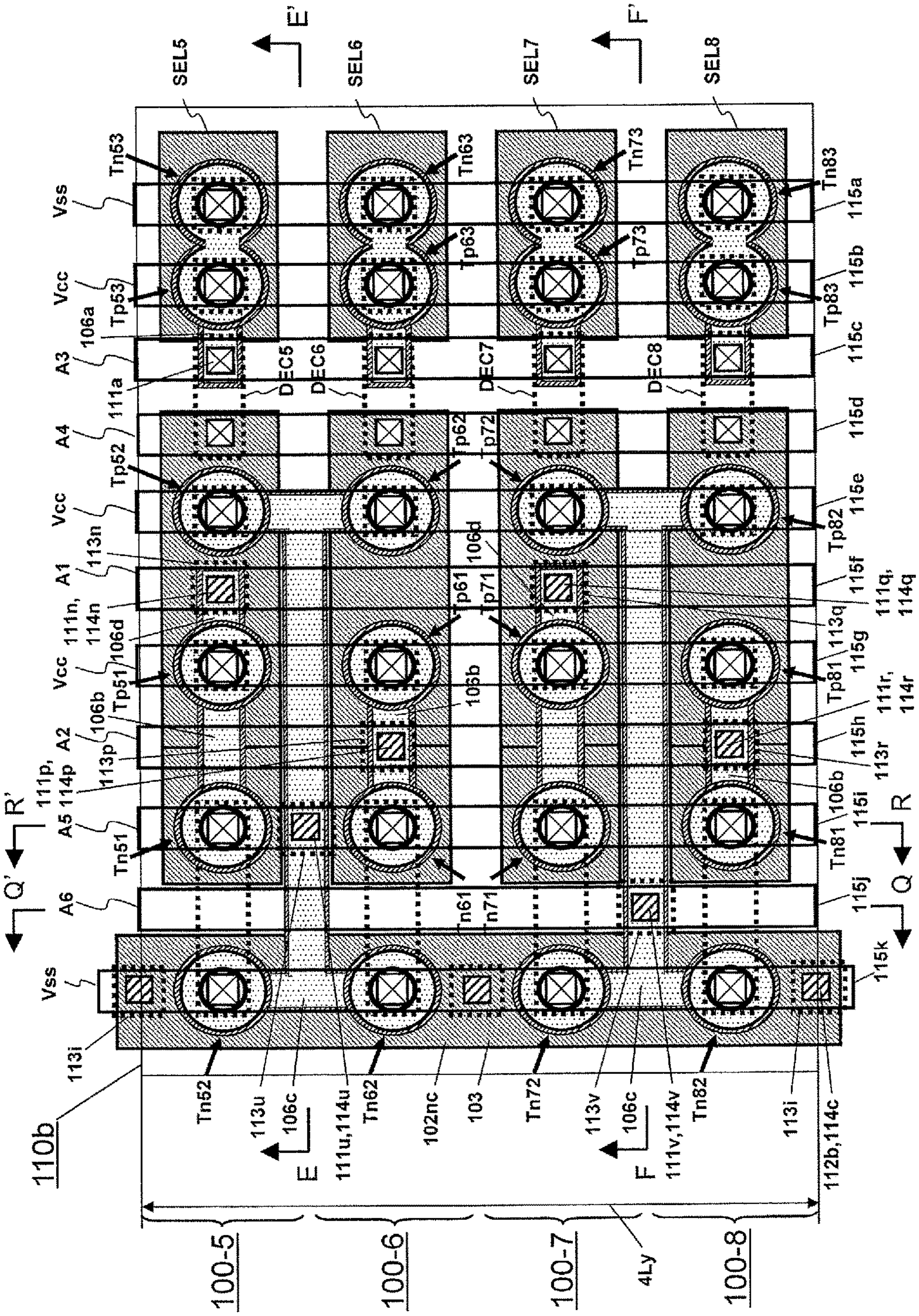
FIG. 6B is a plan view of the decoder according to the second exemplary embodiment of the present invention.
Figure 6C:
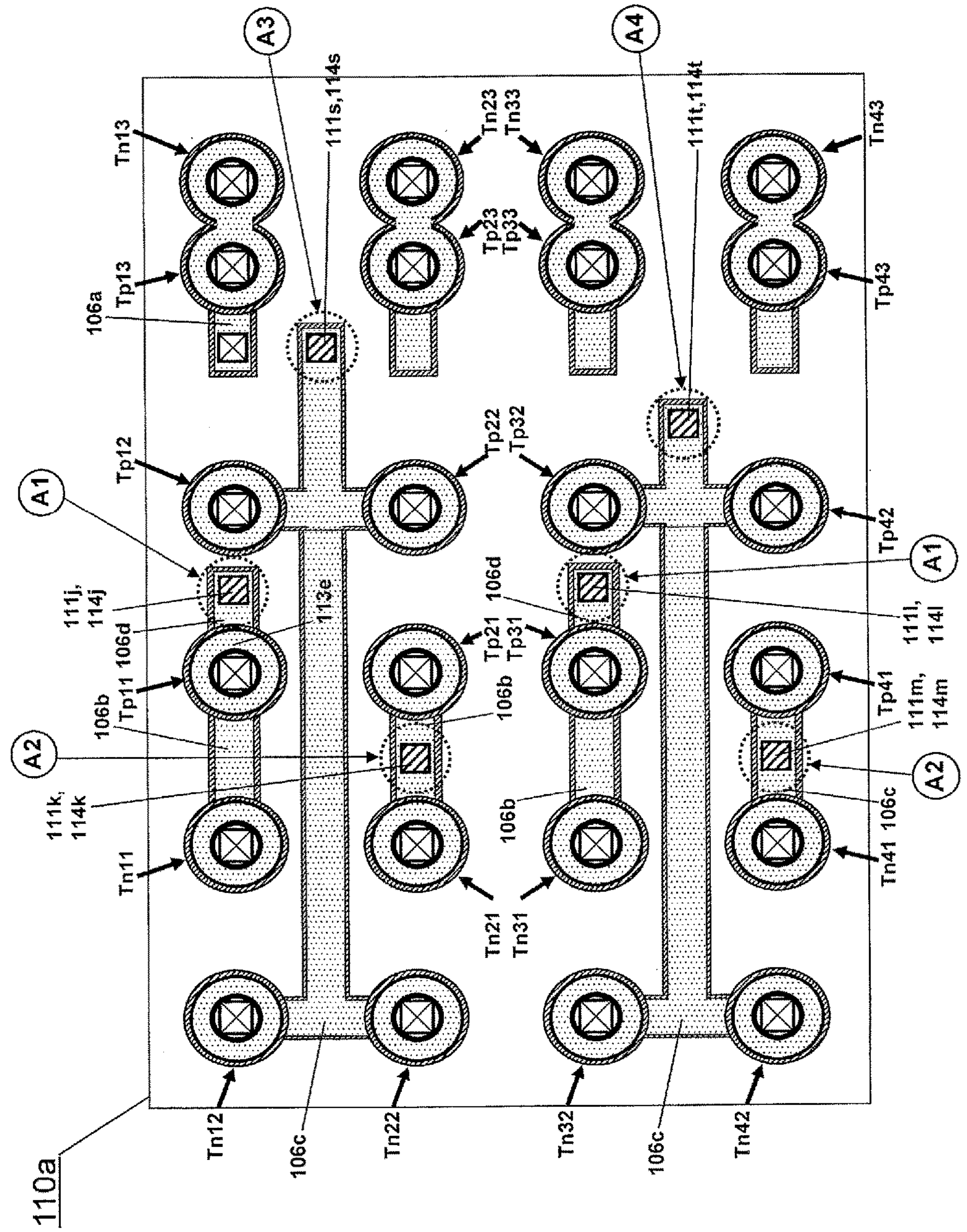
FIG. 6C is a plan view of the decoder according to the second exemplary embodiment of the present invention.
Figure 7A:
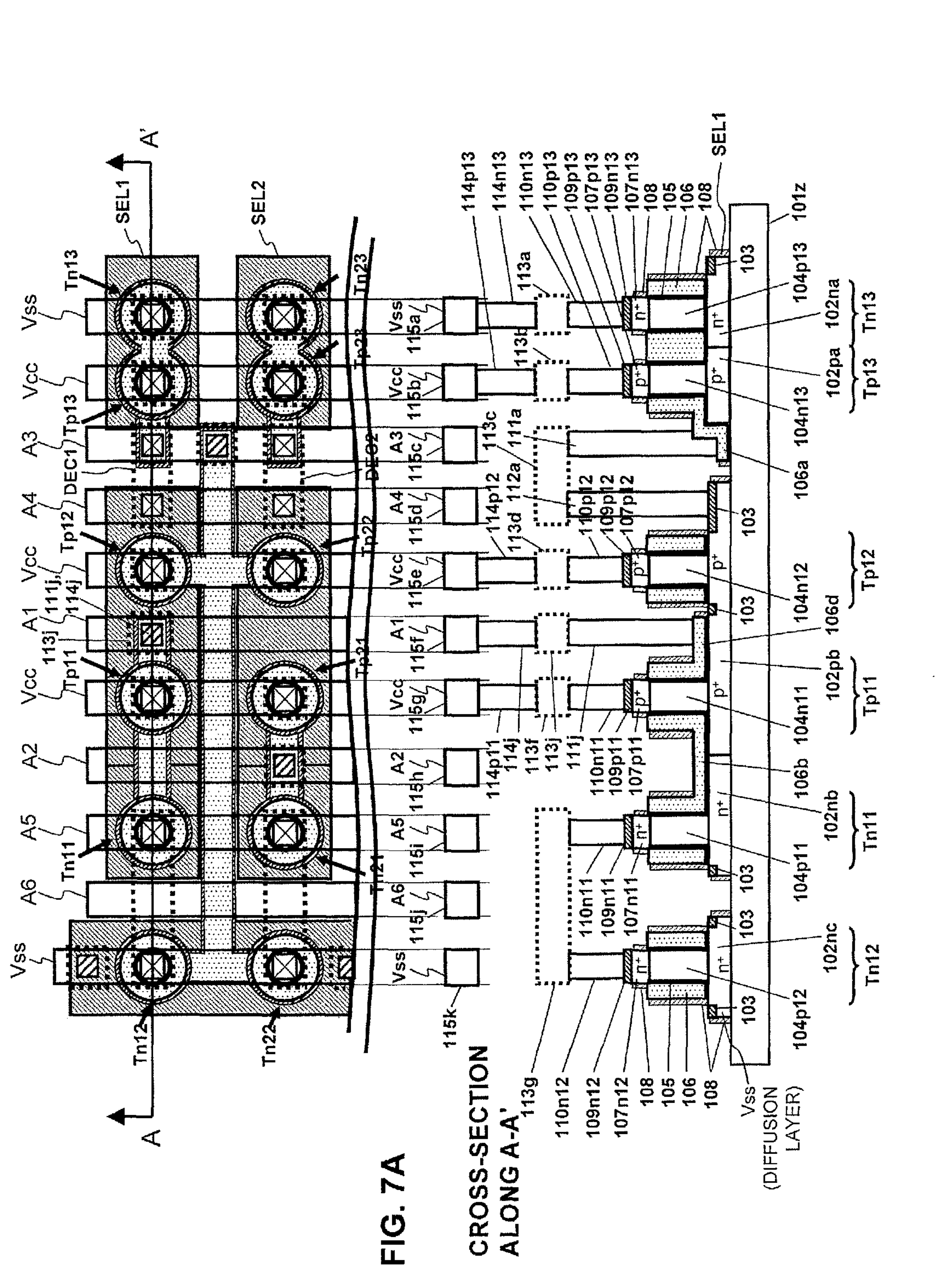
FIG. 7A is a cross-sectional view of the decoder according to the second exemplary embodiment of the present invention.
Figure 7B:
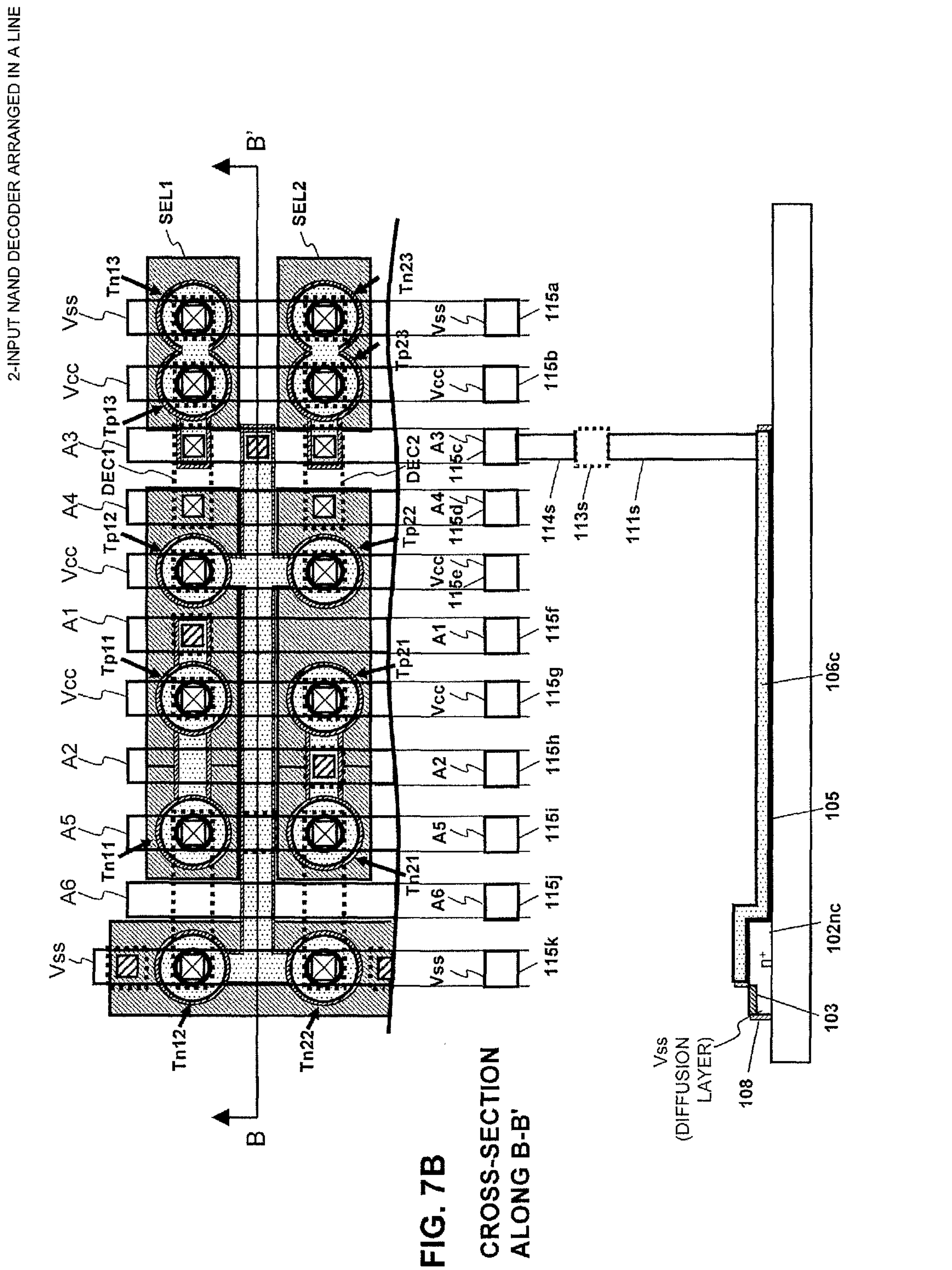
FIG. 7B is a cross-sectional view of the decoder according to the second exemplary embodiment of the present invention.
Figure 7C:
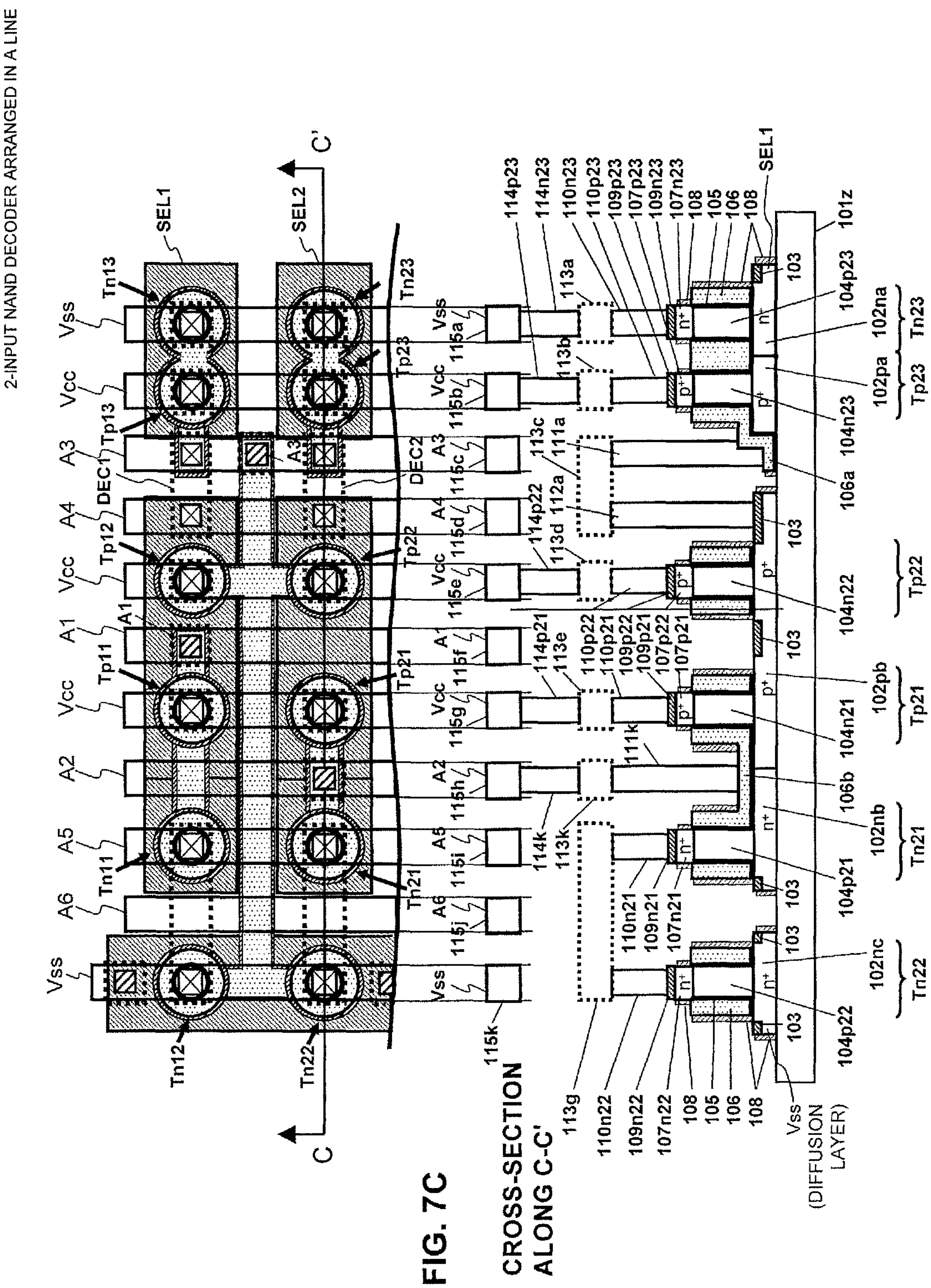
FIG. 7C is a cross-sectional view of the decoder according to the second exemplary embodiment of the present invention.
Figure 7D:
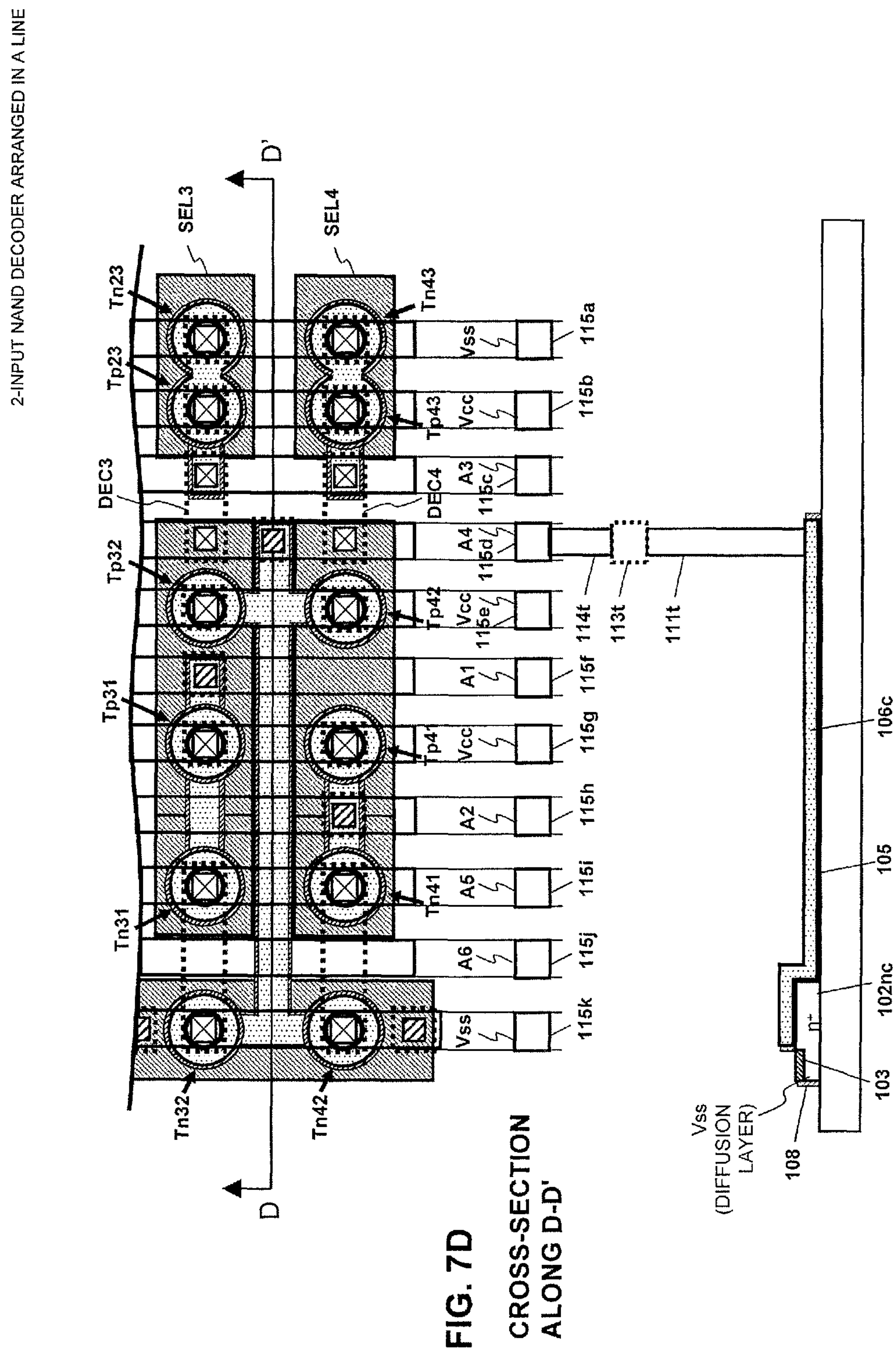
FIG. 7D is a cross-sectional view of the decoder according to the second exemplary embodiment of the present invention.
Figure 7E:
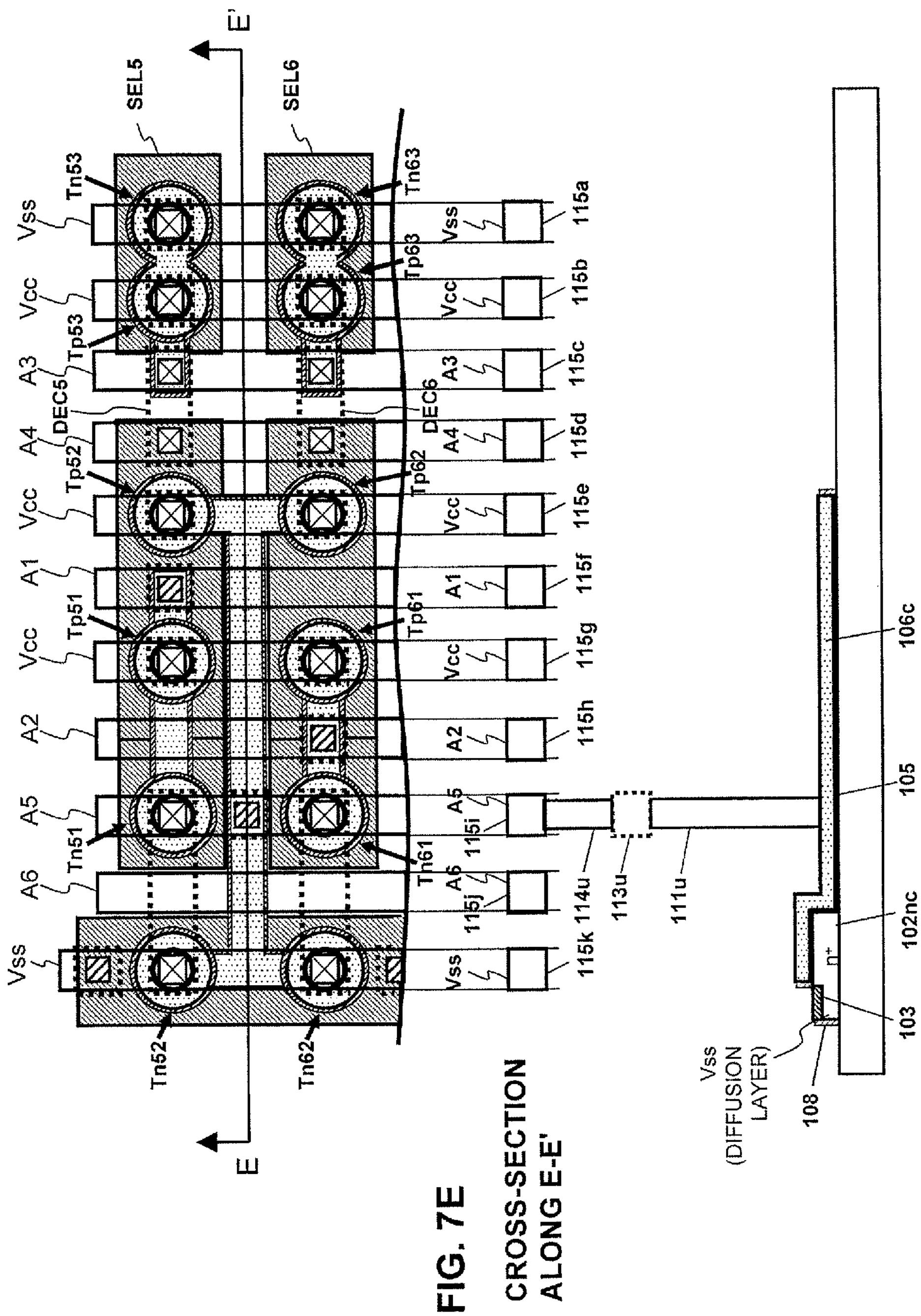
FIG. 7E is a cross-sectional view of the decoder according to the second exemplary embodiment of the present invention.
Figure 7F:
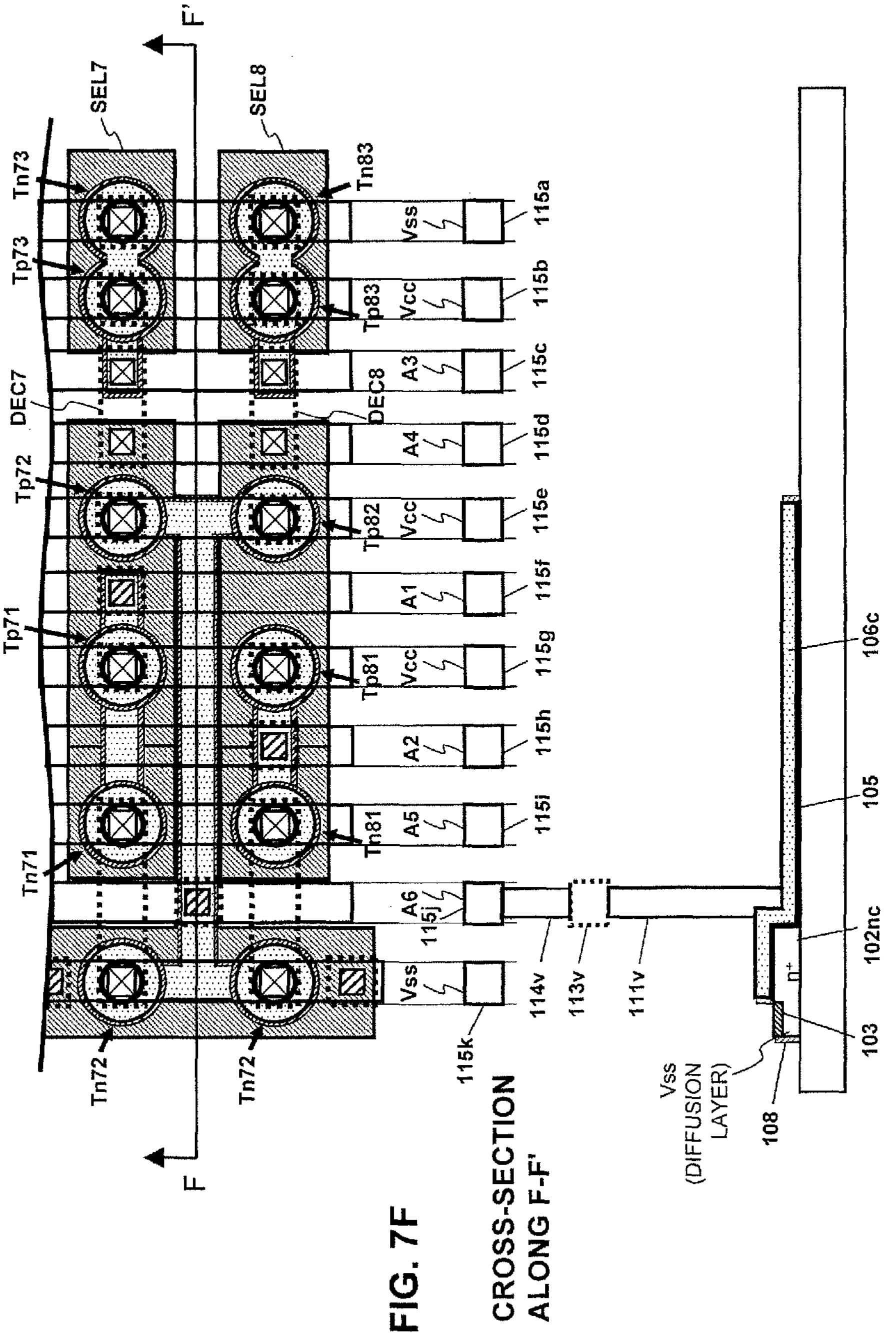
FIG. 7F is a cross-sectional view of the decoder according to the second exemplary embodiment of the present invention.
Figure 7G:
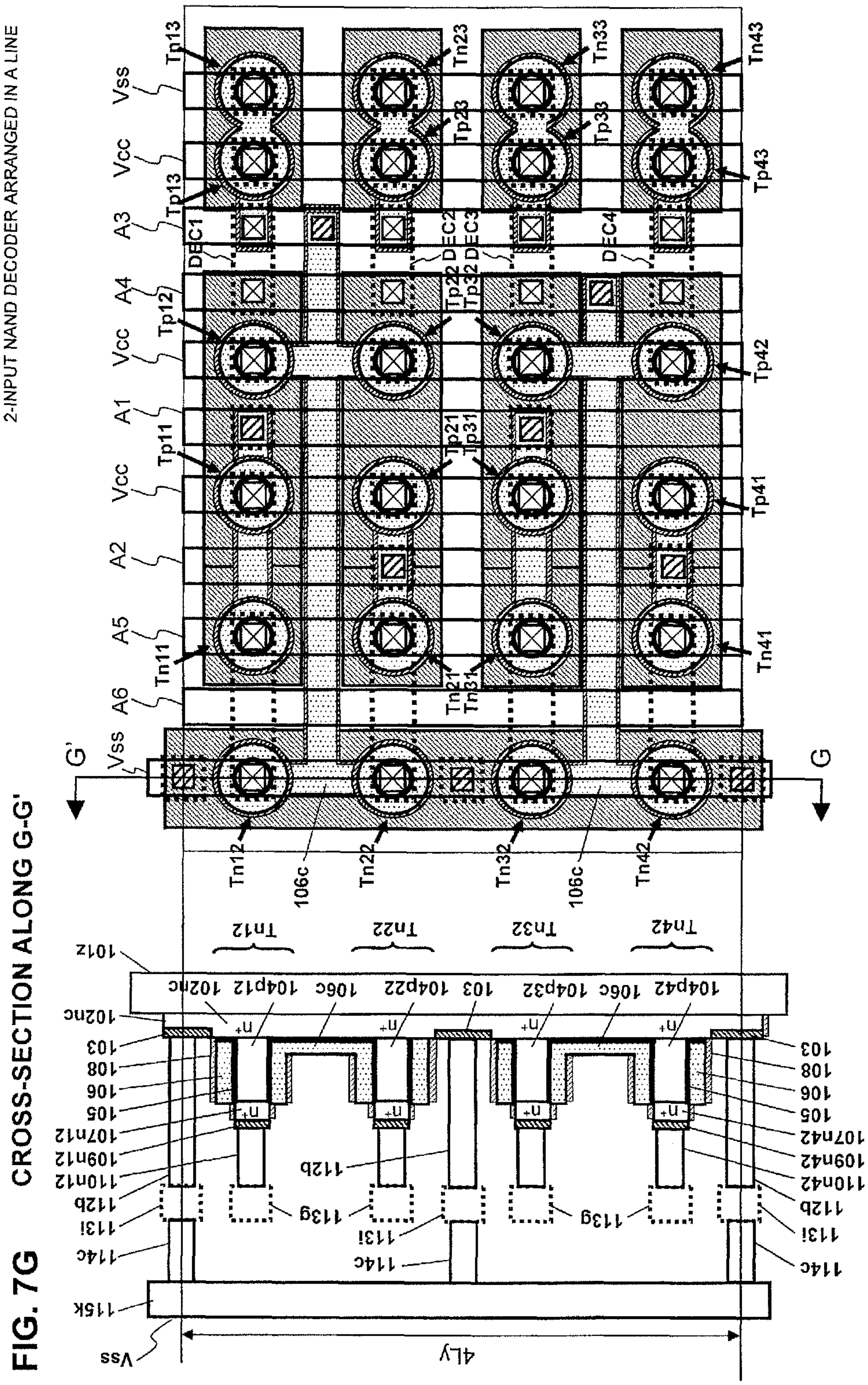
FIG. 7G is a cross-sectional view of the decoder according to the second exemplary embodiment of the present invention.
Figure 7I:
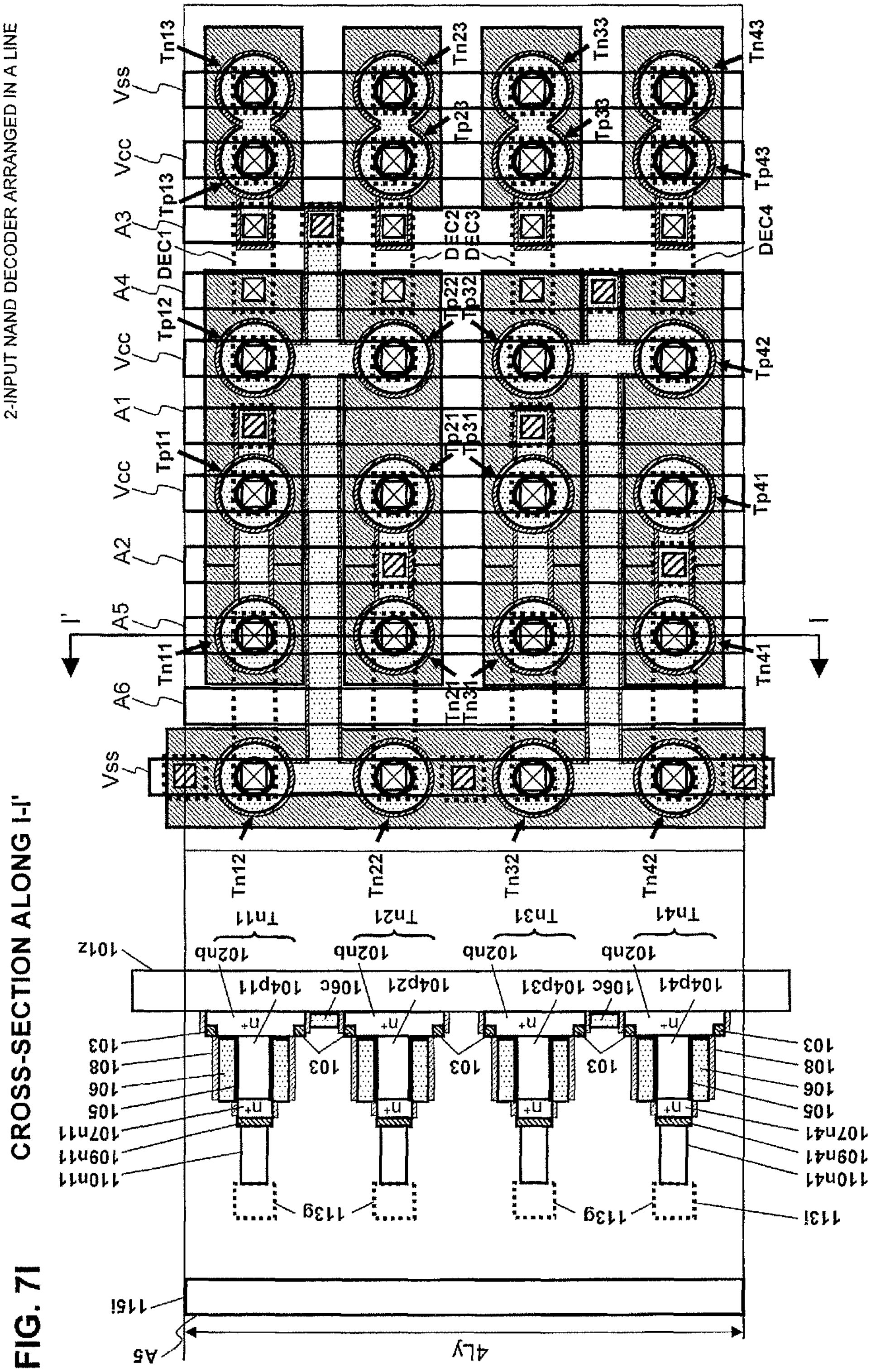
FIG. 7I is a cross-sectional view of the decoder according to the second exemplary embodiment of the present invention.
Figure 7J:
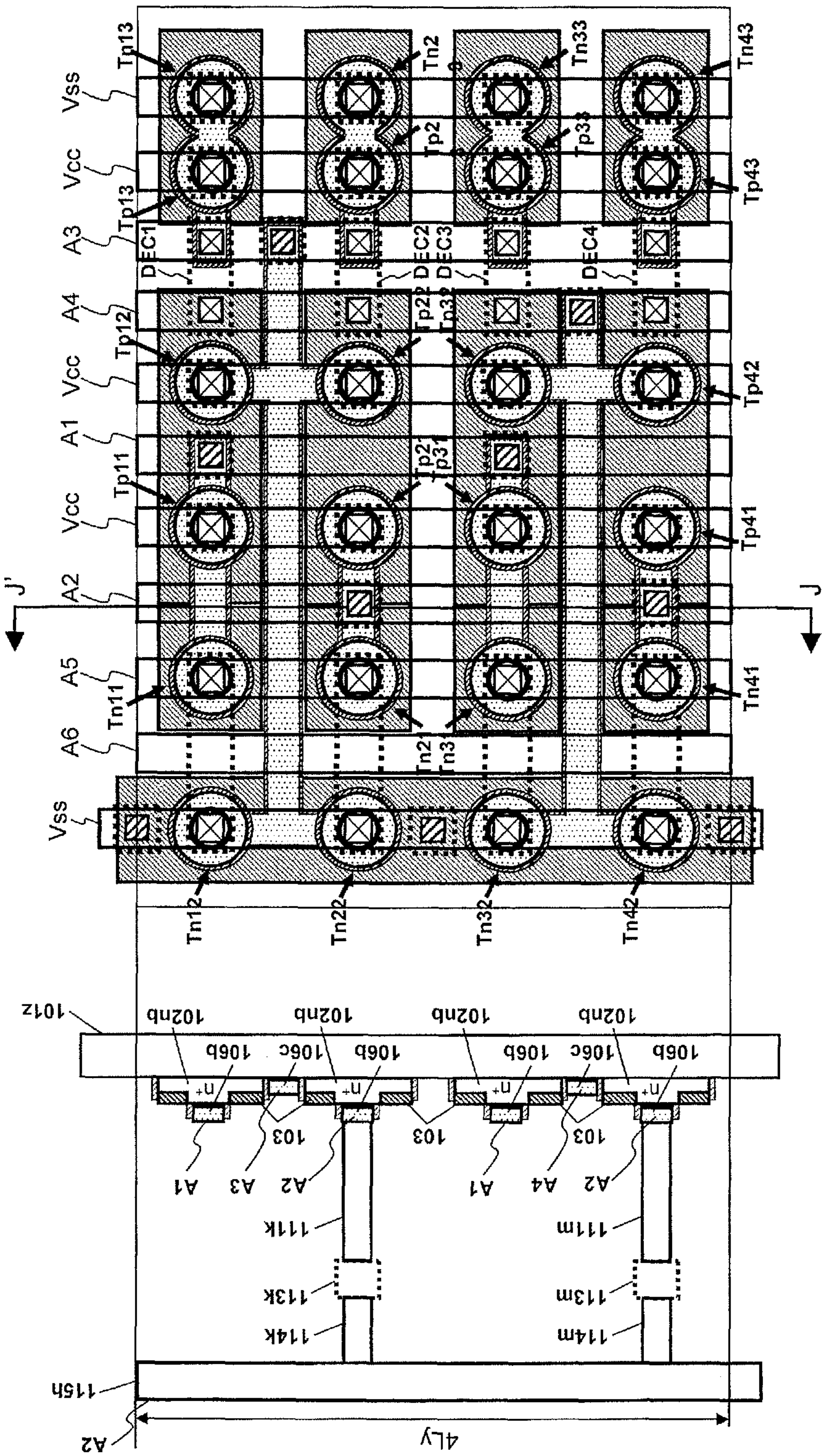
FIG. 7J is a cross-sectional view of the decoder according to the second exemplary embodiment of the present invention.
Figure 7L:
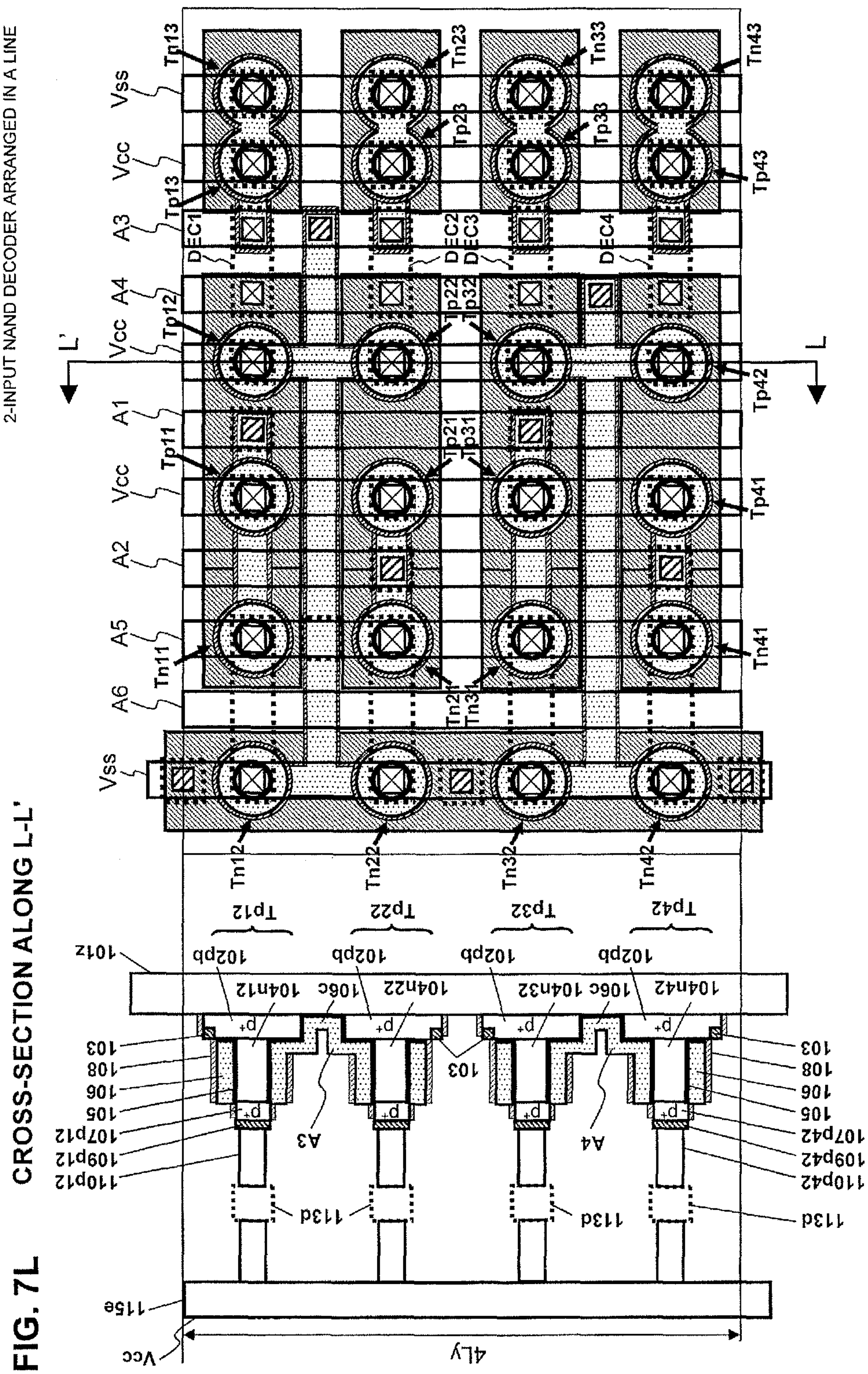
FIG. 7L is a cross-sectional view of the decoder according to the second exemplary embodiment of the present invention.
Figure 7M:
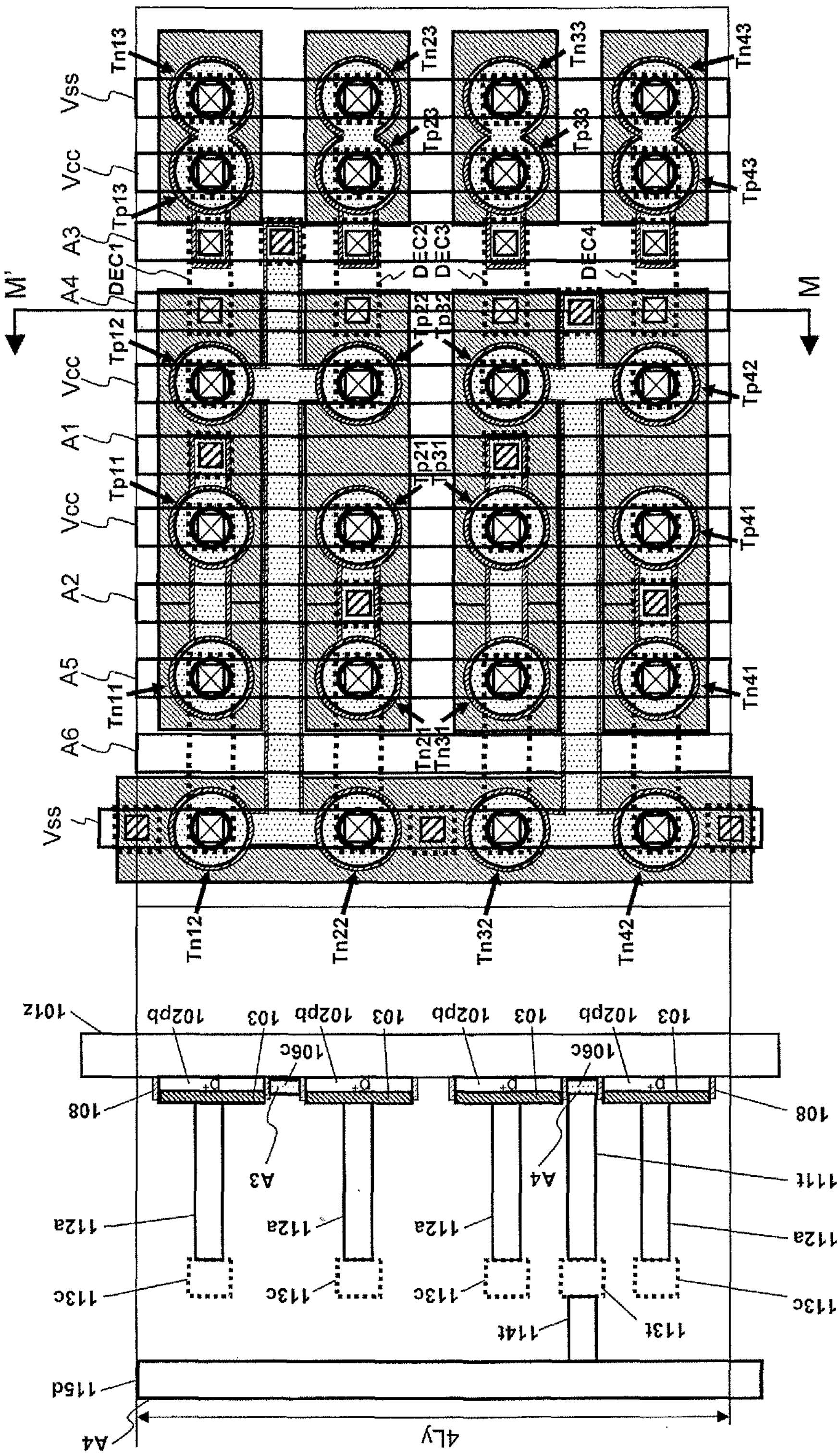
FIG. 7M is a cross-sectional view of the decoder according to the second exemplary embodiment of the present invention.
Figure 7N:
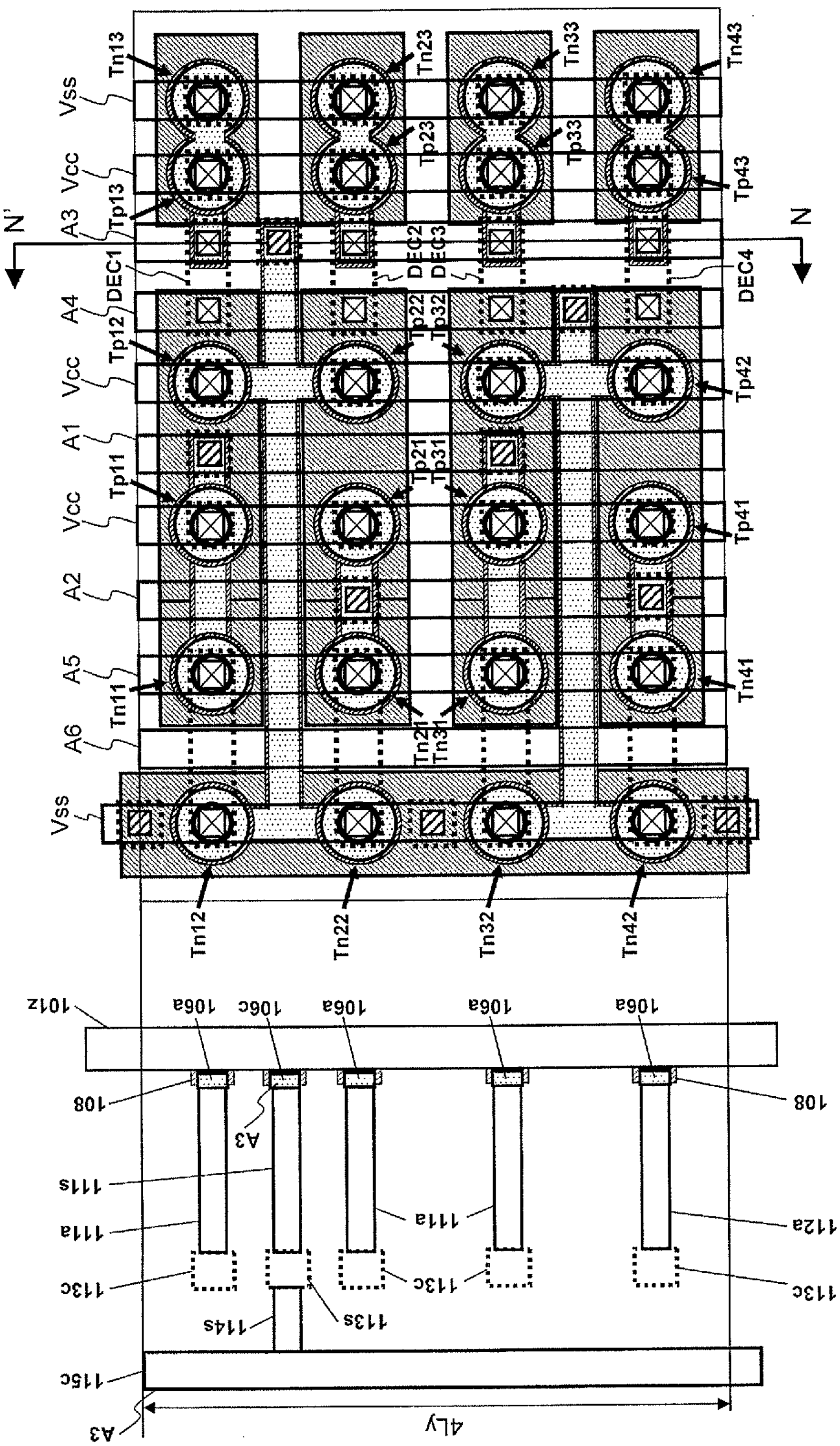
FIG. 7N is a cross-sectional view of the decoder according to the second exemplary embodiment of the present invention.
Figure 7P:
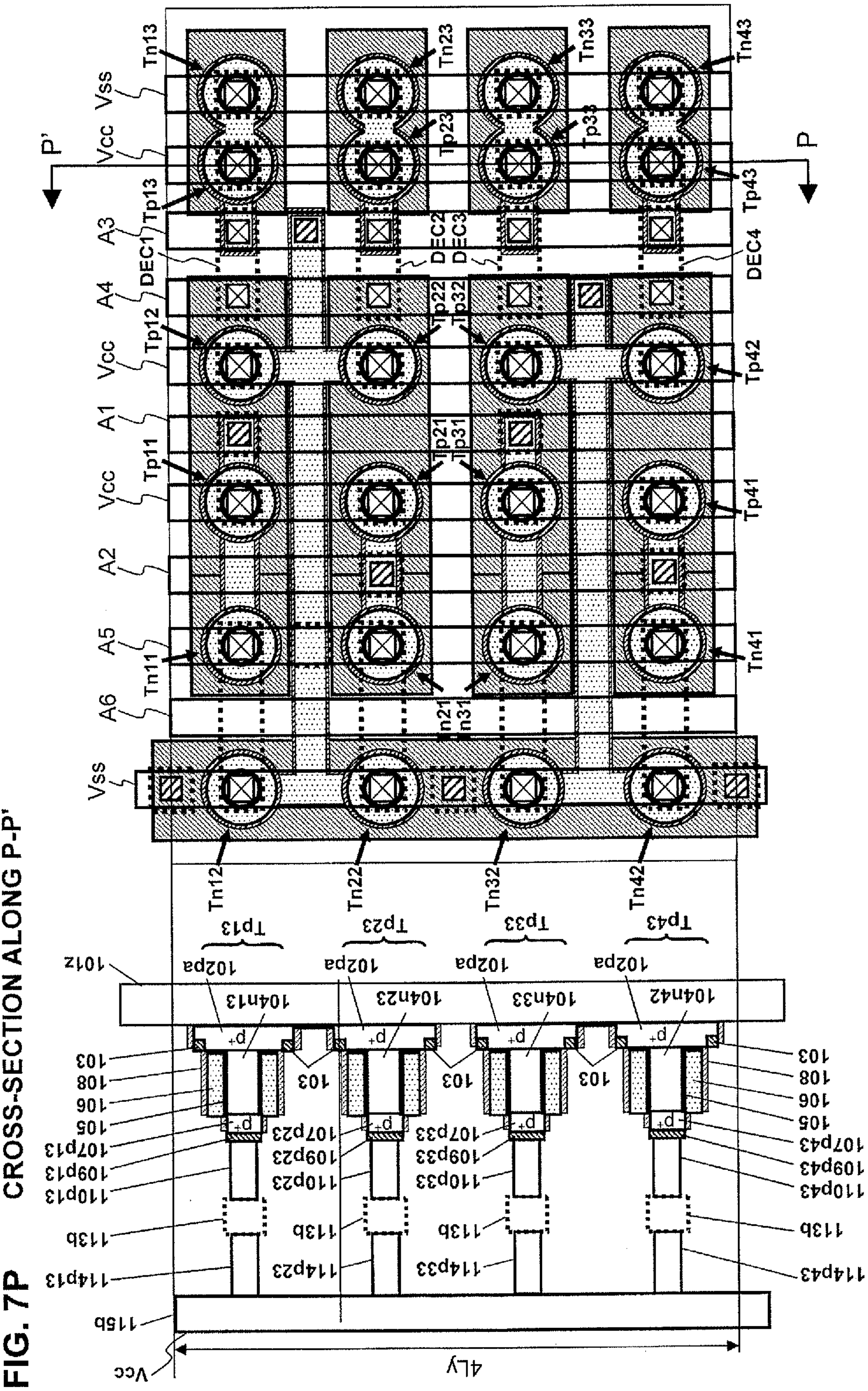
FIG. 7P is a cross-sectional view of the decoder according to the second exemplary embodiment of the present invention.
Figure 7Q:
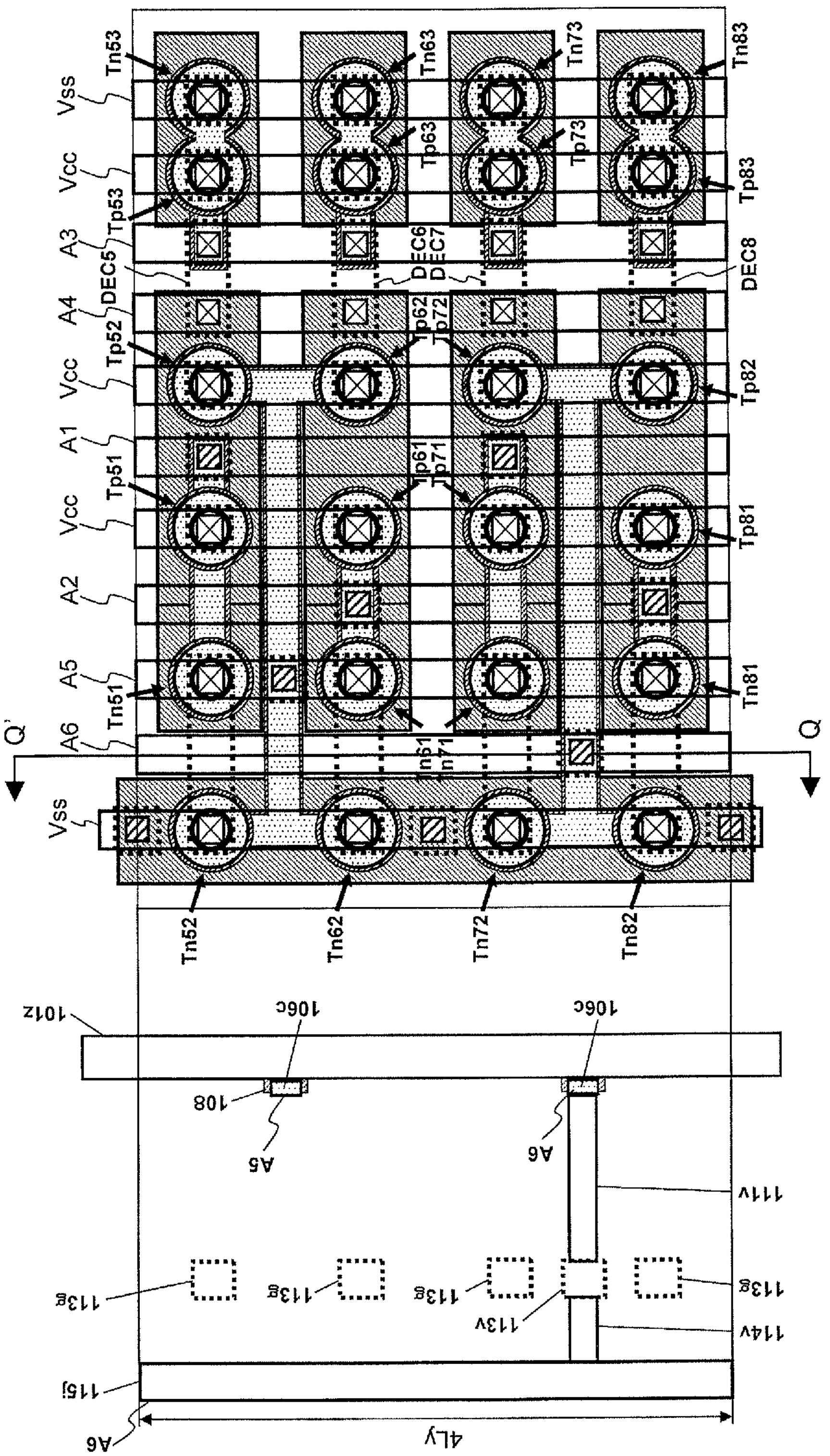
FIG. 7Q is a cross-sectional view of the decoder according to the second exemplary embodiment of the present invention.
Figure 7R:
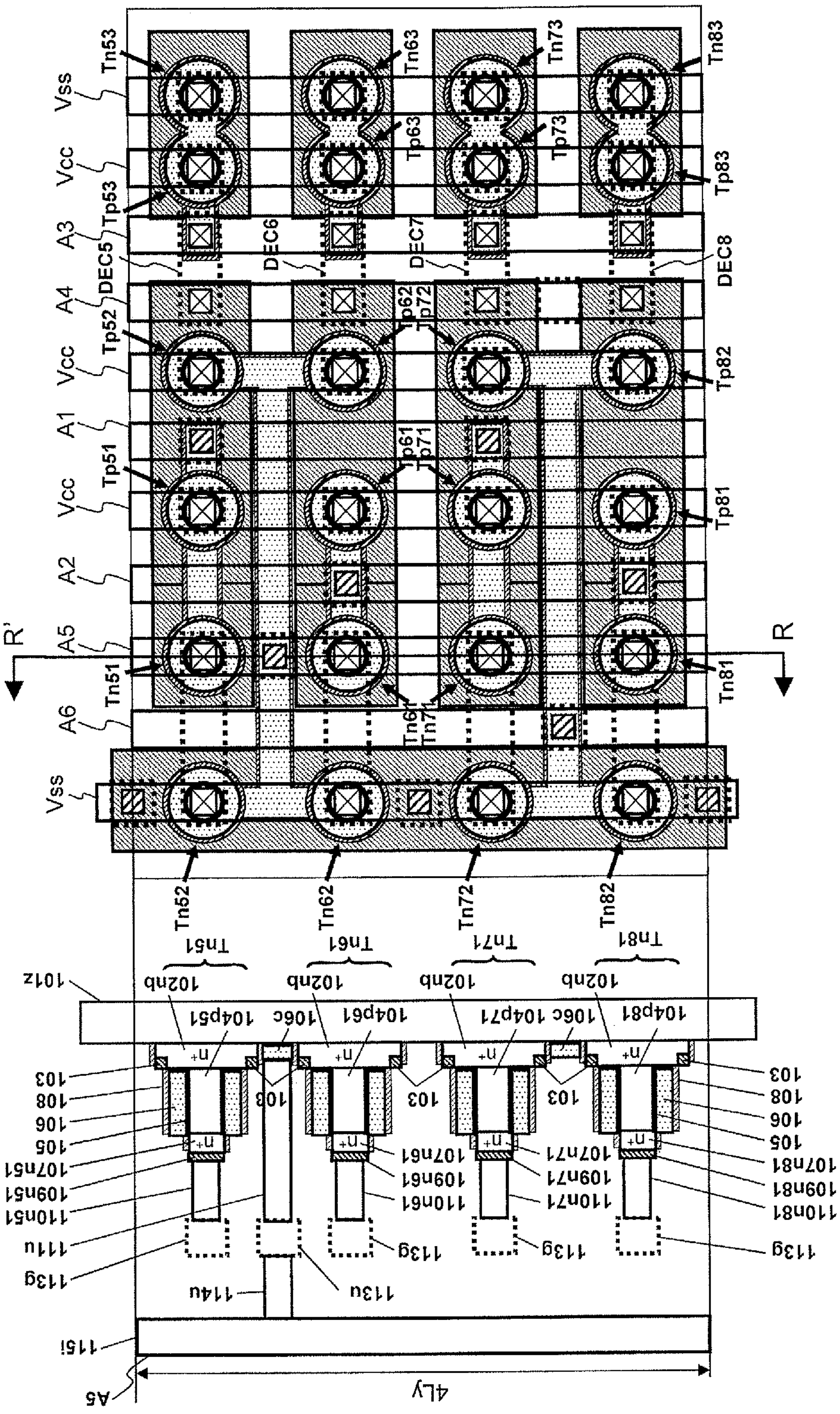
FIG. 7R is a cross-sectional view of the decoder according to the second exemplary embodiment of the present invention.

FIGS. 6A, 6B, and 6C and FIGS. 7A to 7R illustrate the second exemplary embodiment. This exemplary embodiment illustrates an implementation of the equivalent circuit illustrated in FIG. 4, in which eight decoders, each of which is the decoder 100 illustrated in FIG. 2A, are arranged vertically (in the second direction) in this figure adjacent to one another at a minimum pitch Ly. FIGS. 6A and 6B are plan views of the layout (arrangement) of the 2-input NAND decoders and the inverters according to the second exemplary embodiment of the present invention, and FIG. 6C is a view illustrating only the transistors and the gate lines in FIG. 6A. FIG. 7A is a cross-sectional view taken along the cut-line A-A' in FIG. 6A, FIG. 7B is a cross-sectional view taken along the cut-line B-B' in FIG. 6A, FIG. 7C is a cross-sectional view taken along the cut-line C-C' in FIG. 6A, FIG. 7D is a cross-sectional view taken along the cut-line D-D' in FIG. 6A, FIG. 7E is a cross-sectional view taken along the cut-line E-E' in FIG. 6B, FIG. 7F is a cross-sectional view taken along the cut-line F-F' in FIG. 6B, FIG. 7G is a cross-sectional view taken along the cut-line G-G' in FIG. 6A, FIG. 7H is a cross-sectional view taken along the cut-line H-H' in FIG. 6A, FIG. 7I is a cross-sectional view taken along the cut-line I-I' in FIG. 6A, FIG. 7J is a cross-sectional view taken along the cut-line J-J' in FIG. 6A, FIG. 7K is a cross-sectional view taken along the cut-line K-K' in FIG. 6A, FIG. 7L is a cross-sectional view taken along the cut-line L-L' in FIG. 6A, FIG. 7M is a cross-sectional view taken along the cut-line M-M' in FIG. 6A, FIG. 7N is a cross-sectional view taken along the cut-line N-N' in FIG. 6A, FIG. 7P is a cross-sectional view taken along the cut-line P-P' in FIG. 6A, FIG. 7Q is a cross-sectional view taken along the cut-line Q-Q' in FIG. 6B, and FIG. 7R is a cross-sectional view taken along the cut-line R-R' in FIG. 6B.

FIG. 6A illustrates a decoder block 110*a* illustrated in FIG. 4, and FIG. 6B illustrates a decoder block 110*b* illustrated in FIG. 4. Although FIGS. 6A and 6B are consecutive views, separate views are presented in FIGS. 6A and 6B in enlarged scale, for convenience.

In FIG. 6A, the transistors constituting the decoder 100-1 illustrated in FIG. 4, namely, the NMOS transistor Tn13, the PMOS transistors Tp13, Tp12, and Tp11, and the NMOS transistors Tn11 and Tn12, are arranged in the top row of FIG. 6A in a line in the lateral direction (the first direction) from right to left in this figure.

The transistors constituting the decoder 100-2, namely, the NMOS transistor Tn23, the PMOS transistors Tp23, Tp22, and Tp21, and the NMOS transistors Tn21 and Tn22, are arranged in the second row from the top in FIG. 6A in a line in the lateral direction (the first direction) from right to left in this figure. Likewise, the decoder 100-3 and the decoder 100-4 are arranged in sequence from top to bottom in FIG. 6A.

The gate line 106*c* is common to the PMOS transistors Tp12 and Tp22 and the NMOS transistors Tn11 and Tn12, and is formed in the space (dead space) between the lower diffusion layers of the decoder 100-1 and the decoder 100-2. This configuration can minimize the size in the longitudinal direction (the second direction). In addition, the use of a common gate line can reduce the parasitic capacitance of lines. High-speed operation can be achieved.

Also, in FIG. 6B, the transistors constituting the decoder 100-5, namely, the NMOS transistor Tn53, the PMOS transistors Tp53, Tp52, and Tp51, and the NMOS transistors Tn51 and Tn52, are arranged in the top row of FIG. 6B in a line in the lateral direction from right to left in this figure. The transistors constituting the decoder 100-6, namely, the NMOS transistor Tn63, the PMOS transistors Tp63, Tp62, and Tp61, and the NMOS transistors Tn61 and Tn62, are arranged in the second row from the top in FIG. 6B in a line in the lateral direction from right to left in this figure. Likewise, the decoder 100-7 and the decoder 100-8 are arranged in sequence from top to bottom in FIG. 6B. Although the decoders 100-4 and 100-5 are separately illustrated in FIGS. 6A and 6B for convenience of illustration, in the actual layout, the decoder 100-5 illustrated in FIG. 6B is arranged immediately below the decoder 100-4 illustrated in FIG. 6A so as to be adjacent to the decoder 100-4.

In FIGS. 6A and 6B, lines 115*a*, 115*b*, 115*c*, 115*d*, 115*e*, 115*f*, 115*g*, 115*h*, 115*i*, 115*j*, and 115*k* of a second metal wiring layer are arranged to extend in the longitudinal direction (the second direction), and respectively form a reference power supply Vss, a power supply Vcc, address signal lines A3 and A4, a power supply Vcc, an address signal line A1, a power supply Vcc, address signal lines A2, A5, and A6, and a reference power supply Vss. Since the lines 115*a* to 115*k* of the second metal wiring layer are arranged at a minimum pitch (a minimum wiring width and a minimum wiring interval) in the second metal wiring layer, the size in the lateral direction can be minimized in the arrangement.

In FIGS. 6A and 6B and FIGS. 7A to 7R, portions having the same or substantially the same structures as those illustrated in FIG. 2 and FIGS. 3A to 3H are denoted by equivalent reference numerals in the 100s.

The arrangement of the transistors constituting the decoder 100-1, namely, the NMOS transistor Tn13, the PMOS transistors Tp13, Tp12, and Tp11, and the NMOS transistors Tn11 and Tn12, up to the transistors constituting the decoder 100-8, namely, the NMOS transistor Tn83, the PMOS transistors Tp83, Tp82, and Tp81, and the NMOS transistors Tn81 and Tn82, is identical to the arrangement of the NMOS transistor Tn13, the PMOS transistors Tp13, Tp12, and Tp11, and the NMOS transistors Tn11 and Tn12 in FIG. 2A. Note that FIGS. 6A and 6B are different from FIG. 2A in the lines of the second metal wiring layer along which the power supply Vcc is supplied and in the arrangement positions and the connection portions of the lines of the second metal wiring layer along which address signals are supplied.

In FIGS. 6A and 6B, the following connections are provided.

The line 115*a* of the second metal wiring layer along which the reference power supply Vss is supplied is arranged to extend in the second direction, and is connected to the sources of the NMOS transistors Tn13 and Tn23 to Tn83.

The line 115*b* of the second metal wiring layer along which the power supply Vcc is supplied is arranged to extend in the second direction, and is connected to the sources of the PMOS transistors Tp13 and Tp23 to Tp83.

The line 115*c* of the second metal wiring layer along which an address signal A3 is supplied is arranged to extend in the second direction, and is connected to the gate line 106*c* via a contact 114*s*, a line 113*s* of the first metal wiring layer, and a contact 111*s*. The line 115*c* of the second metal wiring layer is then connected to the gate electrodes of the PMOS transistors Tp12 and Tp22 and the gate electrodes of the NMOS transistors Tn12 and Tn22.

The line 115*d* of the second metal wiring layer along which an address signal A4 is supplied is arranged to extend in the second direction, and is connected to the gate line 106*c* via a contact 114*t*, a line 113*t* of the first metal wiring layer, and a contact 111*t*. The line 115*d* of the second metal wiring layer is then connected to the gate electrodes of the PMOS transistors Tp32 and Tp42 and the gate electrodes of the NMOS transistors Tn32 and Tn42.

The line 115*e* of the second metal wiring layer along which the power supply Vcc is supplied is arranged to extend in the second direction, and is connected to the sources of the PMOS transistors Tp12 and Tp22 to Tp82.

The line 115*f* of the second metal wiring layer along which an address signal A1 is supplied is arranged to extend in the second direction. The line 115*f* of the second metal wiring layer is connected to a gate line 106*d* via a contact 114*j*, a line 113*j* of the first metal wiring layer, and a contact 111*j*, and is then connected to the gate electrode of the PMOS transistor Tp11. In addition, the line 115*f* of the second metal wiring layer is also connected to the gate electrode of the NMOS transistor Tn11 via the gate line 106*b*. Also, the line 115*f* of the second metal wiring layer is connected to the gate line 106*d* via a contact 114*l*, a line 113*l* of the first metal wiring layer, and a contact 111*l*, and is then connected to the gate electrode of the PMOS transistor Tp31. In addition, the line 115*f* of the second metal wiring layer is also connected to the gate electrode of the NMOS transistor Tn31 via the gate line 106*b*. Further, the line 115*f* of the second metal wiring layer is connected to the gate line 106*d* via a contact 114*n*, a line 113*n* of the first metal wiring layer, and a contact 111*n*, and is then connected to the gate electrode of the PMOS transistor Tp51. In addition, the line 115*f* of the second metal wiring layer is also connected to the gate electrode of the NMOS transistor Tn51 via the gate line 106*b*. Further, the line 115*f* of the second metal wiring layer is connected to the gate line 106*d* via a contact 114*q*, a line 113*q* of the first metal wiring layer, and a contact 111*q*, and is then connected to the gate electrode of the PMOS transistor Tp71. In addition, the line 115*f* of the second metal wiring layer is also connected to the gate electrode of the NMOS transistor Tn71 via the gate line 106*b*.

The line 115*g* of the second metal wiring layer along which the power supply Vcc is supplied is arranged to extend in the second direction, and is connected to the sources of the PMOS transistors Tp11 and Tp21 to Tp81.

The line 115*h* of the second metal wiring layer along which an address signal A2 is supplied is arranged to extend in the second direction. The line 115*h* of the second metal wiring layer is connected to the gate line 106*b* via a contact 114*k*, a line 113*k* of the first metal wiring layer, and a contact 111*k*, and is then connected to the gate electrodes of the PMOS transistor Tp21 and the NMOS transistor Tn21. Also, the line 115*h* of the second metal wiring layer is connected to the gate line 106*b* via a contact 114*m*, a line 113*m* of the first metal wiring layer, and a contact 111*m*, and is then connected to the gate electrode of the PMOS transistor Tp41 and the gate electrode of the NMOS transistor Tn41. Further, the line 115*h* of the second metal wiring layer is connected to the gate line 106*b* via a contact 114*p*, a line 113*p* of the first metal wiring layer, and a contact 111*p*, and is then connected to the gate electrode of the PMOS transistor Tp61 and the gate electrode of the NMOS transistor Tn61. Further, the line 115*h* of the second metal wiring layer is connected to the gate line 106*b* via a contact 114*r*, a line 113*r* of the first metal wiring layer, and a contact 111*r*, and is then connected to the gate electrode of the PMOS transistor Tp81 and the gate electrode of the NMOS transistor Tn81.

The line 115*i* of the second metal wiring layer along which an address signal A5 is supplied is arranged to extend in the second direction. The line 115*i* of the second metal wiring layer is connected to the gate line 106*c* via a contact 114*u*, a line 113*u* of the first metal wiring layer, and a contact 111*u*, and is then connected to the gate electrodes of the PMOS transistors Tp52 and Tp62 and the gate electrodes of the NMOS transistors Tn52 and Tn62.

The line 115*j* of the second metal wiring layer along which an address signal A6 is supplied is arranged to extend in the second direction. The line 115*j* of the second metal wiring layer is connected to the gate line 106*c* via a contact 114*v*, a line 113*v* of the first metal wiring layer, and a contact 111*v*, and is then connected to the gate electrodes of the PMOS transistors Tp72 and Tp82 and the gate electrodes of the NMOS transistors Tn72 and Tn82.

The line 115*k* of the second metal wiring layer along which the reference power supply Vss is supplied is arranged to extend in the second direction. The line 115*k* of the second metal wiring layer is connected to the silicide layer 103, which covers the diffusion layer 102*nc*, via a contact 114*c*, a line 113*i* of the first metal wiring layer, and a contact 112*b*, and is then connected to the sources of the NMOS transistors Tn12, Tn22, Tn32, Tn42, Tn52, Tn62, Tn72, and Tn82. Note that each of the contact 114*c*, the line 113*i* of the first metal wiring layer, and the contact 112*b* is provided at a plurality of locations and the reference power supply Vss is supplied.

The arrangement and connections described above can provide eight decoders with a minimum area at a minimum pitch in both the lateral direction and the longitudinal direction.

In this exemplary embodiment, the address signal lines A1 to A6 are set to provide eight decoders. It is easy to increase the number of address signal lines to increase the number of decoders.

According to this exemplary embodiment, a plurality of decoders, each having six SGTs that constitute a 2-input NAND decoder and an inverter and that are arranged in a line in a first direction, are arranged adjacent to each other in a second direction perpendicular to the first direction, and the power supply Vcc, the reference power supply Vss, and the address signal lines (A1 to A6) are arranged to extend in the second direction. This configuration provides a semiconductor device including 2-input NAND decoders and inverters with a minimum area, which can be arranged at a minimum pitch in both the first direction and the second direction, without using any extra lines or contact regions.

Equivalent Circuit Applicable to Exemplary Embodiment of Present Invention

Figure 8:
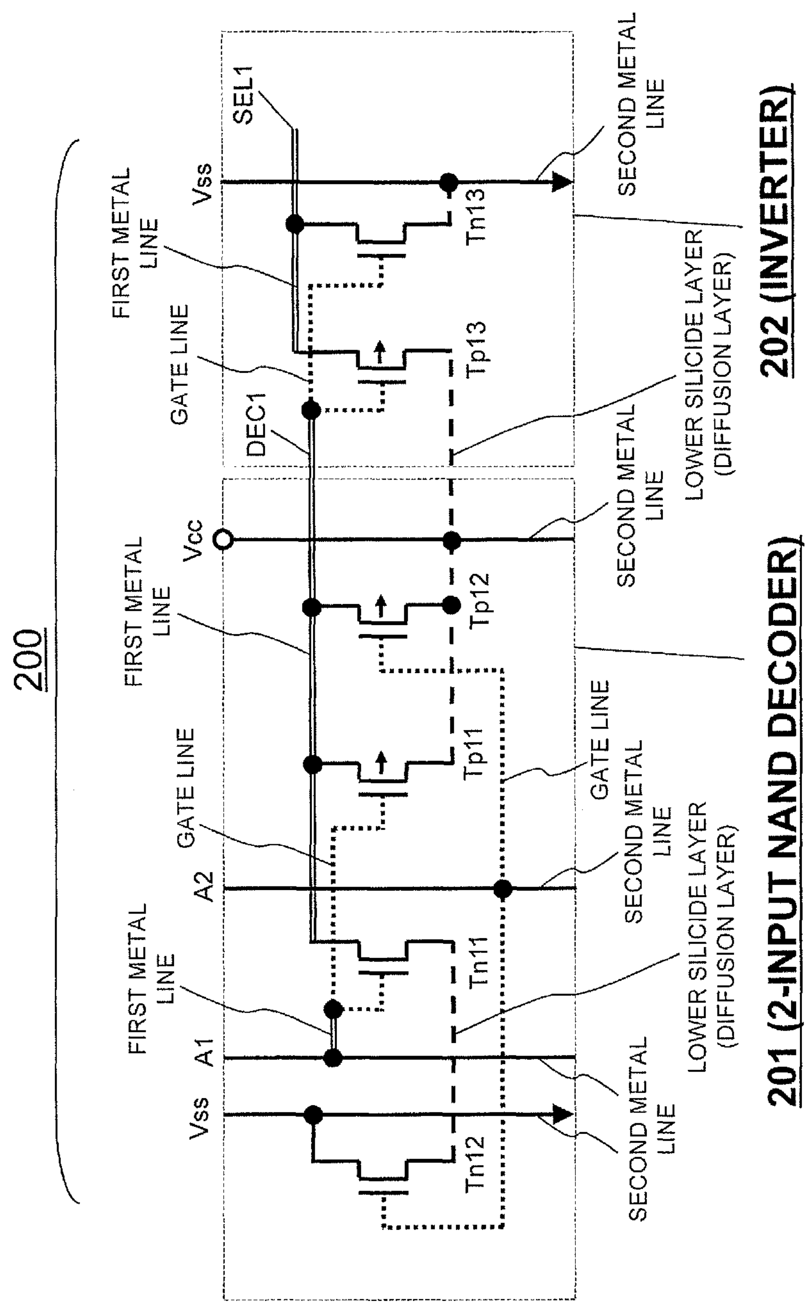
FIG. 8 is an equivalent circuit diagram illustrating a decoder according to a third exemplary embodiment of the present invention.

FIG. 8 illustrates an equivalent circuit diagram of a 2-input NAND decoder and an inverter according to another exemplary embodiment of the present invention. This exemplary embodiment is different from the first exemplary embodiment and the second exemplary embodiment described above in that the PMOS transistors Tp11, Tp12, and Tp13 and the NMOS transistors Tn11, Tn12, and Tn13 are arranged so that their sources and drains are oriented upside-down. Accordingly, the lines connecting the drains, sources, and gates of the transistors differ. In FIG. 8, the types of the lines are indicated to clearly identify how the lines are provided.

In FIG. 8, reference numerals Tp11, Tp12, and Tp13 denote PMOS transistors formed of SGTs, and reference numerals Tn11, Tn12, and Tn13 denote NMOS transistors formed of SGTs. The sources of the PMOS transistors Tp11 and Tp12 serve as a lower diffusion layer, and are connected to lines of a first metal wiring layer via lines of a silicide layer. The sources of the PMOS transistors Tp11 and Tp12 are further connected to lines of a second metal wiring layer to which a power supply Vcc is supplied. The drains of the PMOS transistors Tp11 and Tp12 and the drain of the NMOS transistor Tn11 are connected in common to an output line DEC1 formed of a line of the first metal wiring layer. The source of the NMOS transistor Tn11 is connected to the drain of the NMOS transistor Tn12 via a lower diffusion layer and a silicide layer, and the source of the NMOS transistor Tn12 is connected to a line of the second metal wiring layer to which a reference power supply Vss is supplied. An address signal line A1 is connected to the gate of the PMOS transistor Tp11 and the gate of the NMOS transistor Tn11 via a line of the second metal wiring layer, a line of the first metal wiring layer, and a gate line, and an address signal line A2 is connected to the gate of the PMOS transistor Tp12 and the gate of the NMOS transistor Tn12 via a line of the second metal wiring layer.

Further, the drain of the PMOS transistor Tp13 and the drain of the NMOS transistor Tn13 are connected in common and are connected to a line of the first metal wiring layer to serve as an output SEL1. The power supply Vcc is supplied to the lower diffusion layer, which is the source of the PMOS transistor Tp13, via the silicide layer, and the reference power supply Vss is supplied to the lower diffusion layer, which is the source of the NMOS transistor Tn13, via a silicide layer.

Third Exemplary Embodiment

Figure 9:
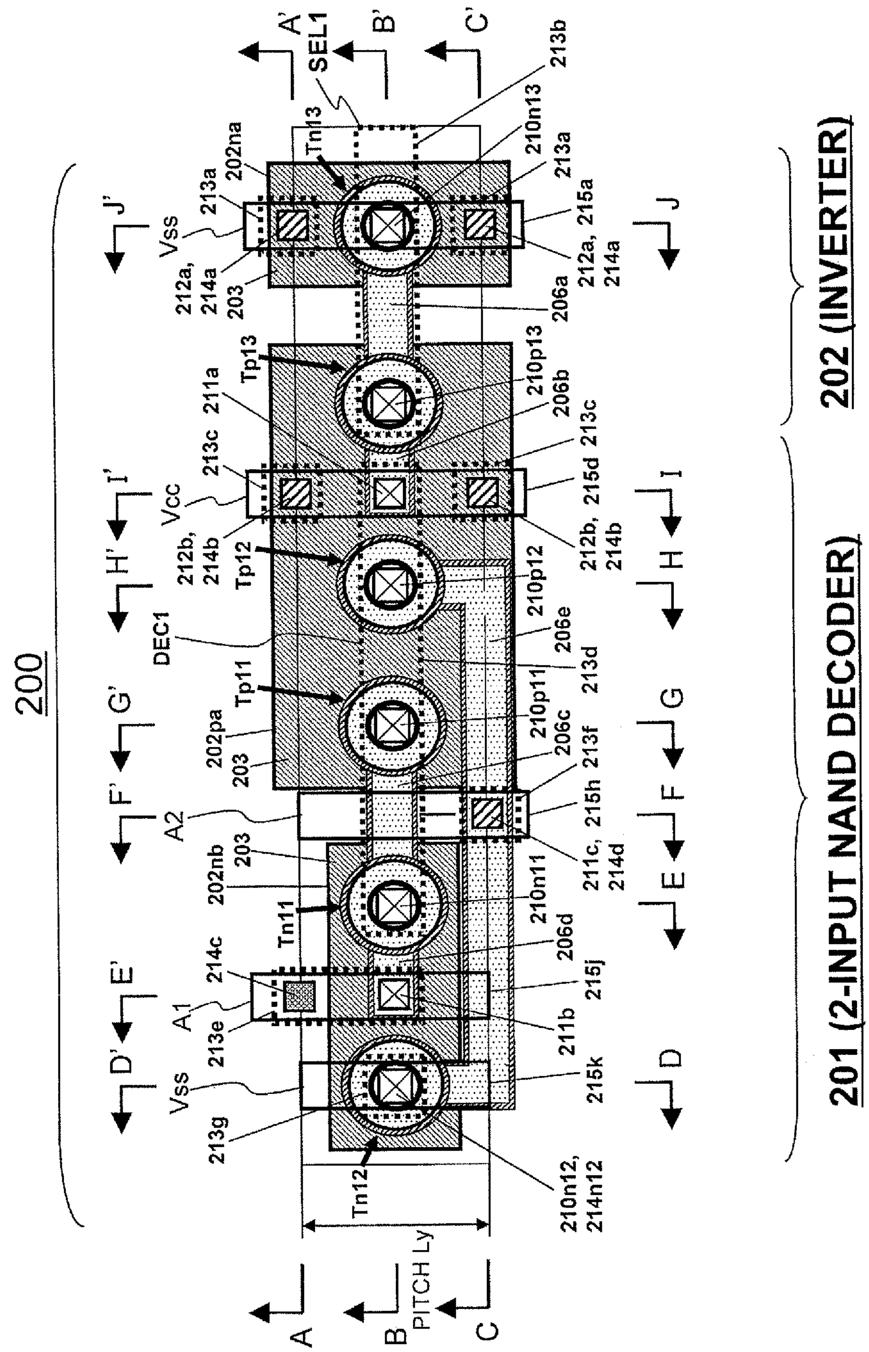
FIG. 9 is a plan view of the decoder according to the third exemplary embodiment of the present invention.
Figure 10A:
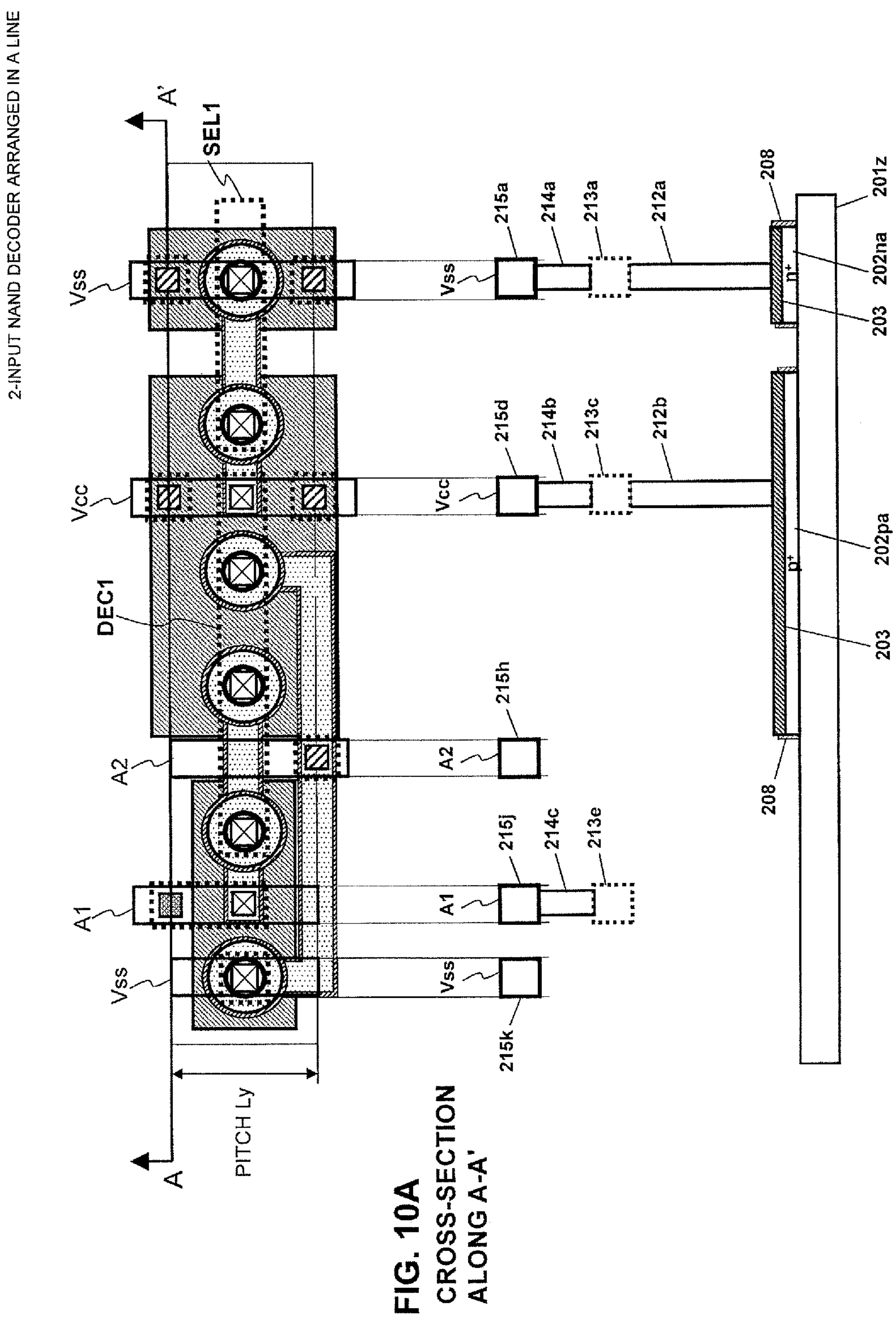
FIG. 10A is a cross-sectional view of the decoder according to the third exemplary embodiment of the present invention.
Figure 10B:
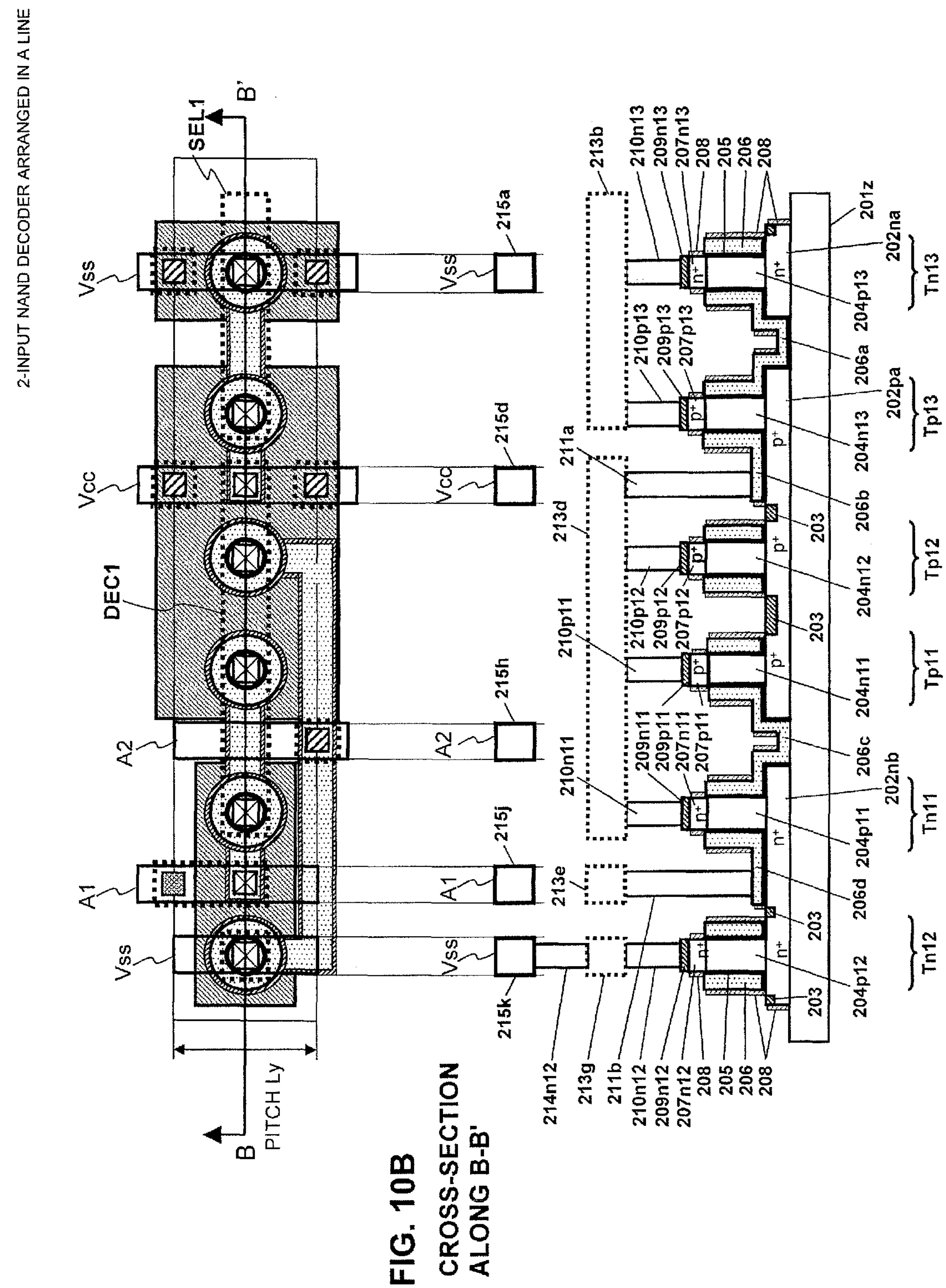
FIG. 10B is a cross-sectional view of the decoder according to the third exemplary embodiment of the present invention.
Figure 10C:
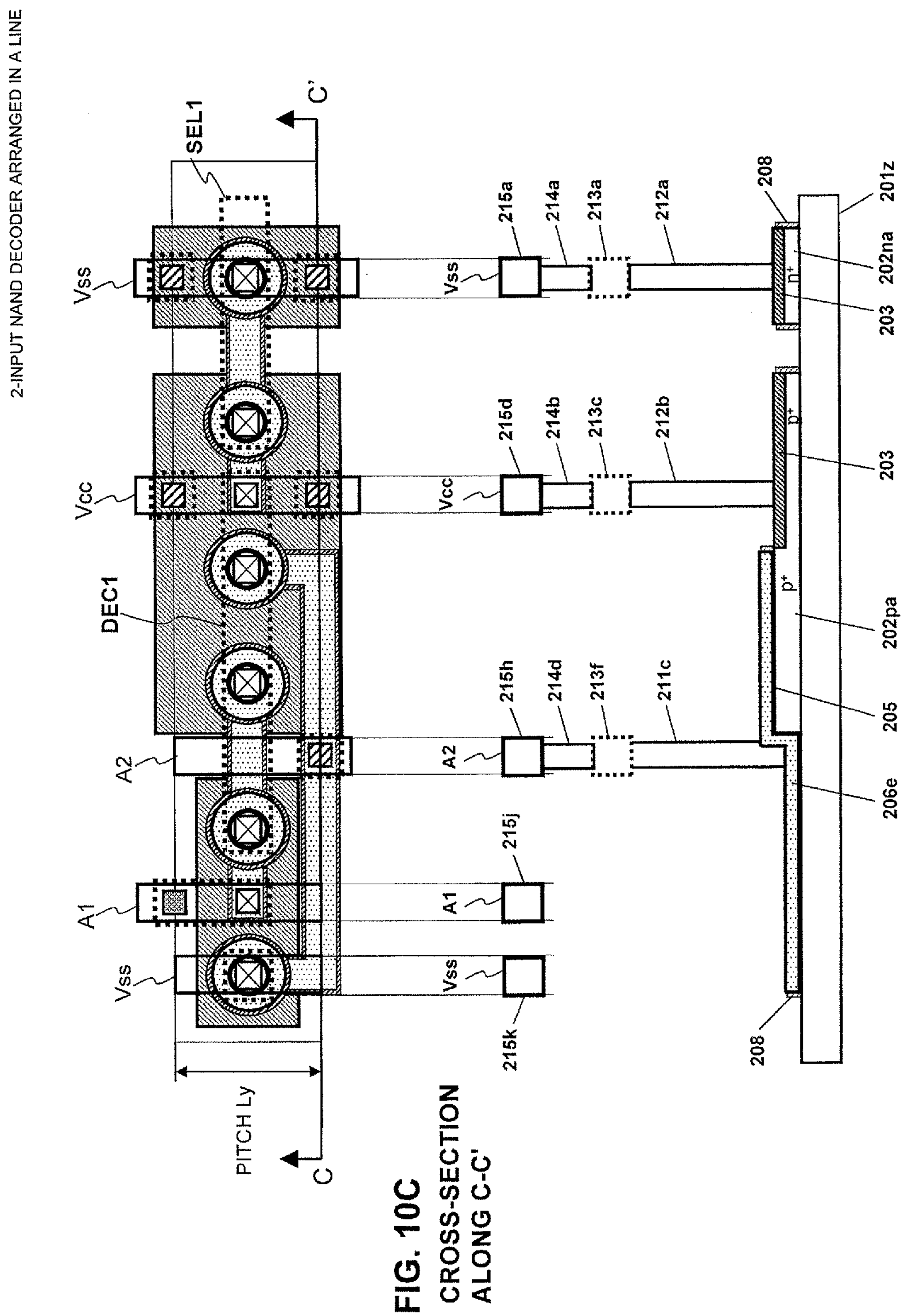
FIG. 10C is a cross-sectional view of the decoder according to the third exemplary embodiment of the present invention.
Figure 10D:
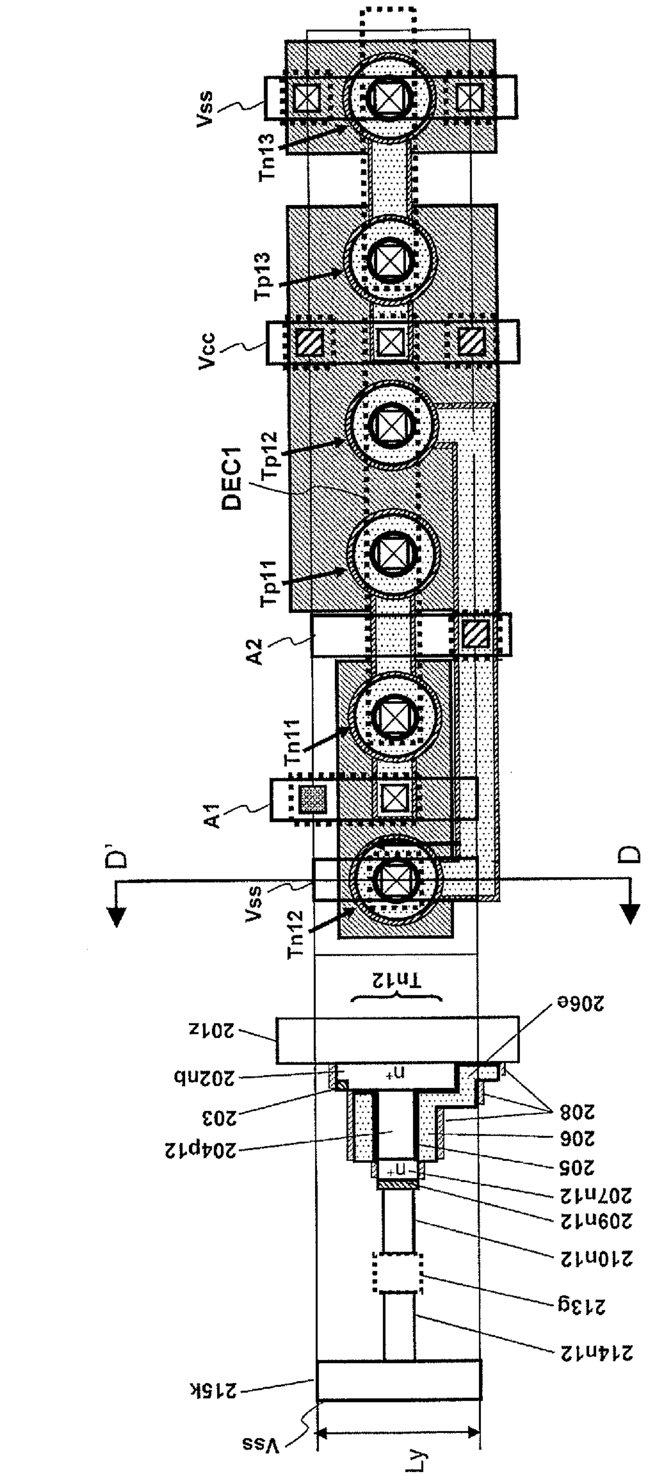
FIG. 10D is a cross-sectional view of the decoder according to the third exemplary embodiment of the present invention.
Figure 10E:
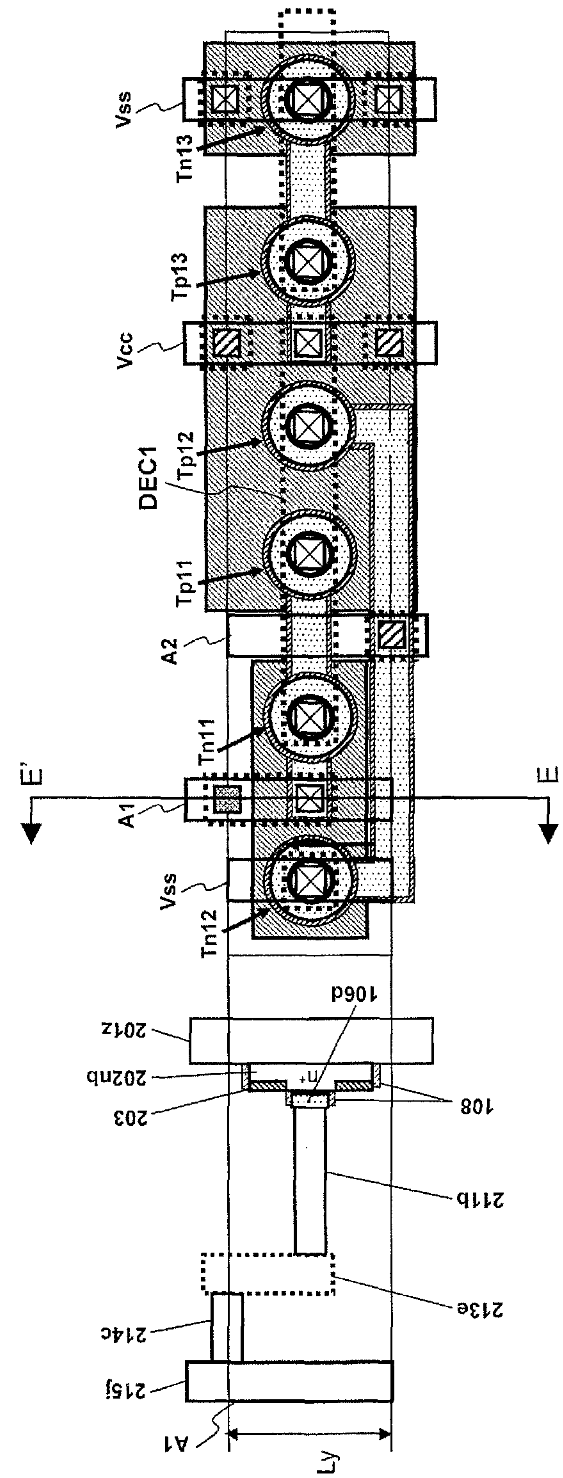
FIG. 10E is a cross-sectional view of the decoder according to the third exemplary embodiment of the present invention.
Figure 10F:
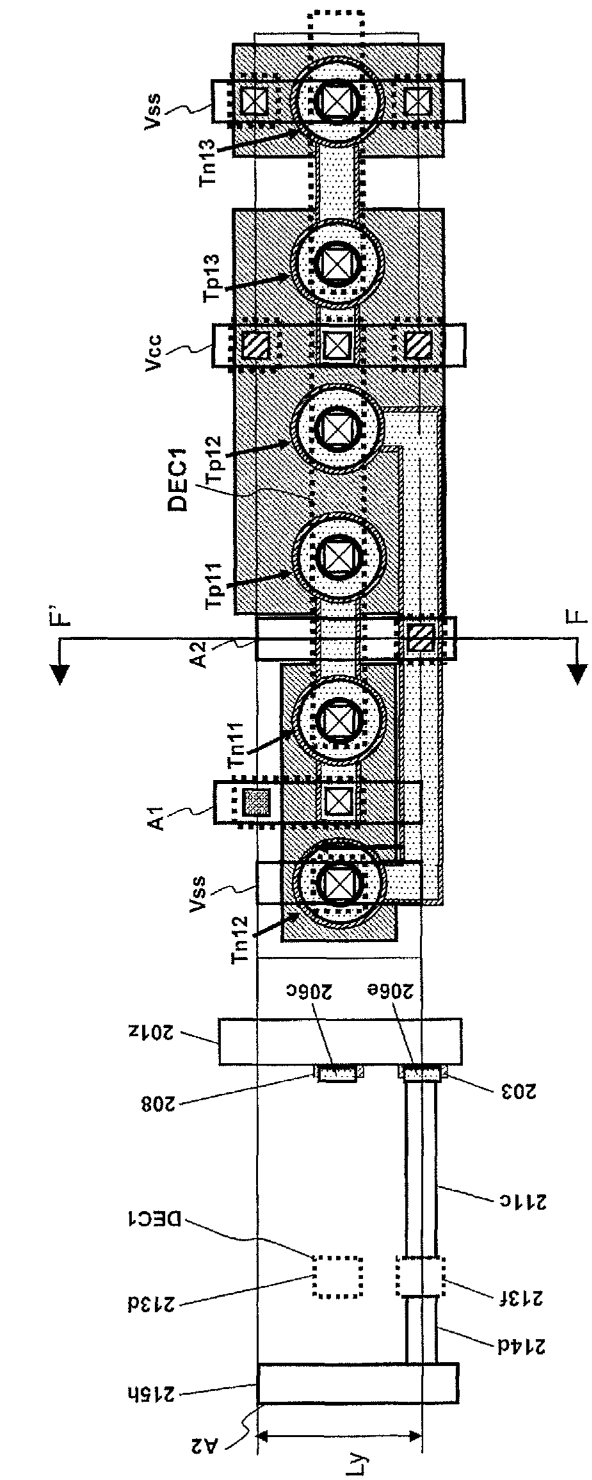
FIG. 10F is a cross-sectional view of the decoder according to the third exemplary embodiment of the present invention.
Figure 10G:
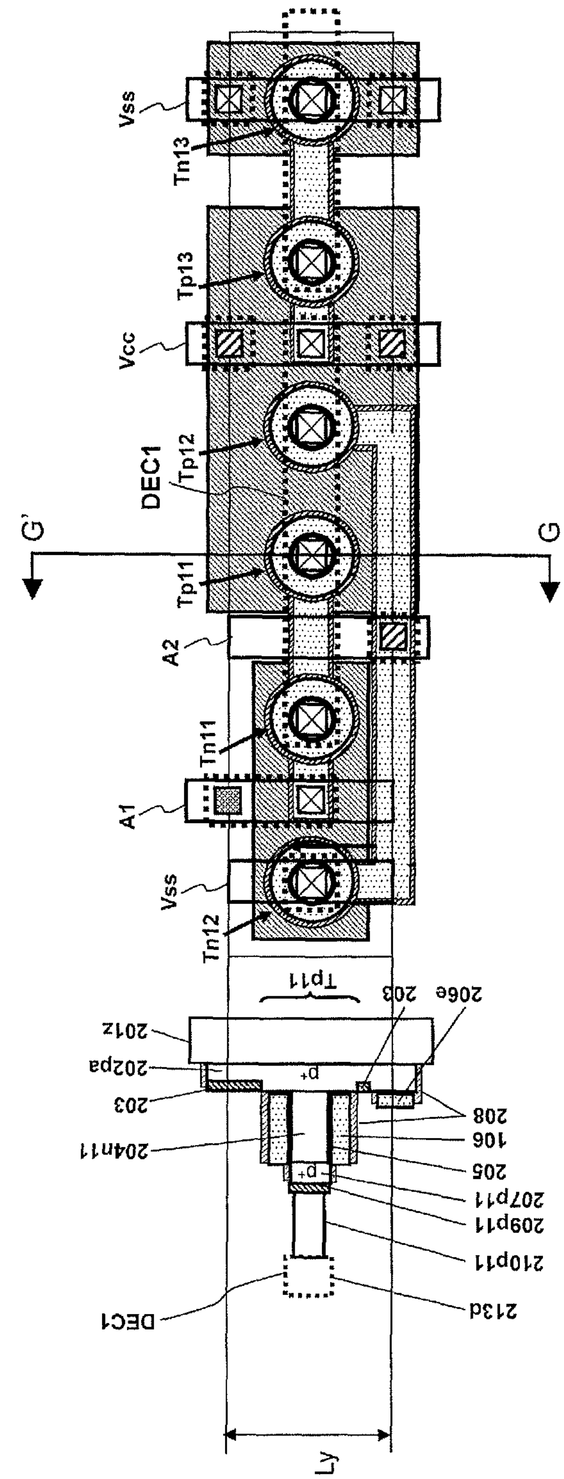
FIG. 10G is a cross-sectional view of the decoder according to the third exemplary embodiment of the present invention.
Figure 10H:
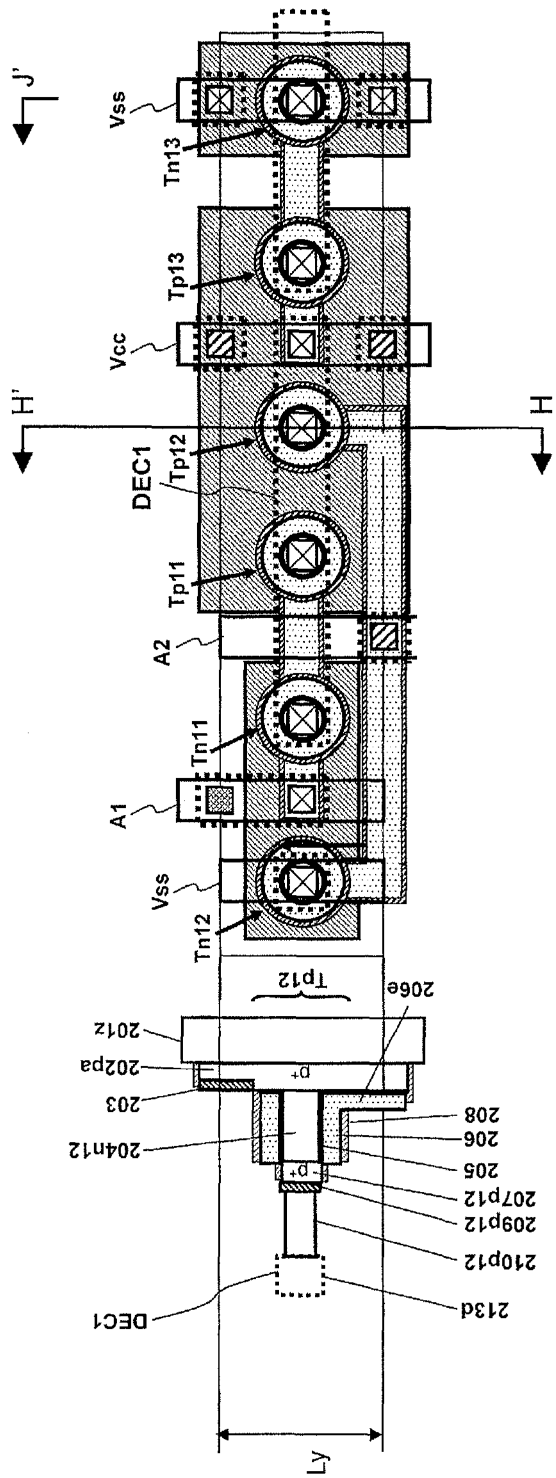
FIG. 10H is a cross-sectional view of the decoder according to the third exemplary embodiment of the present invention.
Figure 10I:
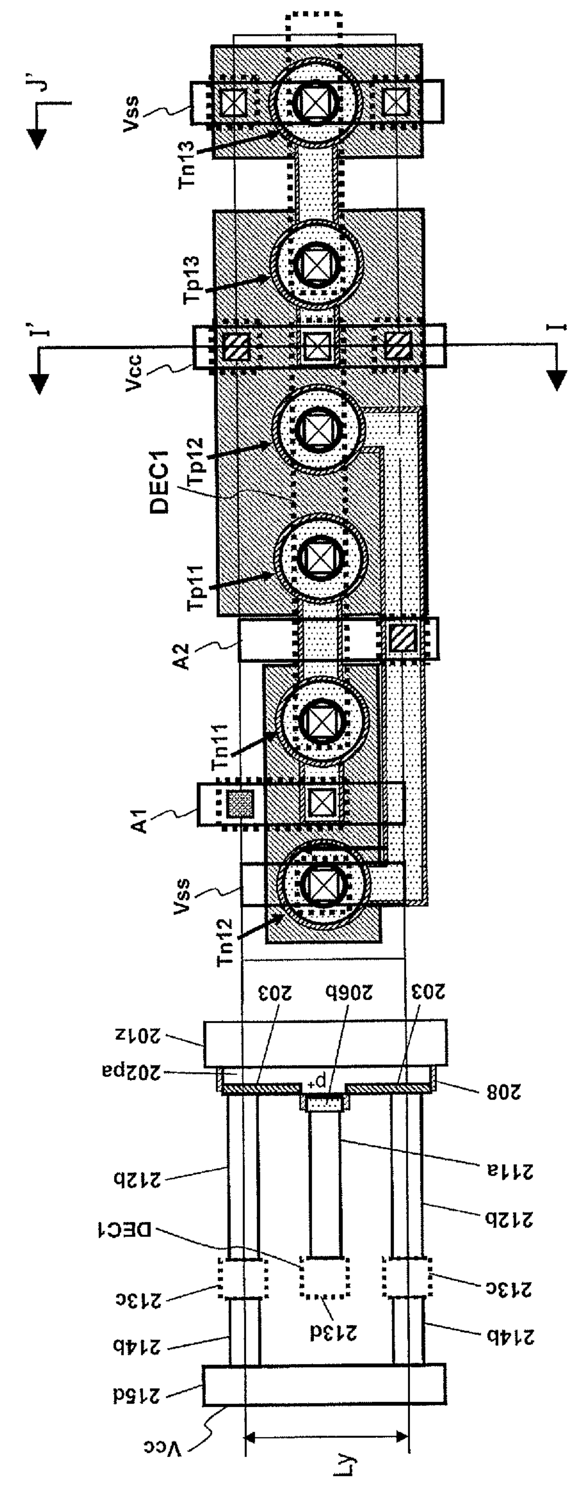
FIG. 10I is a cross-sectional view of the decoder according to the third exemplary embodiment of the present invention.
Figure 10J:
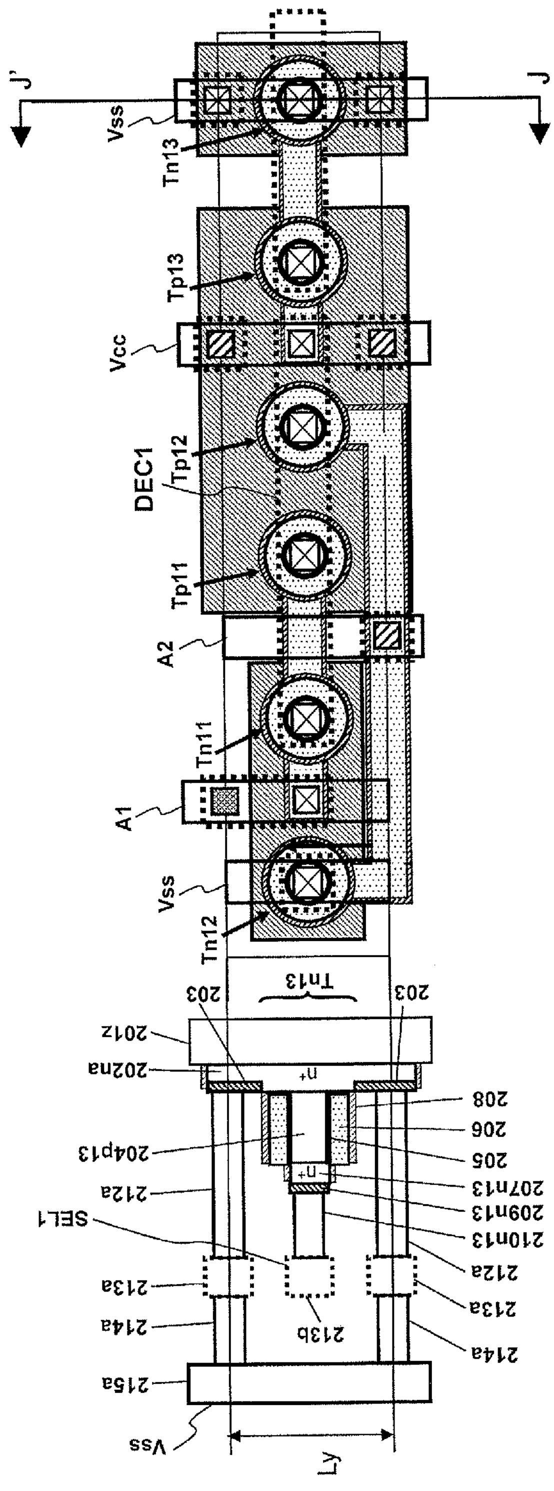
FIG. 10J is a cross-sectional view of the decoder according to the third exemplary embodiment of the present invention.

FIG. 9 and FIGS. 10A to 10J illustrate a third exemplary embodiment as an exemplary embodiment in which the equivalent circuit illustrated in FIG. 8 is applied to the present invention. FIG. 9 is a plan view of the layout (arrangement) of a 2-input NAND decoder and an inverter according to the third exemplary embodiment of the present invention. FIG. 10A is a cross-sectional view taken along the cut-line A-A' in FIG. 9, FIG. 10B is a cross-sectional view taken along the cut-line B-B' in FIG. 9, FIG. 10C is a cross-sectional view taken along the cut-line C-C' in FIG. 9, FIG. 10D is a cross-sectional view taken along the cut-line D-D' in FIG. 9, FIG. 10E is a cross-sectional view taken along the cut-line E-E' in FIG. 9, FIG. 10F is a cross-sectional view taken along the cut-line F-F' in FIG. 9, FIG. 10G is a cross-sectional view taken along the cut-line G-G' in FIG. 9, FIG. 10H is a cross-sectional view taken along the cut-line H-H' in FIG. 9, FIG. 10I is a cross-sectional view taken along the cut-line I-I' in FIG. 9, and FIG. 10J is a cross-sectional view taken along the cut-line J-J' in FIG. 9.

In FIG. 9 and FIGS. 10A to 10J, portions having the same or substantially the same structures as those illustrated in FIGS. 2A and 2B and FIGS. 3A to 3H are denoted by equivalent reference numerals in the 200s.

In FIG. 9, the transistors constituting a decoder 201 and an inverter 202 illustrated in FIG. 8, namely, the NMOS transistor Tn13, the PMOS transistors Tp13, Tp12, and Tp11, and the NMOS transistors Tn11 and Tn12, are arranged in a line in a lateral direction (defined as a "first direction") from right to left in this figure.

Further provided in a longitudinal direction (defined as a "second direction perpendicular to the first direction") in the figure are lines 215*a*, 215*d*, 215*h*, 215*j*, and 215*k* of a second metal wiring layer described below. The lines 215*a*, 215*d*, 215*h*, 215*j*, and 215*k* are arranged to extend in the longitudinal direction (the second direction) and respectively form a reference power supply Vss, a power supply Vcc, an address signal line A2, an address signal line A1, and a reference power supply Vss.

Planar silicon layers 202*na*, 202*pa*, and 202*nb* are formed on top of an insulating film such as a buried oxide (BOX) film layer 201*z* disposed on a substrate. The planar silicon layers 202*na*, 202*pa*, and 202*nb* are formed as an n+ diffusion layer, a p+ diffusion layer, and an n+ diffusion layer, respectively, through impurity implantation or the like. Reference numeral 203 denotes a silicide layer disposed on surfaces of the planar silicon layers (202*na*, 202*pa*, and 202*nb*). Reference numerals 204*n*11, 204*n*12, and 204*n*13 denote n-type silicon pillars, and reference numerals 204*p*11, 204*p*12, and 204*p*13 denote p-type silicon pillars. Reference numeral 205 denotes a gate insulating film that surrounds the silicon pillars 204*n*11, 204*n*12, 204*n*13, 204*p*11, 204*p*12, and 204*p*13. Reference numeral 206 denotes a gate electrode, and reference numerals 206*a*, 206*b*, 206*c*, 206*d*, and 206*e* denote gate lines. The gate insulating film 205 is also formed to underlie the gate electrode 206 and the gate lines 206*a*, 206*b*, 206*c*, 206*d*, and 206*e*.

In top portions of the silicon pillars 204*n*11, 204*n*12, and 204*n*13, p+ diffusion layers 207*p*11, 207*p*12, and 207*p*13 are respectively formed through impurity implantation or the like. In top portions of the silicon pillars 204*p*11, 204*p*12, and 204*p*13, n+ diffusion layers 207*n*11, 207*n*12, and 207*n*13 are respectively formed through impurity implantation or the like. Reference numeral 208 denotes a silicon nitride film for protecting the gate insulating film 205, and reference numerals 209*p*11, 209*p*12, 209*p*13, 209*n*11, 209*n*12, and 209*n*13 denote silicide layers to be respectively connected to the p+ diffusion layers 207*p*11, 207*p*12, and 207*p*13 and the n+ diffusion layers 207*n*11, 207*n*12, and 207*n*13.

Reference numerals 210*p*11, 210*p*12, 210*p*13, 210*n*11, 210*n*12, and 210*n*13 denote contacts that respectively connect the silicide layers 209*p*11, 209*p*12, 209*p*13, 209*n*11, 209*n*12, and 209*n*13 to the lines 213*d*, 213*d*, 213*b*, 213*d*, 213*g*, and 213*b* of the first metal wiring layer. Reference numeral 211*a* denotes a contact that connects the gate line 206*b* to the line 213*d* of the first metal wiring layer, reference numeral 211*b* denotes a contact that connects the gate line 206*d* to a line 213*e* of the first metal wiring layer, and reference numeral 211*c* denotes a contact that connects the gate line 206*e* to a line 213*f* of the first metal wiring layer. Reference numeral 212*a* denotes a contact that connects the silicide layer 203 connected to the n+ diffusion layer 202*na* to a line 213*a* of the first metal wiring layer, and reference numeral 212*b* denotes a contact that connects the silicide layer 203 connected to the p+ diffusion layer 202*pa* to a line 213*c* of the first metal wiring layer.

Reference numeral 214*a* denotes a contact that connects the line 213*a* of the first metal wiring layer to the line 215*a* of the second metal wiring layer, reference numeral 214*b* denotes a contact that connects the line 213*c* of the first metal wiring layer to the line 215*d* of the second metal wiring layer, reference numeral 214*c* denotes a contact that connects the line 213*e* of the first metal wiring layer to the line 215*j* of the second metal wiring layer, reference numeral 214*d* denotes a contact that connects the line 213*f* of the first metal wiring layer to the line 215*h* of the second metal wiring layer, and reference numeral 214*n*12 denotes a contact that connects the line 213*g* of the first metal wiring layer to the line 215*k* of the second metal wiring layer.

The silicon pillar 204*n*11, the lower diffusion layer 202*pa*, the upper diffusion layer 207*p*11, the gate insulating film 205, and the gate electrode 206 constitute the PMOS transistor Tp11. The silicon pillar 204*n*12, the lower diffusion layer 202*pa*, the upper diffusion layer 207*p*12, the gate insulating film 205, and the gate electrode 206 constitute the PMOS transistor Tp12. The silicon pillar 204*n*13, the lower diffusion layer 202*pa*, the upper diffusion layer 207*p*13, the gate insulating film 205, and the gate electrode 206 constitute the PMOS transistor Tp13. The silicon pillar 204*p*11, the lower diffusion layer 202*nb*, the upper diffusion layer 207*n*11, the gate insulating film 205, and the gate electrode 206 constitute the NMOS transistor Tn11. The silicon pillar 204*p*12, the lower diffusion layer 202*nb*, the upper diffusion layer 207*n*12, the gate insulating film 205, and the gate electrode 206 constitute the NMOS transistor Tn12. The silicon pillar 204*p*13, the lower diffusion layer 202*na*, the upper diffusion layer 207*n*13, the gate insulating film 205, and the gate electrode 206 constitute the NMOS transistor Tn13.

Further, the gate line 206*c* is connected to the gate electrode 206 of the PMOS transistor Tp11 and the gate electrode 206 of the NMOS transistor Tn11, and the gate line 206*d* is further connected to the gate electrode 206 of the NMOS transistor Tn11. The gate line 206*e* is connected to the gate electrode 206 of the PMOS transistor Tp12 and the gate electrode 206 of the NMOS transistor Tn12. The gate line 206*a* is connected in common to the gate electrode 206 of the PMOS transistor Tp13 and the gate electrode 206 of the NMOS transistor Tn13, and the gate line 206*b* is further connected to the gate electrode 206 of the PMOS transistor Tp13.

The p+ diffusion layer 207*p*11, which is the drain of the PMOS transistor Tp11, the p+ diffusion layer 207*p*12, which is the drain of the PMOS transistor Tp12, and the n+ diffusion layer 207*n*11, which is the drain of the NMOS transistor Tn11, are connected in common via the line 213*d* of the first metal wiring layer to serve as an output line DEC1. The lower diffusion layer 202*pa*, which is the sources of the PMOS transistor Tp11, the PMOS transistor Tp12, and the PMOS transistor Tp13, is connected in common by using the silicide layer 203. The silicide layer 203 is connected to the line 215*d* of the second metal wiring layer via the contact 212*b*, the line 213*c* of the first metal wiring layer, and the contact 214*b*, and the power supply Vcc is supplied to the line 215*d* of the second metal wiring layer. In FIG. 9 and FIGS. 10A to 10J, the contact 212*b*, the line 213*c* of the first metal wiring layer, and the contact 214*b* are placed in each of two, upper and lower portions.

The lower diffusion layer 202*nb*, which is the source of the NMOS transistor Tn11, is connected to the drain of the NMOS transistor Tn12 via the silicide layer 203. The upper diffusion layer 207*n*12, which is the source of the NMOS transistor Tn12, is connected to the line 215*k* of the second metal wiring layer via the silicide layer 209*n*12, the contact 110*n*12, the line 213*g* of the first metal wiring layer, and the contact 214*n*12. The reference power supply Vss is supplied to the line 215*k* of the second metal wiring layer.

The upper diffusion layer 207*p*13, which is the drain of the PMOS transistor Tp13, and the upper diffusion layer 207*n*13, which is the drain of the NMOS transistor Tn13, are connected in common to the line 213*b* of the first metal wiring layer via the contacts 210*p*13 and 210*n*13, respectively, to serve as an output SEL1.

The lower diffusion layer 202*na*, which is the source of the NMOS transistor Tn13, is connected to the line 215*a* of the second metal wiring layer via the silicide layer 203, the contact 212*a*, the line 213*a* of the first metal wiring layer, and the contact 214*a*, and the reference power supply Vss is supplied to the line 215*a* of the second metal wiring layer. In FIG. 9 and FIGS. 10A to 10J, the contact 212*a*, the line 213*a* of the first metal wiring layer, and the contact 214*a* are placed in each of two, upper and lower portions.

The line 215*j* of the second metal wiring layer is supplied with an address signal A1. The line 215*j* is connected to the line 213*e* of the first metal wiring layer, which is arranged to extend, via the contact 214*c*. The line 215*j* is further connected to the gate line 206*d* via the contact 211*b* and accordingly the address signal A1 is supplied to the gate electrode of the NMOS transistor Tn11. The address signal A1 is also supplied to the gate electrode of the PMOS transistor Tp11 via the gate line 206*c*.

The line 215*h* of the second metal wiring layer is supplied with an address signal A2. The line 215*h* of the second metal wiring layer is further connected to the gate line 206*e* via the contact 214*d*, the line 213*f* of the first metal wiring layer, and the contact 211*c*, and accordingly the address signal A2 is supplied to the gate electrode of the PMOS transistor Tp12 and the gate electrode of the NMOS transistor Tn12.

It is to be noted that, in FIG. 9, a size in the longitudinal direction (the second direction) is a minimum processing size determined by the size of an SGT, a margin between an SGT and a lower diffusion layer, and an interval between diffusion layers, and is defined as Ly. That is, a plurality of decoders 200 can be arranged vertically adjacent to one another in an inverted configuration at a minimum pitch (minimum interval) Ly.

According to this exemplary embodiment, six SGTs constituting a 2-input NAND circuit and an inverter are arranged in a line in a first direction, the source regions of the PMOS transistors Tp11, Tp12, and Tp13 are connected in common by using the lower diffusion layer (202*pa*) and the silicide layer 203, the source region of the NMOS transistor Tn11 and the drain region of the NMOS transistor Tn12 are connected in common by using the lower diffusion layer (202*nb*) and the silicide layer 203, and the power supply Vcc, the reference power supply Vss, and the address signal lines A1 and A2 are arranged to extend in a second direction perpendicular to the first direction. This configuration provides a semiconductor device including a 2-input NAND decoder and an inverter with a minimum area without using any extra lines or contact regions.

Equivalent Circuit Applicable to Exemplary Embodiment of Present Invention

Figure 11A:
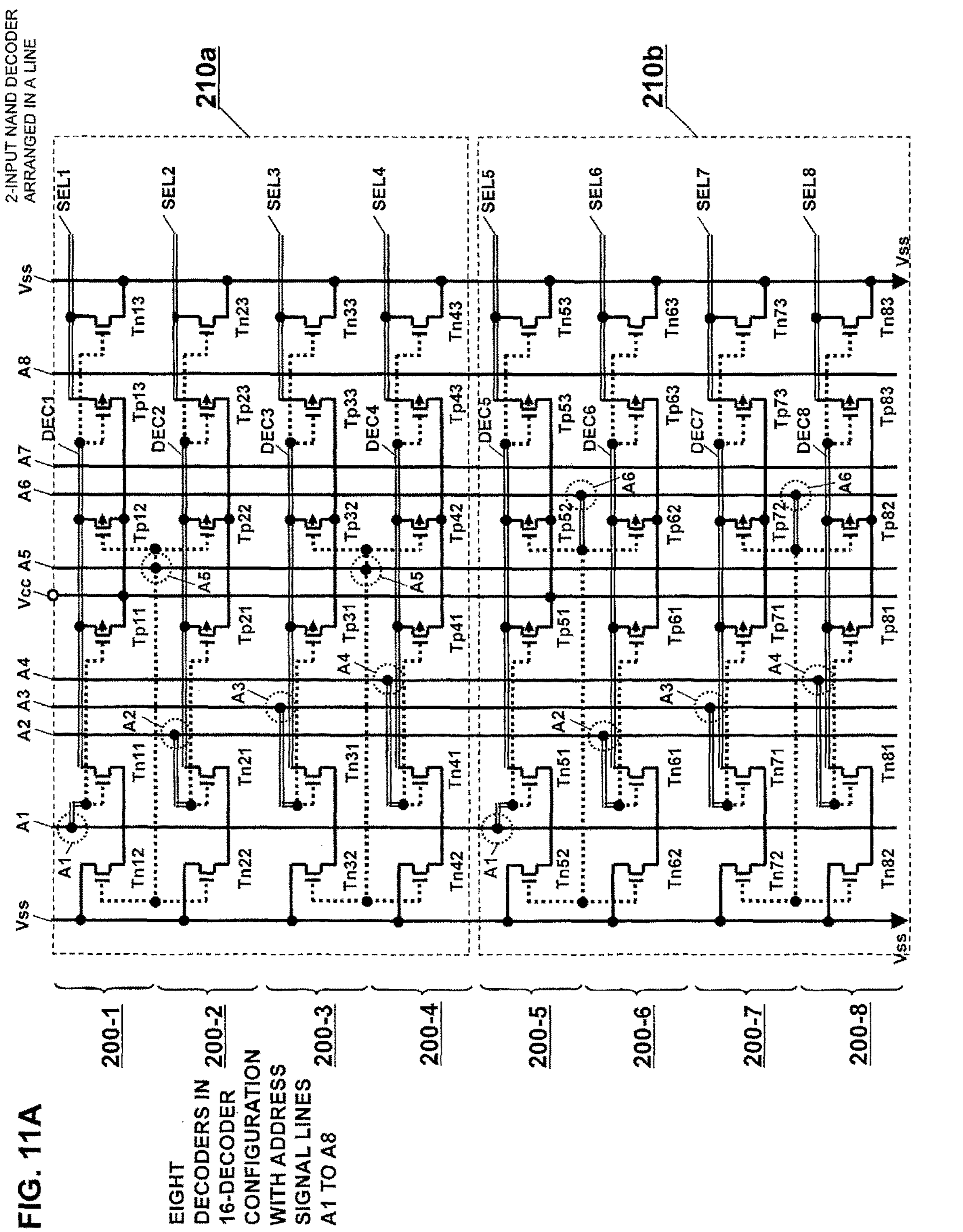
FIG. 11A is an equivalent circuit diagram illustrating a decoder according to a fourth exemplary embodiment of the present invention.
Figure 11B:
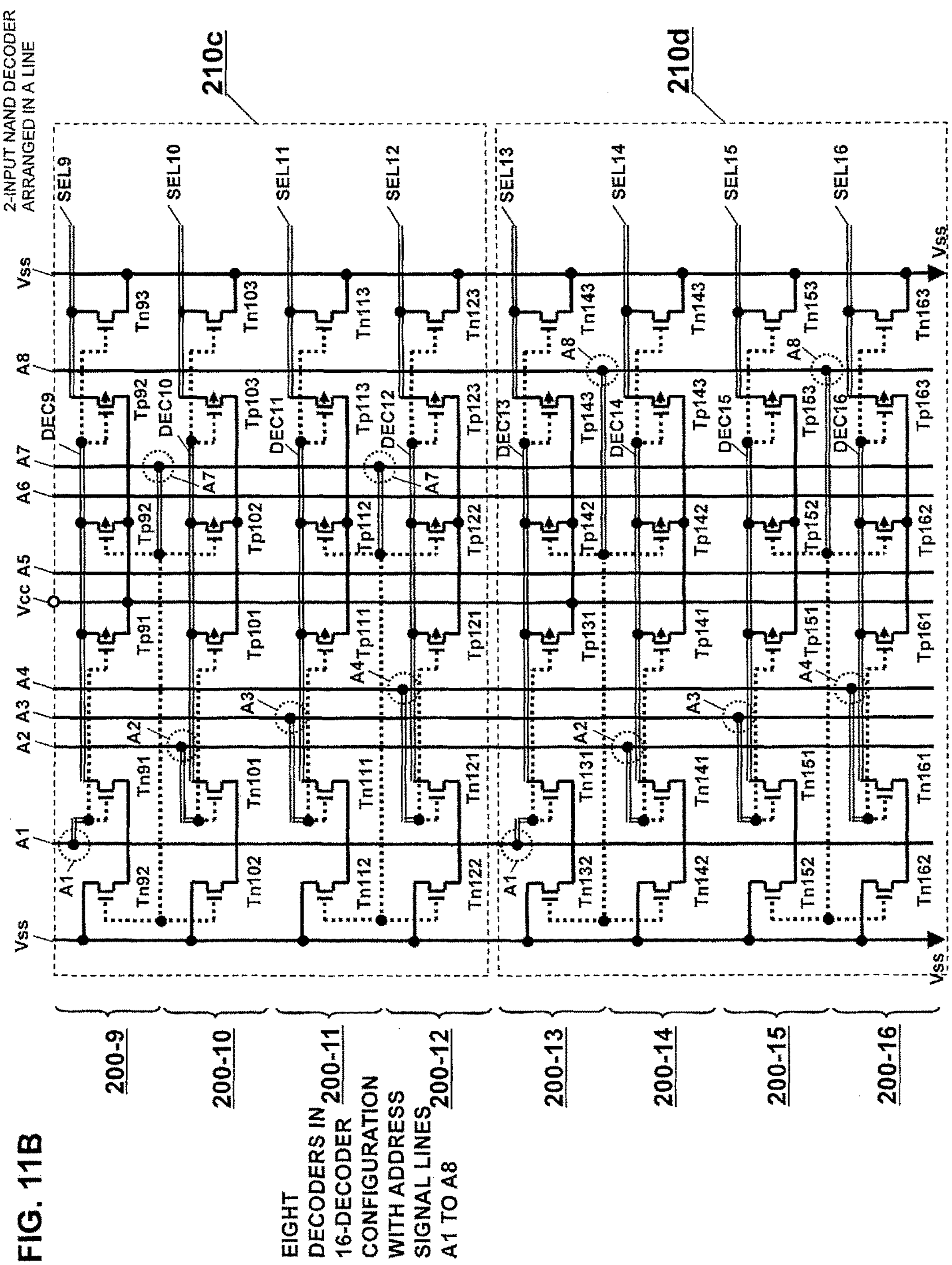
FIG. 11B is an equivalent circuit diagram illustrating the decoder according to the fourth exemplary embodiment of the present invention.

FIGS. 11A and 11B illustrate an equivalent circuit diagram of decoders, each constructed by arranging a plurality of 2-input NAND decoders and a plurality of inverters applicable to the present invention.

Eight address signals A1, A2, A3, A4, A5, A6, A7, and A8 are provided, in which the address signal lines A1 to A4 are selectively connected to the gate of the PMOS transistor Tp11 and the gate of the NMOS transistor Tn11, and the address signal lines A5 to A8 are selectively connected to the gate of the PMOS transistor Tp12 and the gate of the NMOS transistor Tn12. Sixteen decoders 200-1 to 200-16 are formed by using the eight address signal lines A1 to A8. The address signal lines A1 and A5 are connected to the decoder 200-1. The address signal lines A2 and A5 are connected to the decoder 200-2. The address signal lines A3 and A5 are connected to the decoder 200-3. The address signal lines A4 and A5 are connected to the decoder 200-4. The address signal lines A1 and A6 are connected to the decoder 200-5. The address signal lines A2 and A6 are connected to the decoder 200-6. The address signal lines A3 and A6 are connected to the decoder 200-7. The address signal lines A4 and A6 are connected to the decoder 200-8. The address signal lines A1 and A7 are connected to the decoder 200-9. The address signal lines A2 and A7 are connected to the decoder 200-10. The address signal lines A3 and A7 are connected to the decoder 200-11. The address signal lines A4 and A7 are connected to the decoder 200-12. The address signal lines A1 and A8 are connected to the decoder 200-13. The address signal lines A2 and A8 are connected to the decoder 200-14. The address signal lines A3 and A8 are connected to the decoder 200-15. The address signal lines A4 and A8 are connected to the decoder 200-16.

Portions at which address signal lines are connected are indicated by the broken-line circles.

As illustrated in a fourth exemplary embodiment described below, in FIG. 11A, the address signal line A5 is connected in common to the decoders 200-1 and 200-2 and is also connected in common to the decoders 200-3 and 200-4. The address signal line A6 is connected in common to the decoders 200-5 and 200-6 and is also connected in common to the decoders 200-7 and 200-8. Further, in FIG. 11B, the address signal A7 is connected in common to the decoders 200-9 and 200-10 and is also connected in common to the decoders 200-11 and 200-12. The address signal line A8 is connected in common to the decoders 200-13 and 200-14 and is also connected in common to the decoders 200-15 and 200-16.

In FIGS. 11A and 11B, as described in detail below, the address signal lines A1 to A4 are temporarily connected to lines of a first metal wiring layer through lines of a second metal wiring layer arranged to extend in the longitudinal direction (the second direction), and are then connected to gate lines. The address signal lines A5, A6, A7, and A8 are also temporarily connected to lines of the first metal wiring layer through lines of the second metal wiring layer arranged to extend in the longitudinal direction (the second direction), and are then connected to gate lines.

FIG. 12 illustrates an address map of the sixteen decoders illustrated in FIGS. 11A and 11B. An address signal line to be connected to each of the decoder outputs DEC1/SEL1 to DEC16/SEL16 is marked with a circle. Connections are made by using contacts, as described below.

Fourth Exemplary Embodiment

Figure 13A:
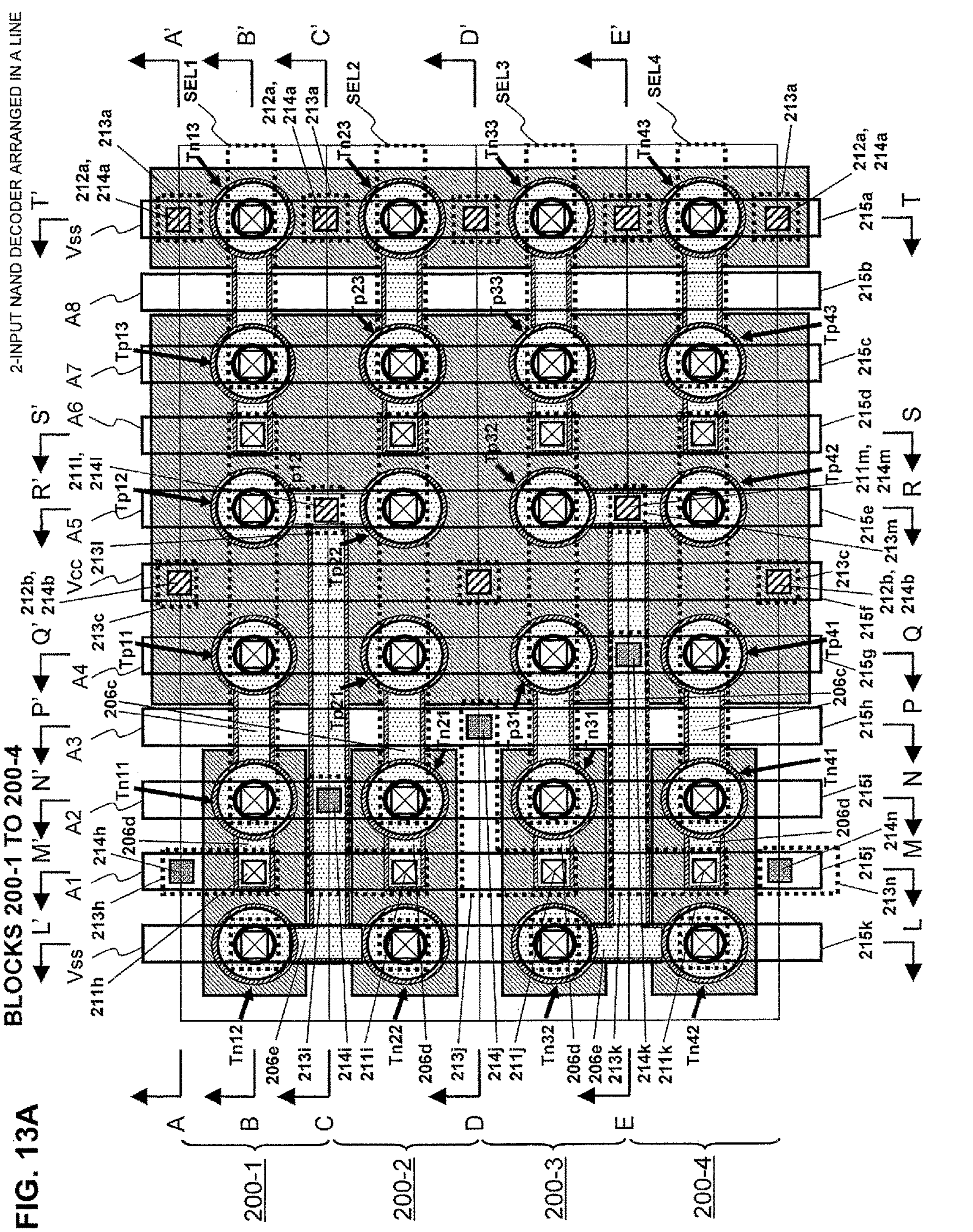
FIG. 13A is a plan view of the decoder according to the fourth exemplary embodiment of the present invention.
Figure 13C:
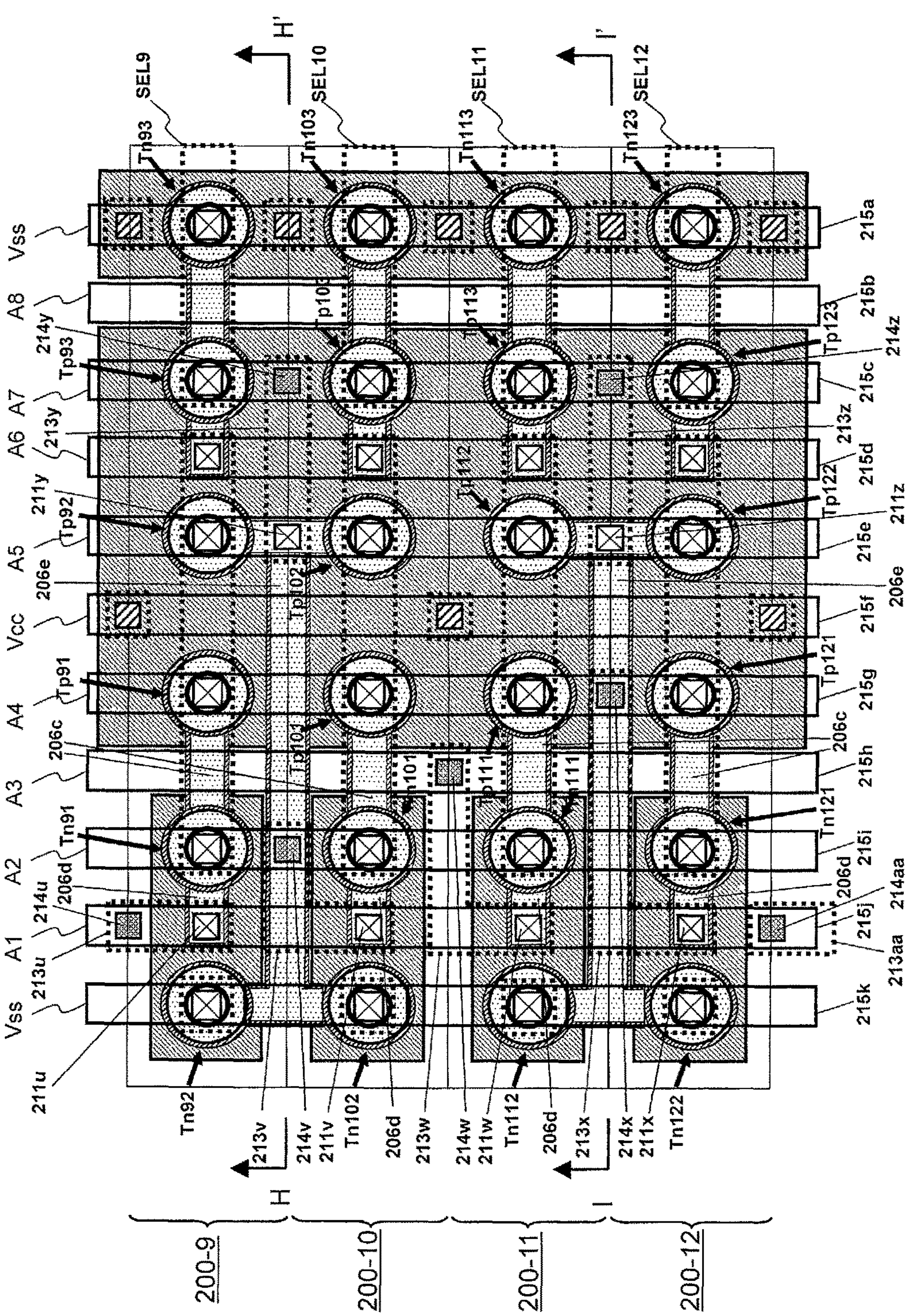
FIG. 13C is a plan view of the decoder according to the fourth exemplary embodiment of the present invention.
Figure 13D:
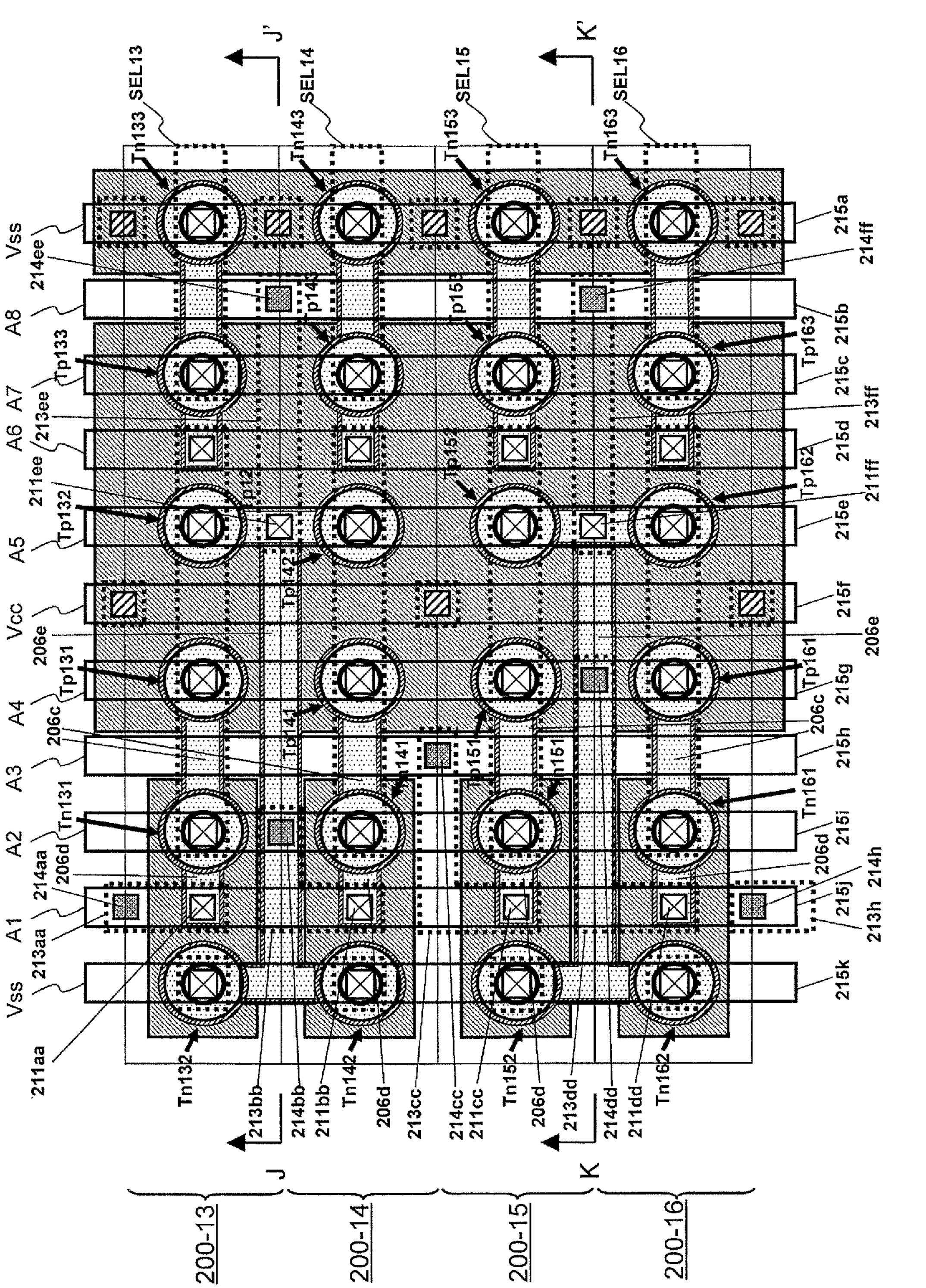
FIG. 13D is a plan view of the decoder according to the fourth exemplary embodiment of the present invention.
Figure 13E:
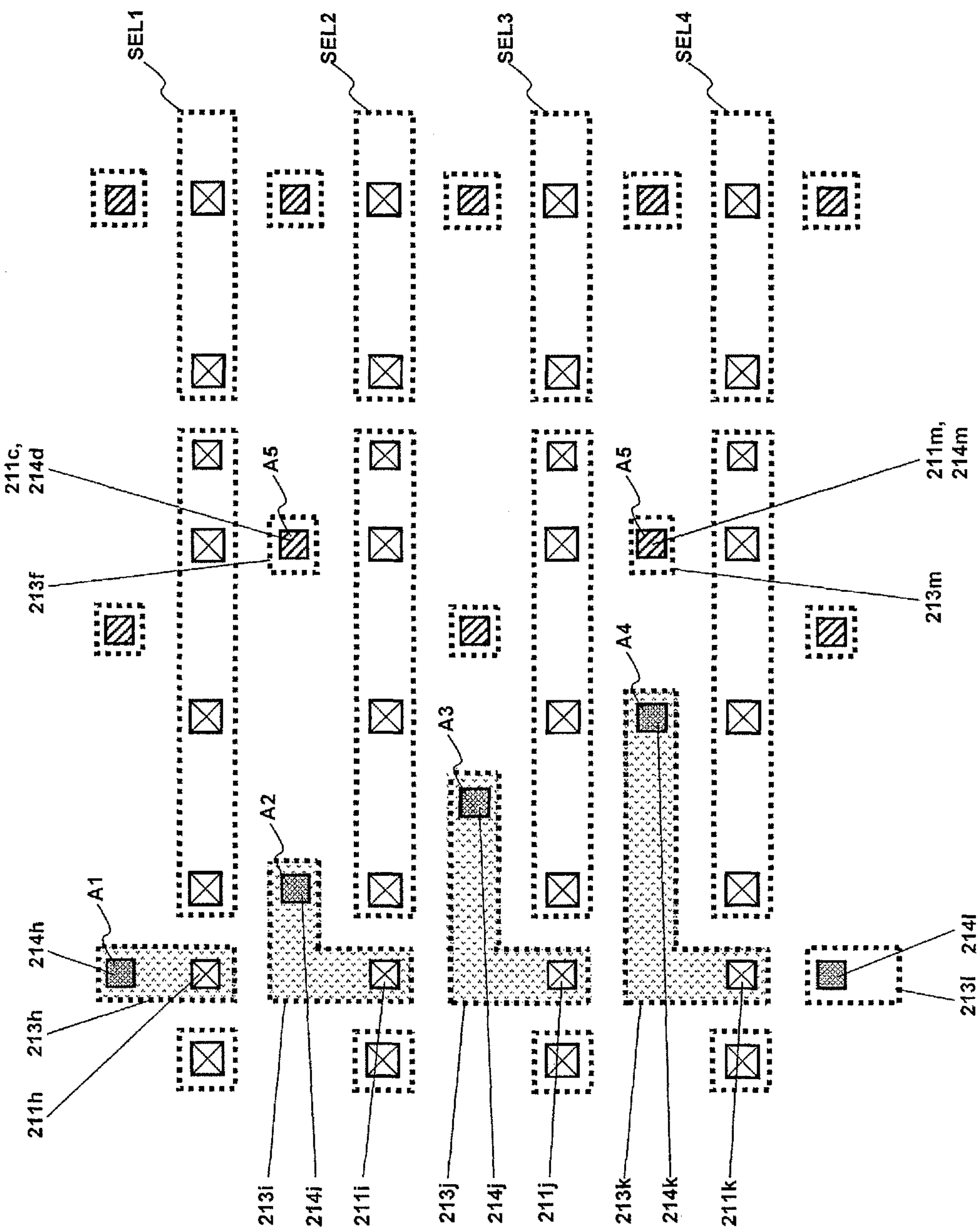
FIG. 13E is a plan view of the decoder according to the fourth exemplary embodiment of the present invention.
Figure 13F:
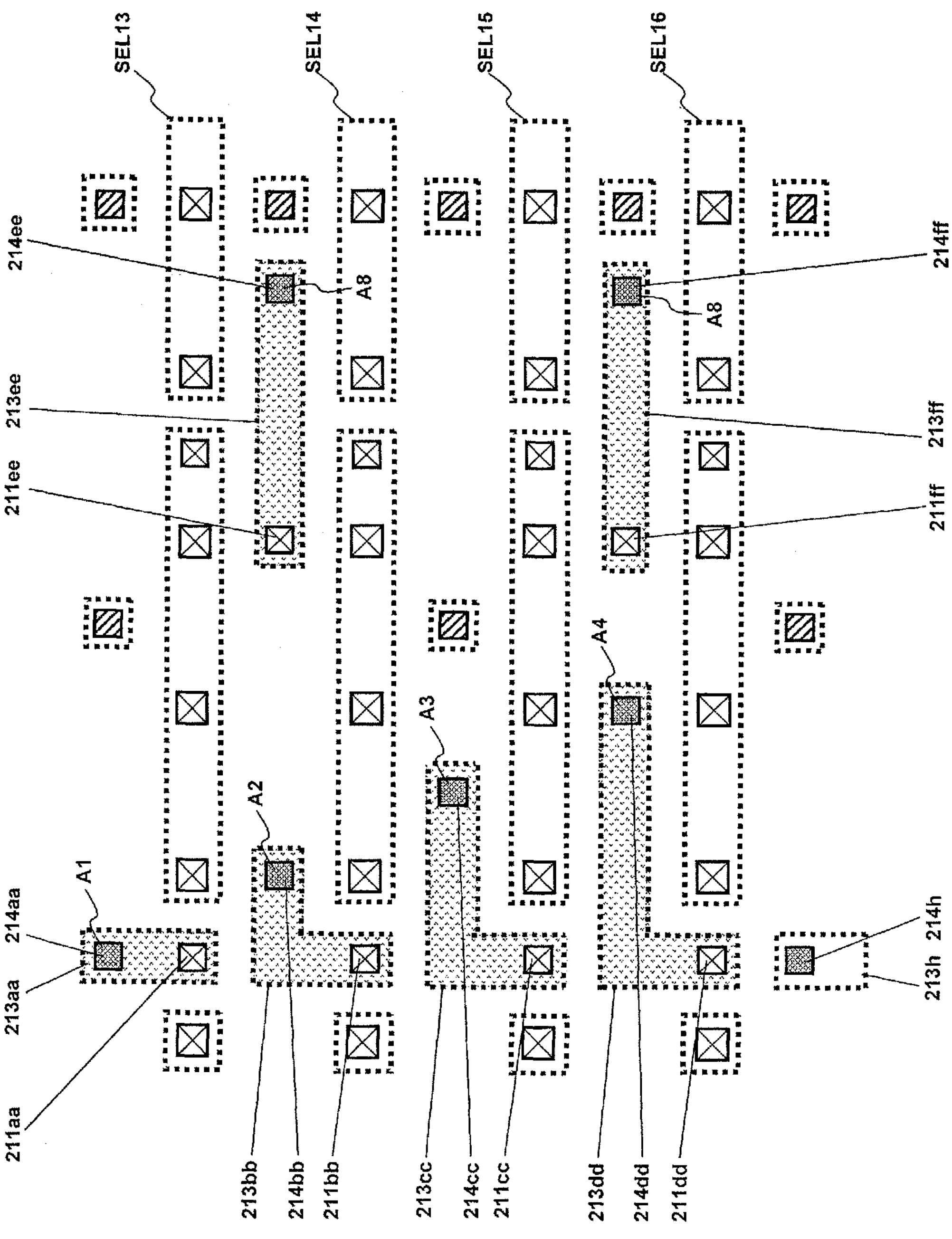
FIG. 13F is a plan view of the decoder according to the fourth exemplary embodiment of the present invention.
Figure 14A:
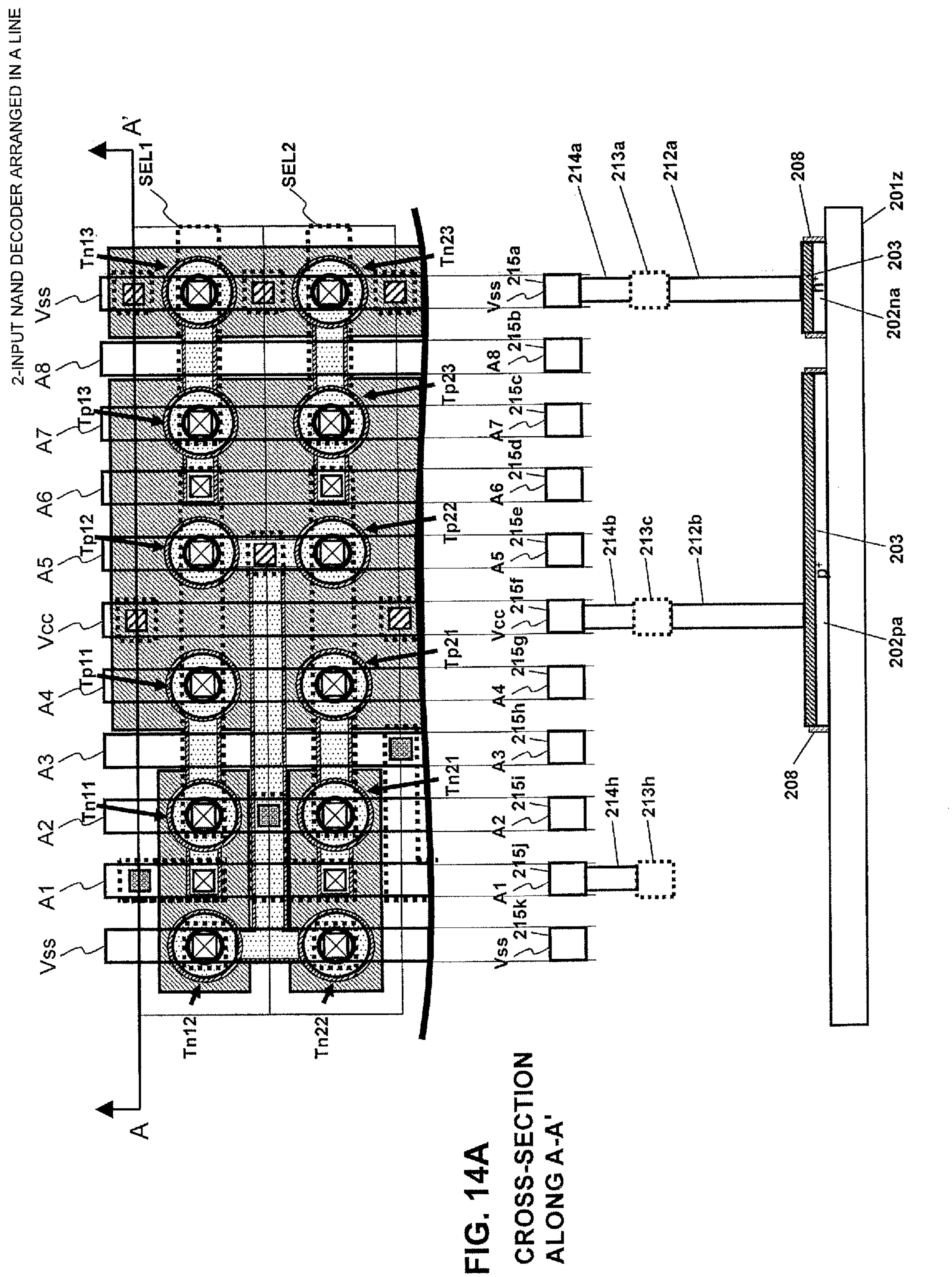
FIG. 14A is a cross-sectional view of the decoder according to the fourth exemplary embodiment of the present invention.
Figure 14B:
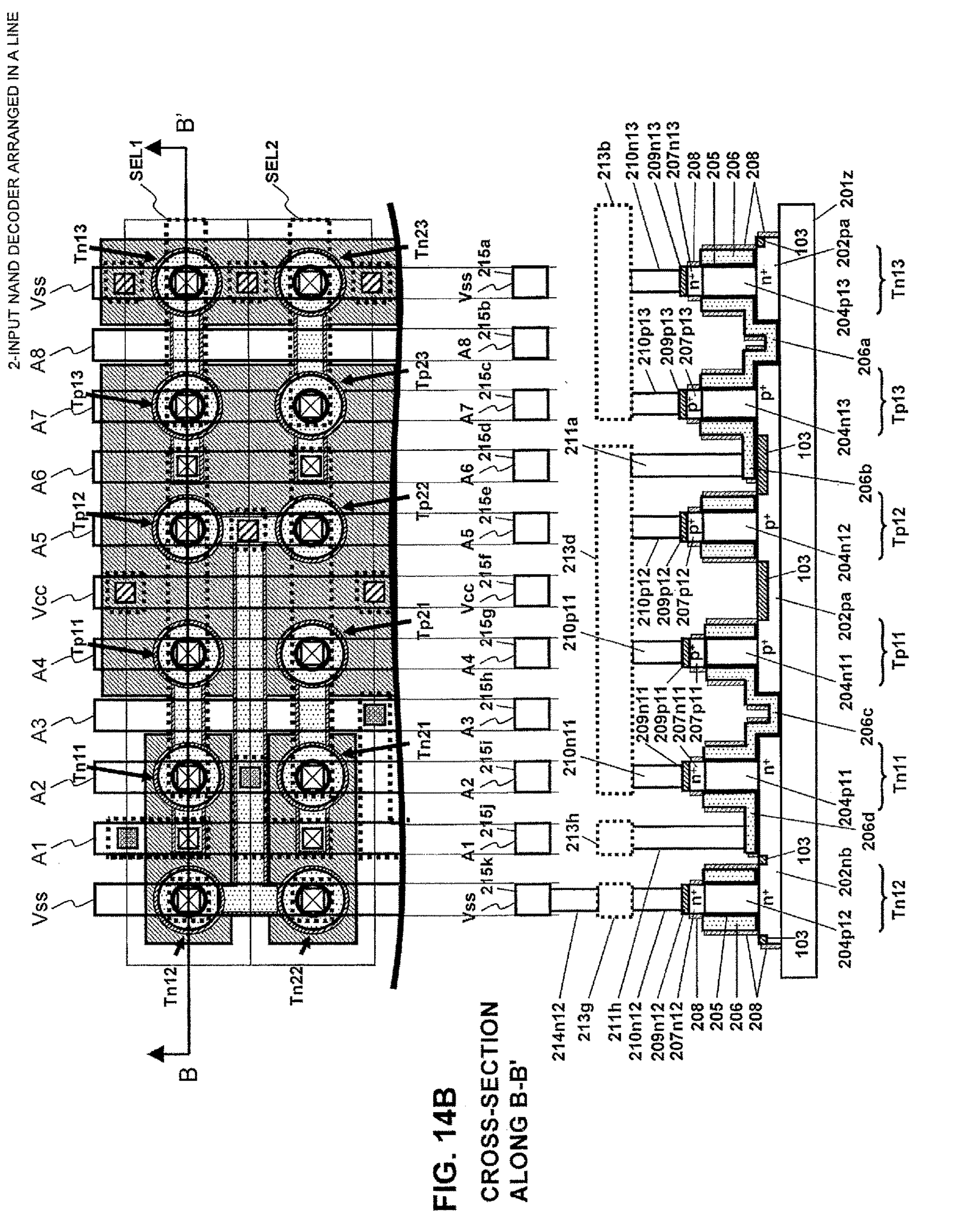
FIG. 14B is a cross-sectional view of the decoder according to the fourth exemplary embodiment of the present invention.
Figure 14C:
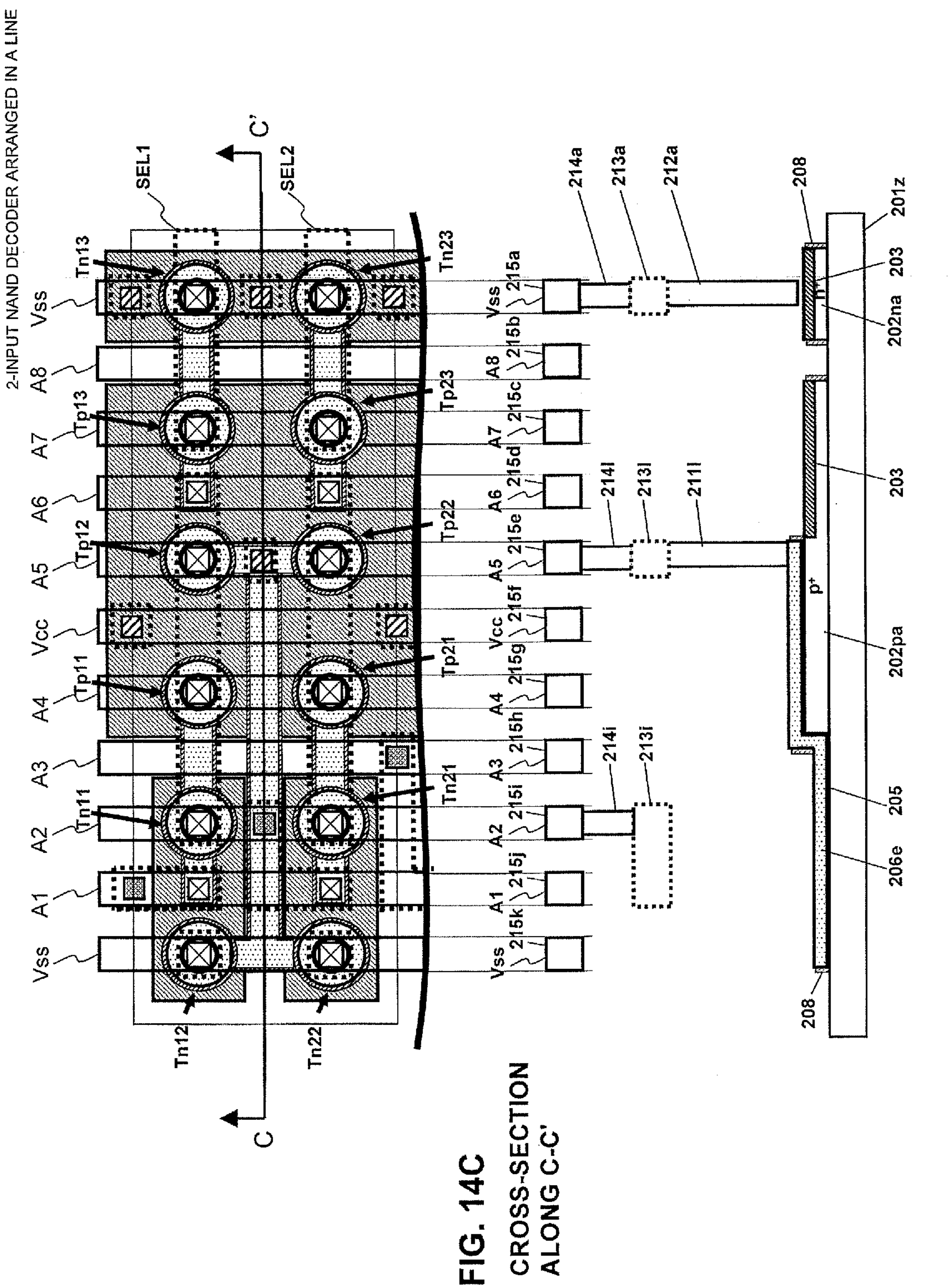
FIG. 14C is a cross-sectional view of the decoder according to the fourth exemplary embodiment of the present invention.
Figure 14D:
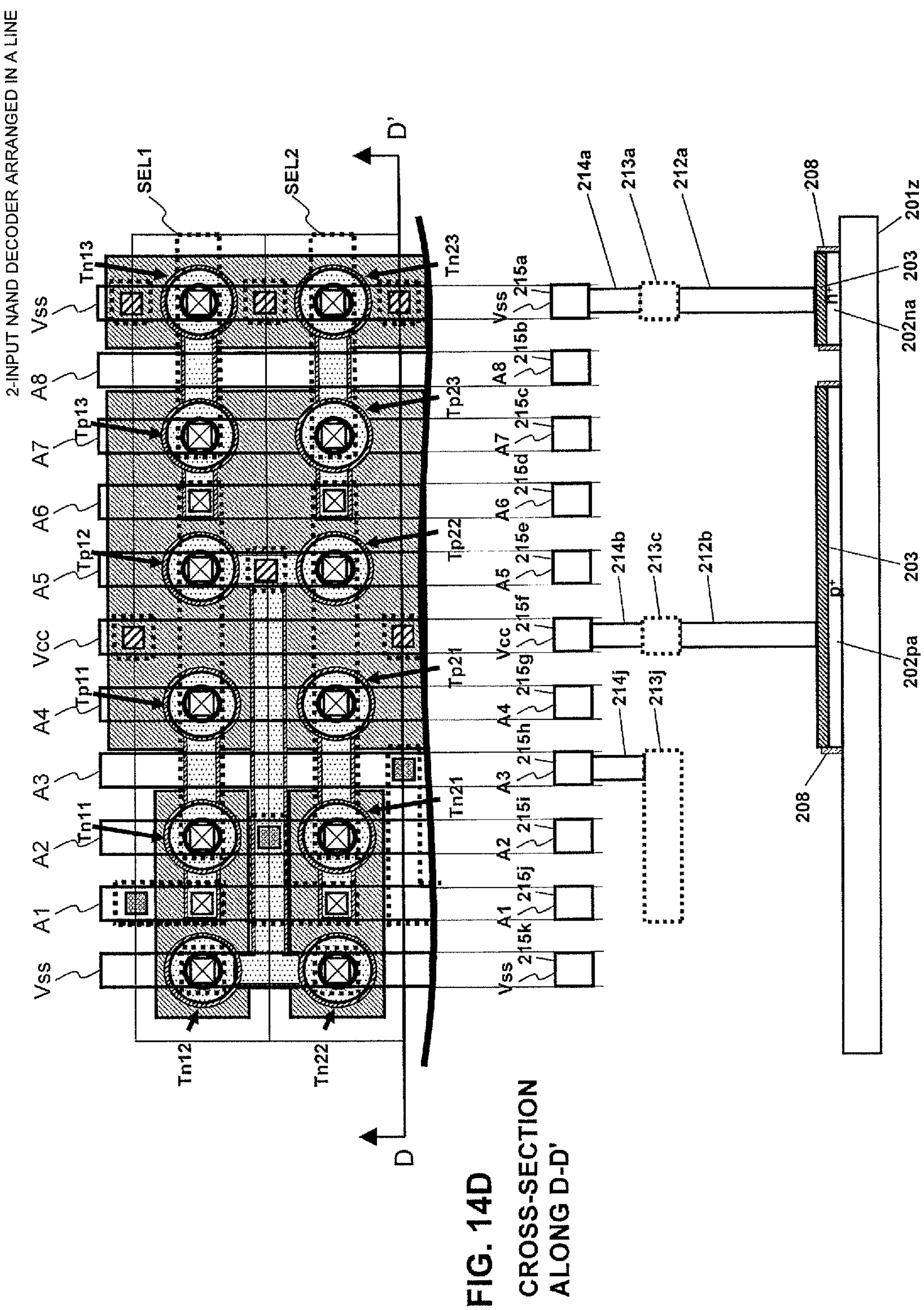
FIG. 14D is a cross-sectional view of the decoder according to the fourth exemplary embodiment of the present invention.
Figure 14E:
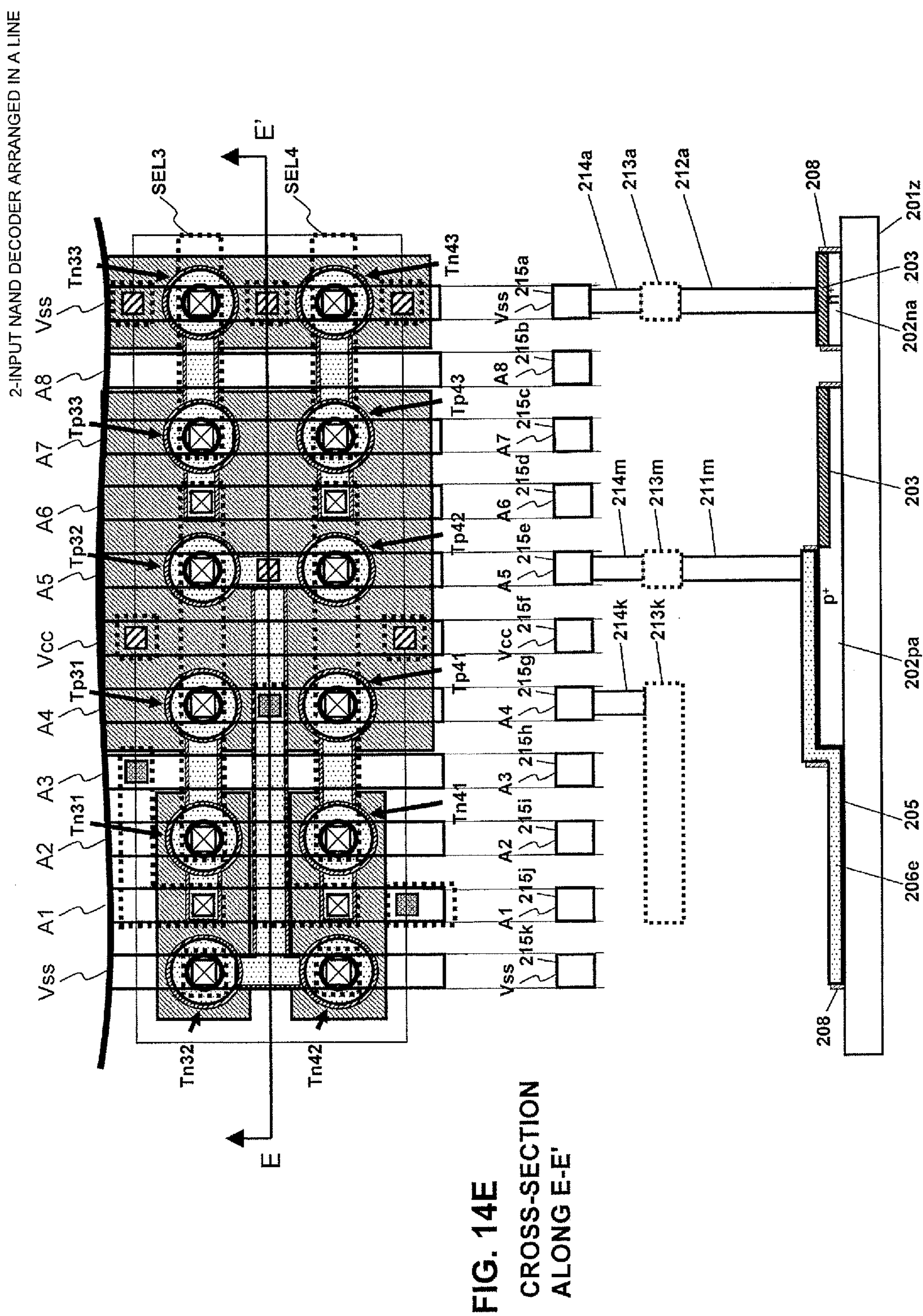
FIG. 14E is a cross-sectional view of the decoder according to the fourth exemplary embodiment of the present invention.
Figure 14F:
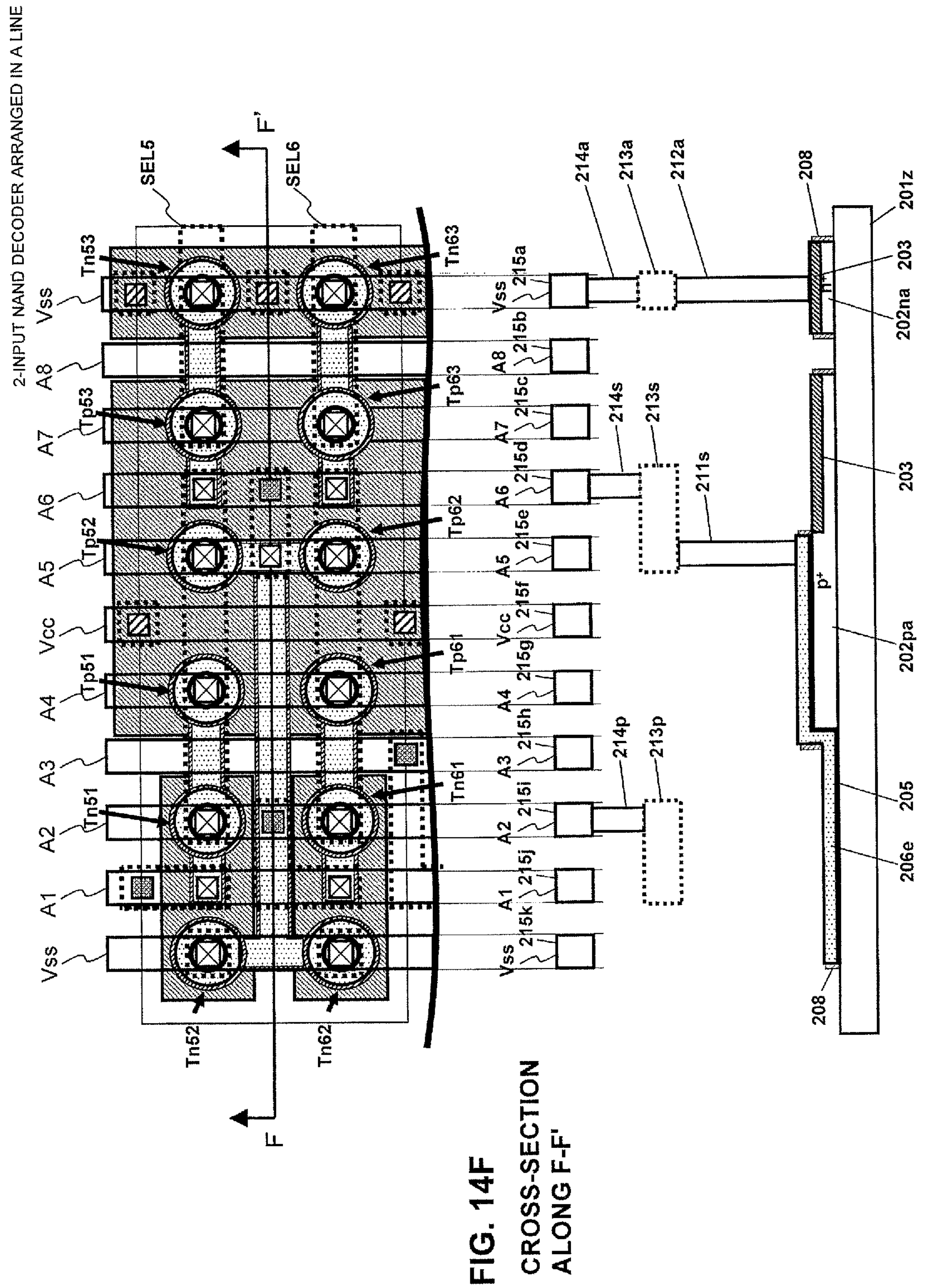
FIG. 14F is a cross-sectional view of the decoder according to the fourth exemplary embodiment of the present invention.
Figure 14G:
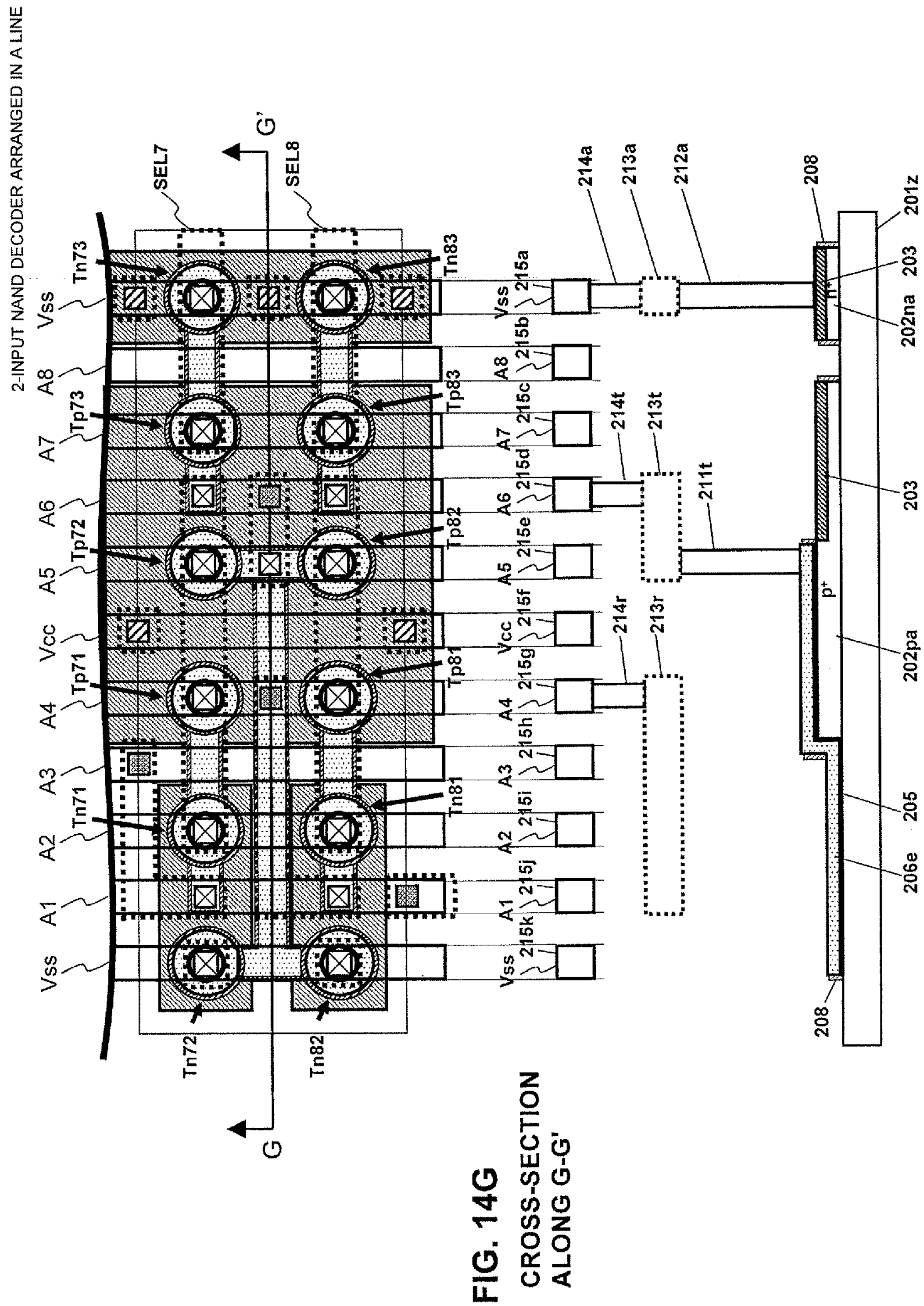
FIG. 14G is a cross-sectional view of the decoder according to the fourth exemplary embodiment of the present invention.
Figure 14H:
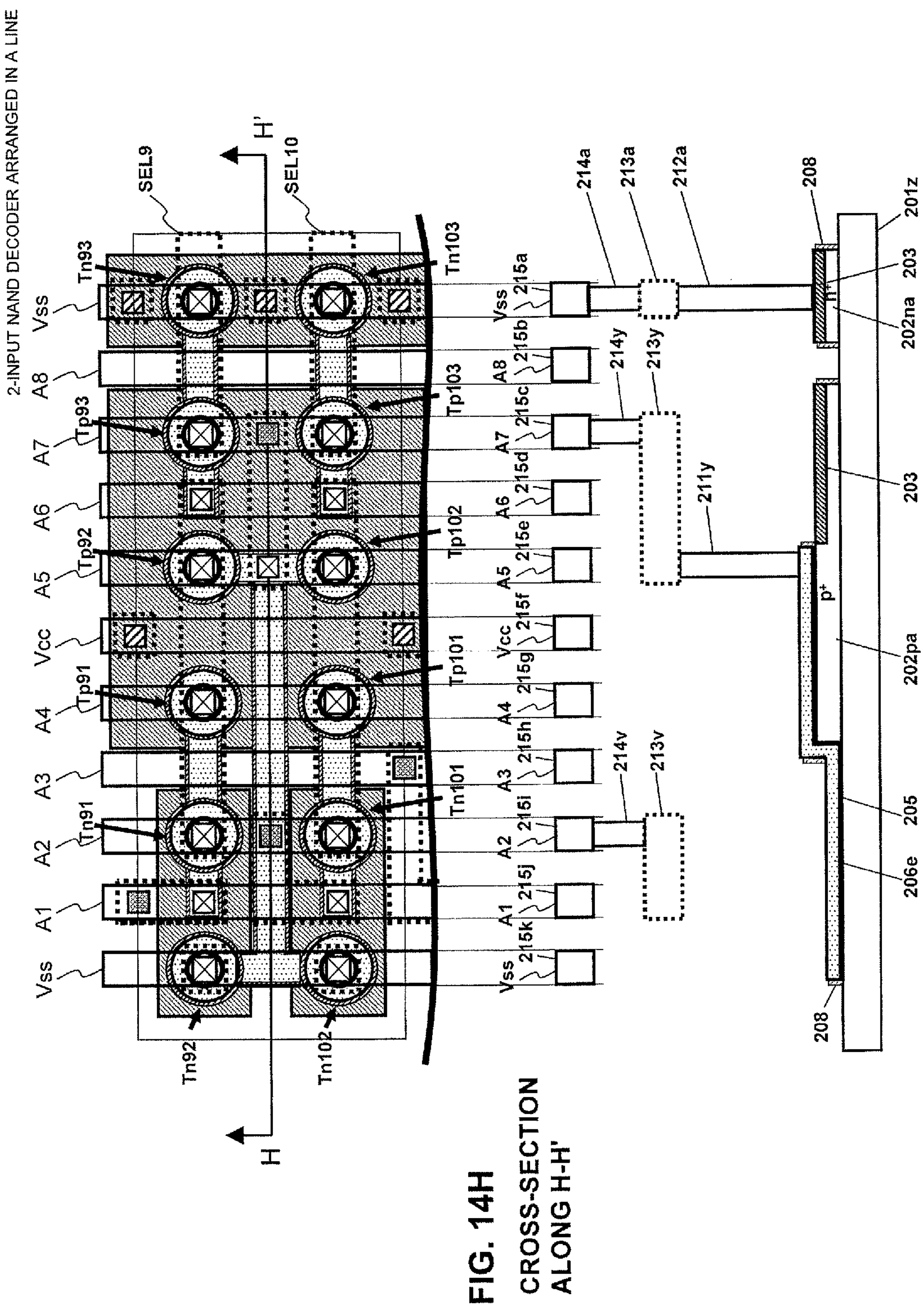
FIG. 14H is a cross-sectional view of the decoder according to the fourth exemplary embodiment of the present invention.
Figure 14I:
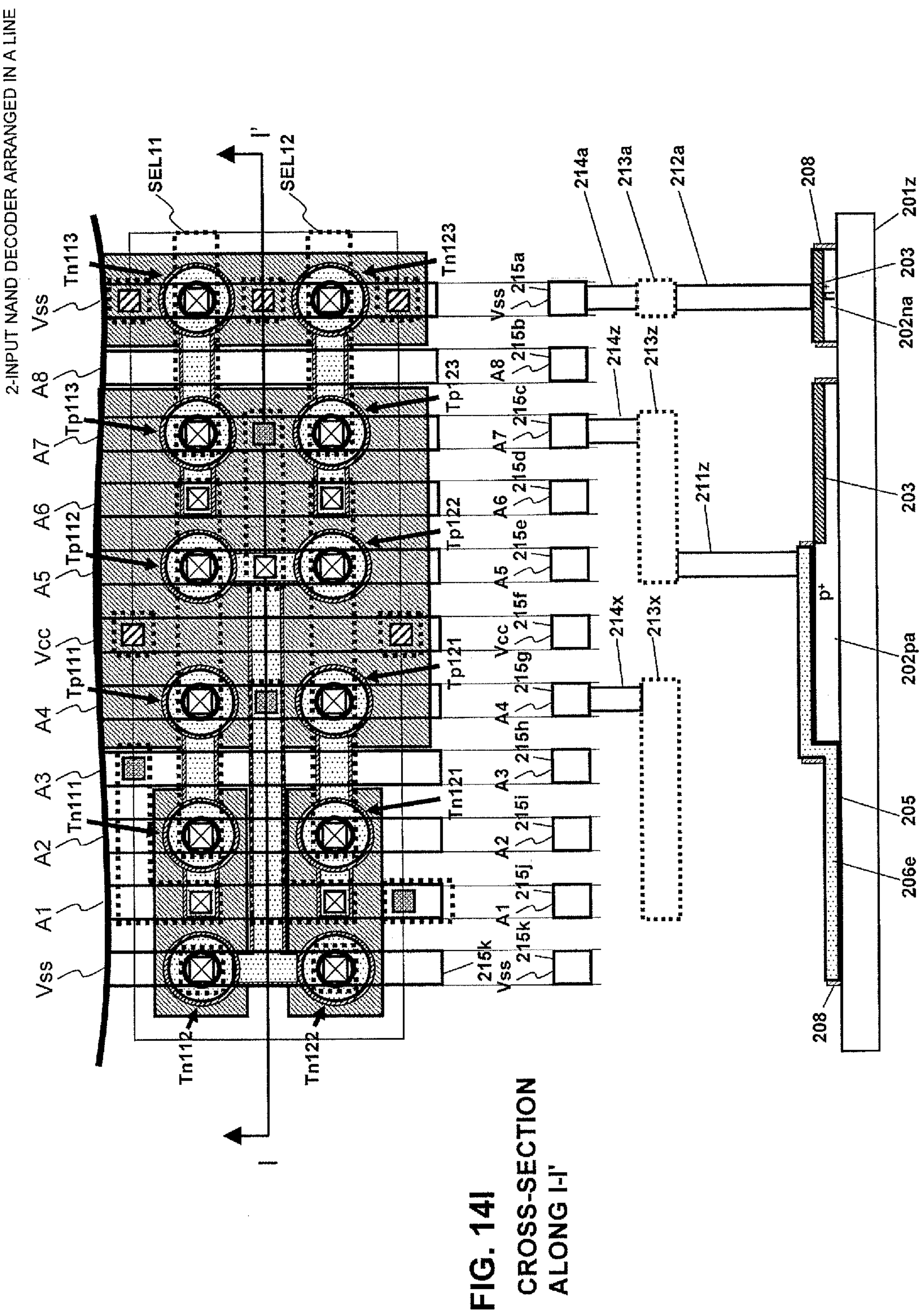
FIG. 14I is a cross-sectional view of the decoder according to the fourth exemplary embodiment of the present invention.
Figure 14J:
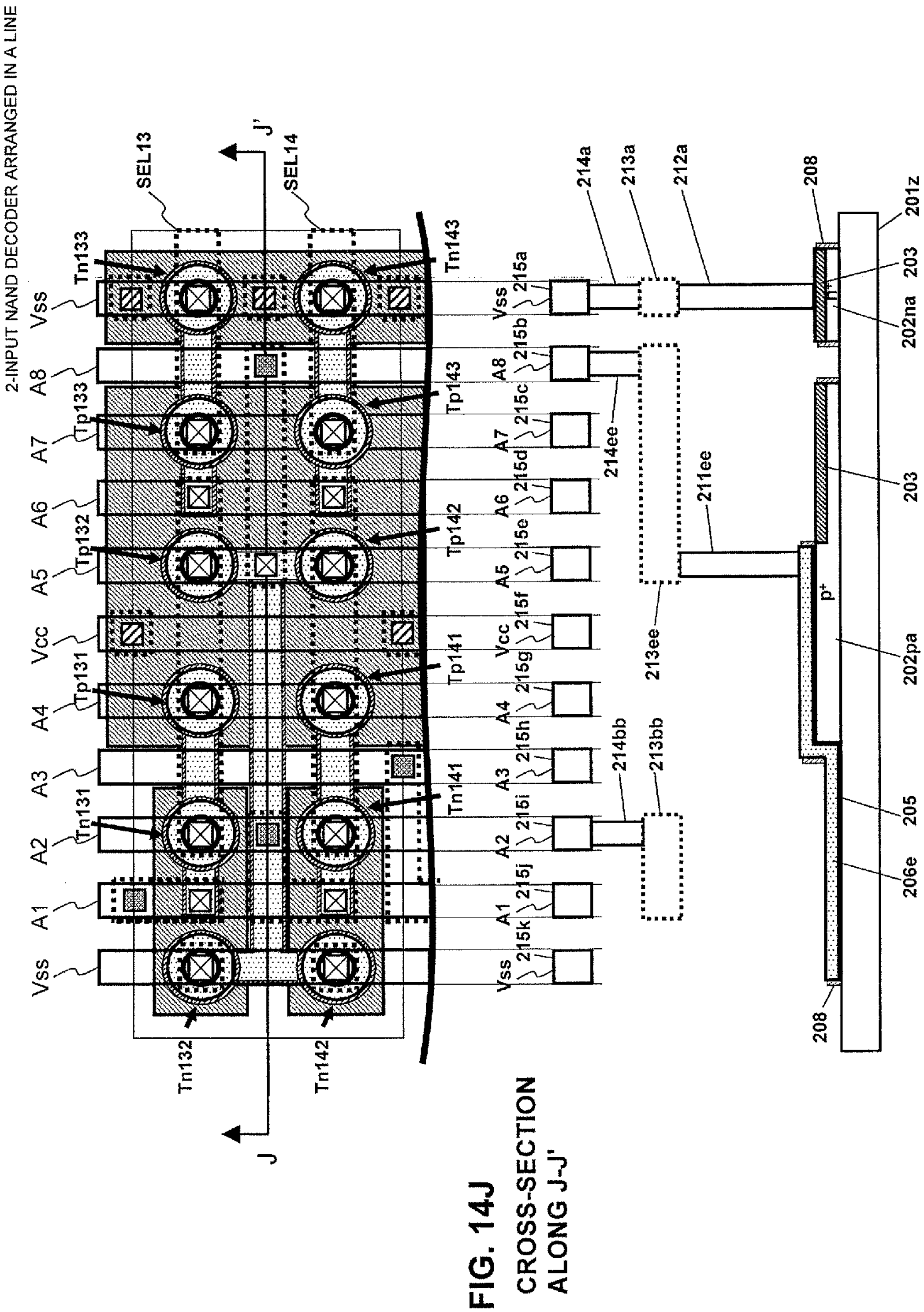
FIG. 14J is a cross-sectional view of the decoder according to the fourth exemplary embodiment of the present invention.
Figure 14K:
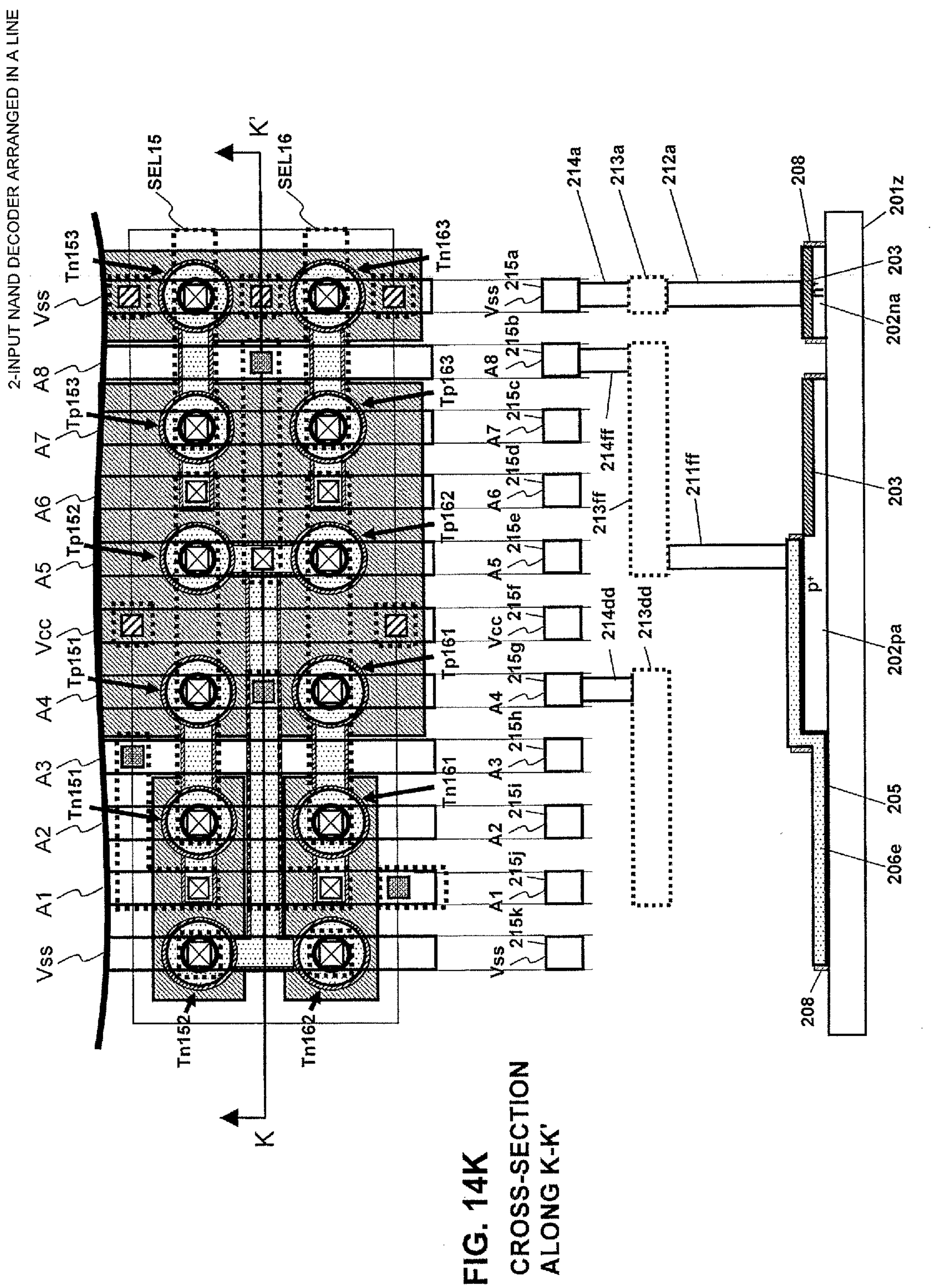
FIG. 14K is a cross-sectional view of the decoder according to the fourth exemplary embodiment of the present invention.
Figure 14M:
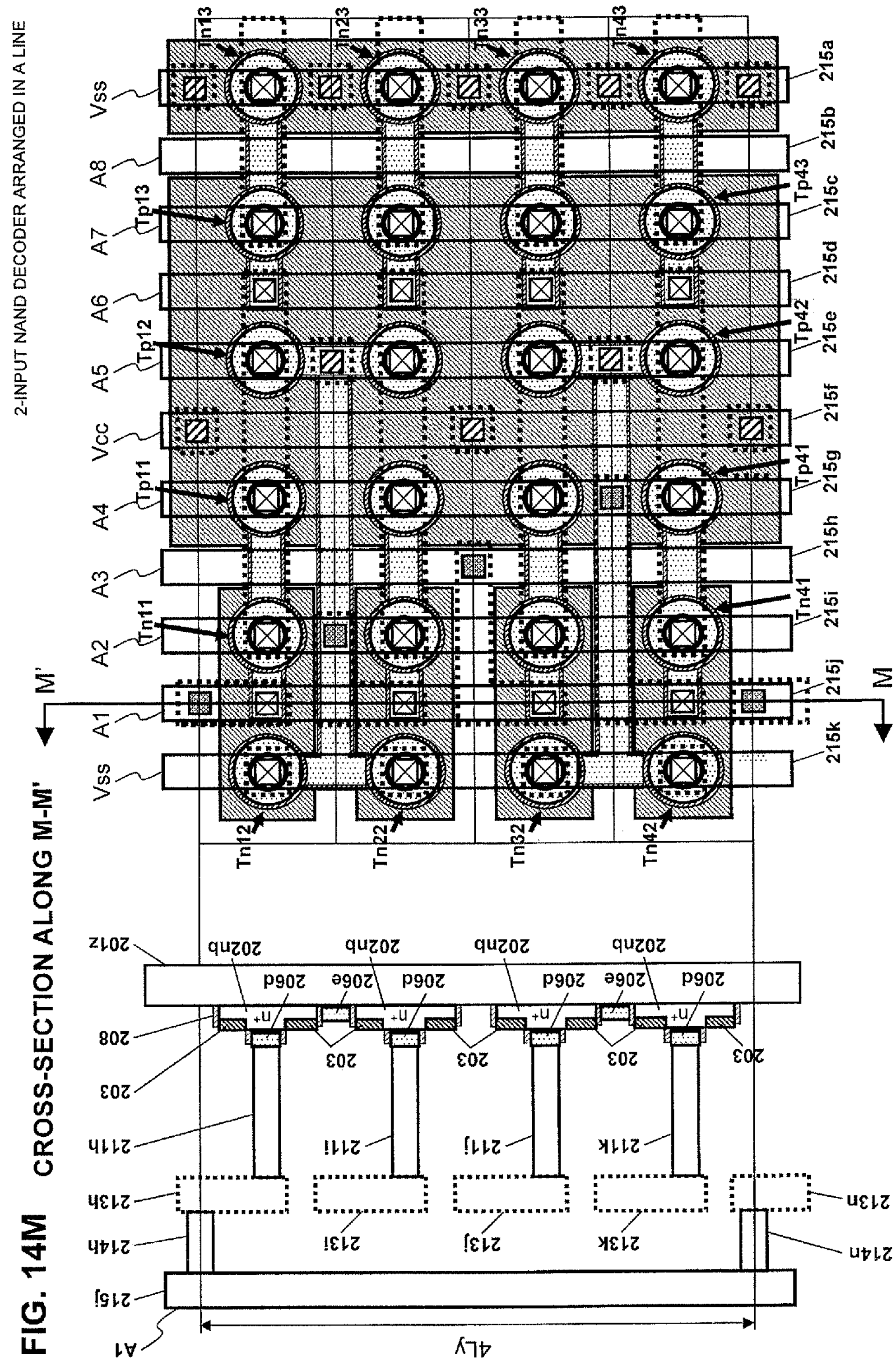
FIG. 14M is a cross-sectional view of the decoder according to the fourth exemplary embodiment of the present invention.
Figure 14N:
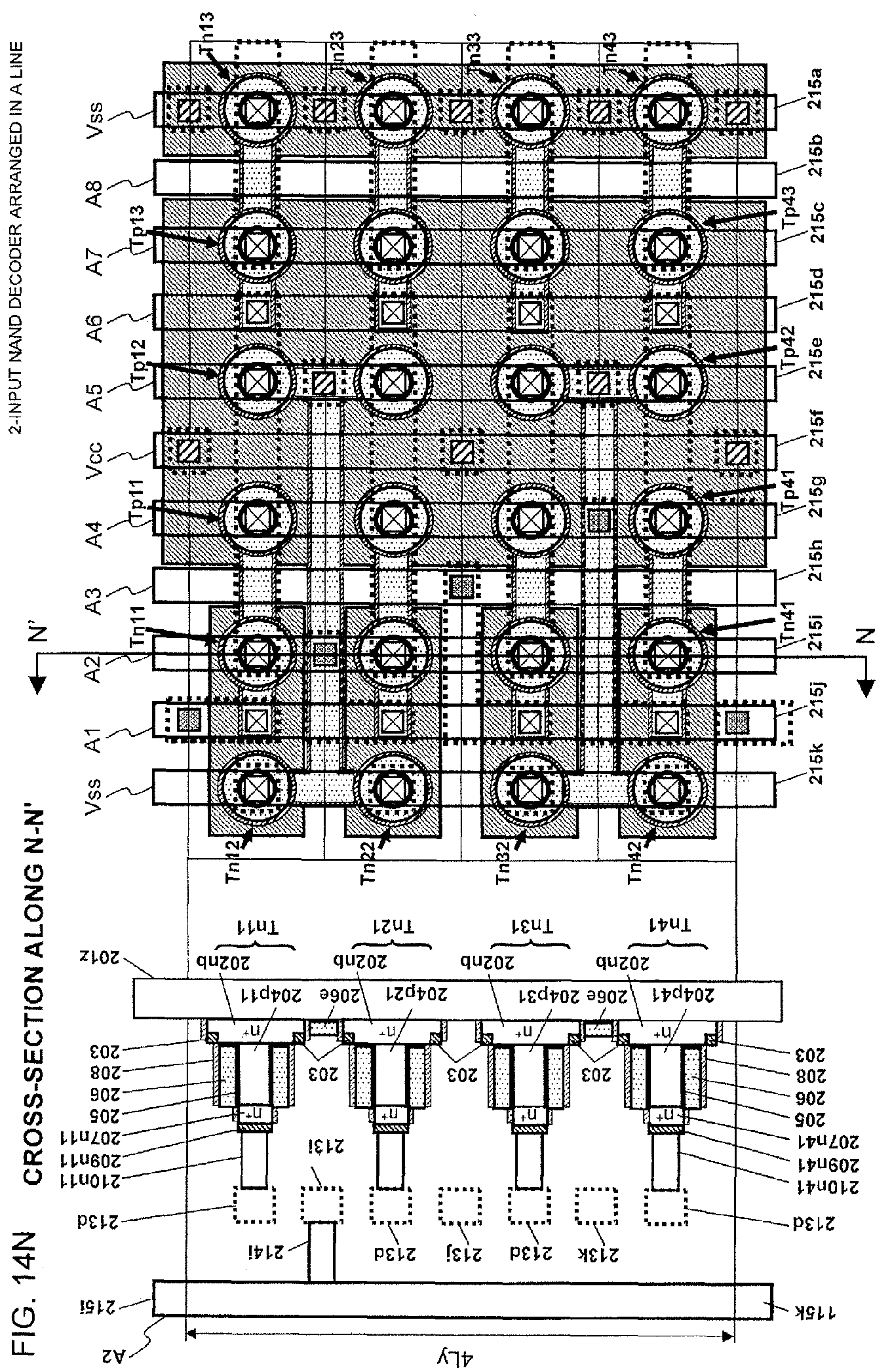
FIG. 14N is a cross-sectional view of the decoder according to the fourth exemplary embodiment of the present invention.
Figure 14T:
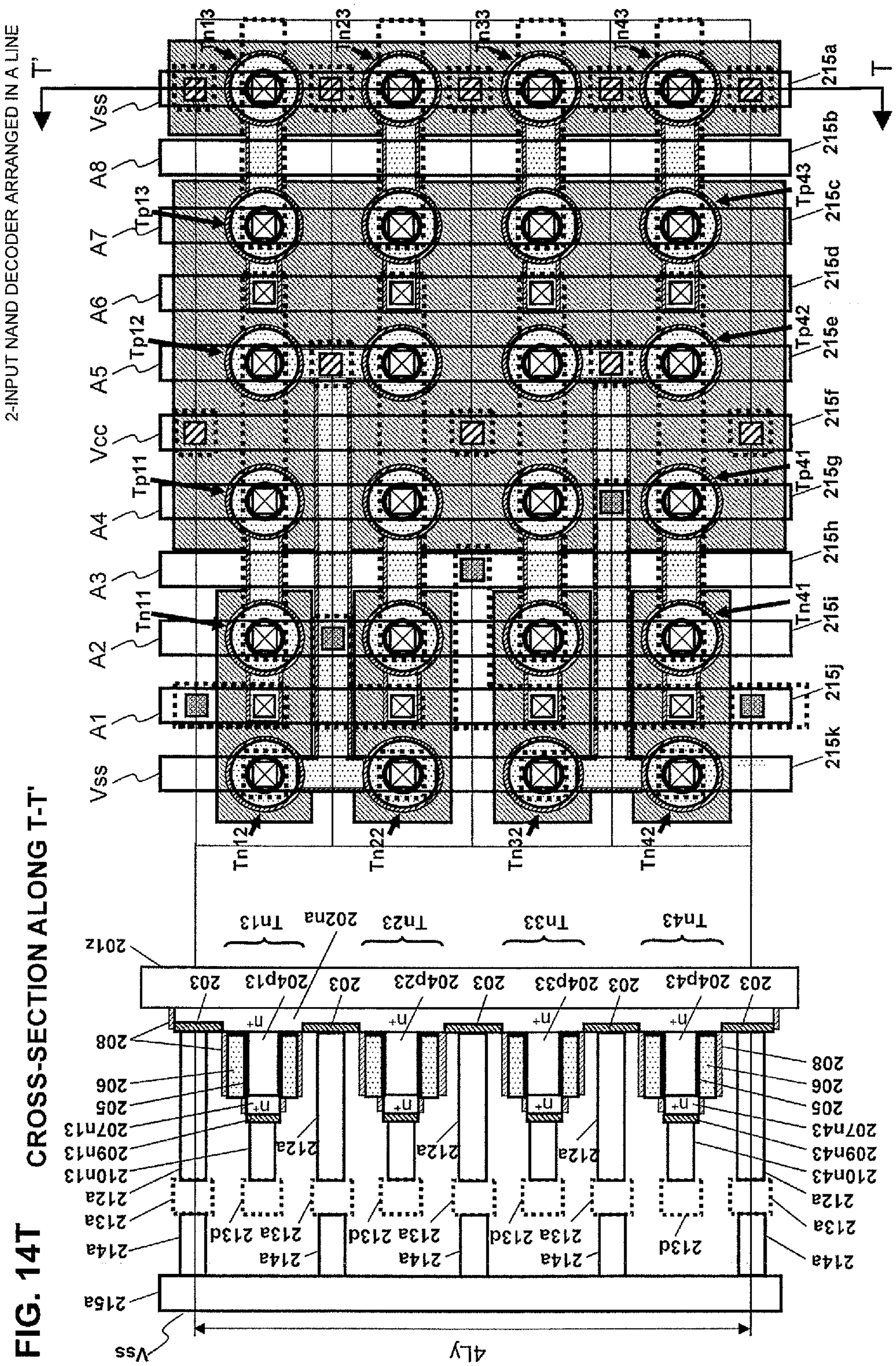
FIG. 14T is a cross-sectional view of the decoder according to the fourth exemplary embodiment of the present invention.

FIGS. 13A to 13F and FIGS. 14A to 14T illustrate a fourth exemplary embodiment. This exemplary embodiment illustrates an implementation of the equivalent circuit illustrated in FIGS. 11A and 11B, in which the sixteen decoders, each of which is based on the decoder 200 according to the third exemplary embodiment (FIG. 9), are arranged adjacent to one another at a minimum pitch Ly in accordance with FIGS. 11A and 11B. FIGS. 13A to 13D are plan views of the layout (arrangement) of 2-input NAND decoders and inverters according to the fourth exemplary embodiment of the present invention, and FIGS. 13E and 13F are plan views illustrating only contacts and lines of the first metal wiring layer illustrated in FIGS. 13A and 13D, respectively. FIG. 14A is a cross-sectional view taken along the cut-line A-A' in FIG. 13A, FIG. 14B is a cross-sectional view taken along the cut-line B-B' in FIG. 13A, FIG. 14C is a cross-sectional view taken along the cut-line C-C' in FIG. 13A, FIG. 14D is a cross-sectional view taken along the cut-line D-D' in FIG. 13A, FIG. 14E is a cross-sectional view taken along the cut-line E-E' in FIG. 13A, FIG. 14F is a cross-sectional view taken along the cut-line F-F' in FIG. 13B, FIG. 14G is a cross-sectional view taken along the cut-line G-G' in FIG. 13B, FIG. 14H is a cross-sectional view taken along the cut-line H-H' in FIG. 13C, FIG. 14I is a cross-sectional view taken along the cut-line I-I' in FIG. 13C, FIG. 14J is a cross-sectional view taken along the cut-line J-J' in FIG. 13D, FIG. 14K is a cross-sectional view taken along the cut-line K-K' in FIG. 13D, FIG. 14L is a cross-sectional view taken along the cut-line L-L' in FIG. 13A, FIG. 14M is a cross-sectional view taken along the cut-line M-M' in FIG. 13A, FIG. 14N is a cross-sectional view taken along the cut-line N-N' in FIG. 13A, FIG. 14P is a cross-sectional view taken along the cut-line P-P' in FIG. 13A, FIG. 14Q is a cross-sectional view taken along the cut-line Q-Q' in FIG. 13A, FIG. 14R is a cross-sectional view taken along the cut-line R-R' in FIG. 13A, FIG. 14S is a cross-sectional view taken along the cut-line S-S' in FIG. 13A, and FIG. 14T is a cross-sectional view taken along the cut-line T-T' in FIG. 13A.

FIG. 13A illustrates a decoder block 210*a* illustrated in FIG. 11A, FIG. 13B illustrates a decoder block 210*b* illustrated in FIG. 11A, FIG. 13C illustrates a decoder block 210*c* illustrated in FIG. 11B, and FIG. 13D illustrates a decoder block 210*d* illustrated in FIG. 11B. Although FIGS. 13A to 13D are consecutive views, separate views are presented in FIGS. 13A to 13D in enlarged scale, for convenience.

In FIG. 13A, the transistors constituting the decoder 200-1 illustrated in FIG. 11A, namely, the NMOS transistor Tn13, the PMOS transistors Tp13, Tp12, and Tp11, and the NMOS transistors Tn11 and Tn12, are arranged in the top row of FIG. 13A in a line in the lateral direction from right to left in this figure.

The transistors constituting the decoder 200-2, namely, the NMOS transistor Tn23, the PMOS transistors Tp23, Tp22, and Tp21, and the NMOS transistors Tn21 and Tn22, are arranged in the second row from the top in FIG. 13A in a line in the lateral direction from right to left in this figure. Likewise, the decoder 200-3 and the decoder 200-4 are arranged in sequence from top to bottom in FIG. 13A.

The decoder 200-2 is constructed by arranging the decoder 200-1 in a vertically inverted configuration, and a gate line 206*e* is common to the PMOS transistors Tp12 and Tp22 and the NMOS transistors Tn11 and Tn12, and is formed in space (dead space) between lower diffusion layers of the decoder 200-1 and the decoder 200-2. This configuration can minimize the size in the longitudinal direction (the second direction). In addition, the use of a common gate line can reduce the parasitic capacitance of lines. High-speed operation can be achieved. Likewise, the decoder 200-4 is also constructed by arranging the decoder 200-3 in an inverted configuration, and a gate line 206*e* is provided in common.

FIG. 13B illustrates the decoders 200-5 to 200-8, in which the decoder 200-6 is constructed by arranging the decoder 200-5 in an inverted configuration and the decoder 200-8 is constructed by arranging the decoder 200-7 in an inverted configuration. Also in FIGS. 13C and 13D, the decoders 200-9 to 200-12 and the decoders 200-13 to 200-16 are respectively arranged in a manner similar that described above.

In FIGS. 13A to 13D, lines 215*a*, 215*b*, 215*c*, 215*d*, 215*e*, 215*f*, 215*g*, 215*h*, 215*i*, 215*j*, and 215*k* of the second metal wiring layer are arranged to extend in the longitudinal direction (the second direction), and are respectively supplied with a reference power supply Vss, address signals A8, A7, A6, and A5, a power supply Vcc, address signals A4, A3, A2, and A1, and the reference power supply Vss. Since the lines 215*a* to 215*k* of the second metal wiring layer are arranged at a minimum pitch (a minimum wiring width and a minimum wiring interval) in the second metal wiring layer, resulting in the size in the lateral direction being minimized in the arrangement.

In FIGS. 13A to 13F and FIGS. 14A to 14T, portions having the same or substantially the same structures as those illustrated in FIG. 9 and FIGS. 10A to 10J are denoted by equivalent reference numerals in the 200s.

The arrangement of the transistors constituting the decoder 200-1, namely, the NMOS transistor Tn13, the PMOS transistors Tp13, Tp12, and Tp11, and the NMOS transistors Tn11 and Tn12, up to transistors constituting the decoder 200-16, namely, the NMOS transistor Tn163, the PMOS transistors Tp163, Tp162, and Tp161, and the NMOS transistors Tn161 and Tn162, is identical to the arrangement of the NMOS transistor Tn13, the PMOS transistors Tp13, Tp12, and Tp11, and the NMOS transistors Tn11 and Tn12 in FIG. 9. Note that FIGS. 13A to 13F are different from FIG. 9 in the following points: In FIGS. 13A to 13F, address signal lines A1 to A8 are connected to a gate line 206*d* or 206*e* once via lines of the first metal wiring layer that are arranged to extend in the lateral direction (the first direction) through lines of the second metal wiring layer along which the respective address signals are supplied and which are arranged to extend in the longitudinal direction (the second direction) in order to arrange the address signal lines A1 to A8 to extend at a minimum pitch for lines of the second metal wiring layer and selectively connect the address signal lines A1 to A4 to the gate line 206*d* while selectively connecting the address signal lines A5 to A8 to the gate line 206*e*.

In FIGS. 13A to 13F and FIGS. 14A to 14T, the following connections are provided.

The line 215*a* of the second metal wiring layer to which the reference power supply Vss is supplied is arranged to extend in the second direction, and is connected to the silicide layer 203, which is shared to connect the lower diffusion layers 202*na*, which are the source regions of the NMOS transistors Tn13 and Tn23 to Tn163, via contacts 214*a*, lines 213*a* of the first metal wiring layer, and contacts 212*a*. Note that each of the connection portions (214*a*, 213*a*, and 212*a*) is provided at a plurality of locations. In addition, the lower diffusion layer 202*na* and the silicide layer 203, which cover the lower diffusion layer 202*na*, are shared by upper and lower adjacent decoders and are connected.

The line 215*b* of the second metal wiring layer to which the address signal A8 is supplied is arranged to extend in the longitudinal direction (the second direction). As illustrated in FIG. 13D and FIGS. 14J and 14K, the line 215*b* of the second metal wiring layer is connected to the gate line 206*e* via a contact 214*ee*, a line 213*ee* of the first metal wiring layer arranged to extend in the lateral direction (the first direction), and a contact 211*ee*, and is connected to the gate electrodes of the PMOS transistors Tp132 and Tp142 and the gate electrodes of the NMOS transistors Tn132 and Tn142. Likewise, the line 215*b* of the second metal wiring layer is connected to the gate line 206*e* via a contact 214*ff*, a line 213*ff* of the first metal wiring layer arranged to extend in the lateral direction (the first direction), and a contact 211*ff*, and is connected to the gate electrodes of the PMOS transistors Tp152 and Tp162 and the gate electrodes of the NMOS transistors Tn152 and Tn162.

The line 215*c* of the second metal wiring layer to which the address signal A7 is supplied is arranged to extend in the longitudinal direction (the second direction). As illustrated in FIG. 13C and FIGS. 14H and 14I, the line 215*c* of the second metal wiring layer is connected to the gate line 206*e* via a contact 214*y*, a line 213*y* of the first metal wiring layer arranged to extend in the lateral direction (the first direction), and a contact 211*y*, and is connected to the gate electrodes of the PMOS transistors Tp92 and Tp102 and the gate electrodes of the NMOS transistors Tn92 and Tn102. Likewise, the line 215*c* of the second metal wiring layer is connected to the gate line 206*e* via a contact 214*z*, a line 213*z* of the first metal wiring layer arranged to extend in the lateral direction (the first direction), and a contact 211*z*, and is connected to the gate electrodes of the PMOS transistors Tp112 and Tp122 and the gate electrodes of the NMOS transistors Tn112 and Tn122.

The line 215*d* of the second metal wiring layer to which the address signal A6 is supplied is arranged to extend in the longitudinal direction (the second direction). As illustrated in FIG. 13B and FIGS. 14F and 14G, the line 215*d* of the second metal wiring layer is connected to the gate line 206*e* via a contact 214*s*, a line 213*s* of the first metal wiring layer arranged to extend in the lateral direction (the first direction), and a contact 211*s*, and is connected to the gate electrodes of the PMOS transistors Tp52 and Tp62 and the gate electrodes of the NMOS transistors Tn52 and Tn62. Likewise, the line 215*d* of the second metal wiring layer is connected to the gate line 206*e* via a contact 214*t*, a line 213*t* of the first metal wiring layer arranged to extend in the lateral direction (the first direction), and a contact 211*t*, and is connected to the gate electrodes of the PMOS transistors Tp72 and Tp82 and the gate electrodes of the NMOS transistors Tn72 and Tn82.

The line 215*e* of the second metal wiring layer to which the address signal A5 is supplied is arranged to extend in the longitudinal direction (the second direction). As illustrated in FIG. 13A and FIGS. 14C and 14E, the line 215*e* of the second metal wiring layer is connected to the gate line 206*e* via a contact 214*l*, a line 213*l* of the first metal wiring layer, and a contact 211*l*, and is connected to the gate electrodes of the PMOS transistors Tp12 and Tp22 and the gate electrodes of the NMOS transistors Tn12 and Tn22. Likewise, the line 215*e* of the second metal wiring layer is connected to the gate line 206*e* via a contact 214*m*, a line 213*m* of the first metal wiring layer, and a contact 211*m*, and is connected to the gate electrodes of the PMOS transistors Tp32 and Tp42 and the gate electrodes of the NMOS transistors Tn32 and Tn42.

The line 215*f* of the second metal wiring layer to which the power supply Vcc is supplied is arranged to extend in the second direction, and is connected to the silicide layer 203, which is shared to connect the lower diffusion layers 202*pa*, which are the source regions of the PMOS transistors Tp13, Tp12, Tp11 to Tp163, Tp162, and Tp161, via contacts 214*b*, lines 213*c* of the first metal wiring layer, and contacts 212*b*. Note that each of the connection portions (214*b*, 213*c*, and 212*b*) is provided at a plurality of locations. In addition, the lower diffusion layer 202*pa* and the silicide layer 203, which cover the lower diffusion layer 202*pa*, are shared by upper and lower adjacent decoders and are connected.

The line 215*g* of the second metal wiring layer to which the address signal A4 is supplied is arranged to extend in the longitudinal direction (the second direction). As illustrated in FIG. 13A and FIGS. 14E and 14Q, the line 215*g* of the second metal wiring layer is connected to the gate line 206*d* via a contact 214*k*, a line 213*k* of the first metal wiring layer arranged to extend in the lateral direction (the first direction), and a contact 211*k*, and is connected to the gate electrode of the NMOS transistor Tn41. The line 215*g* of the second metal wiring layer is also connected to the gate electrode of the PMOS transistor Tp41 via a gate line 206*c*. Likewise, as illustrated in FIG. 13B and FIG. 14G, the line 215*g* of the second metal wiring layer is connected to the gate line 206*d* via a contact 214*r*, a line 213*r* of the first metal wiring layer arranged to extend in the lateral direction (the first direction), and a contact 211*r*, and is connected to the gate electrode of the NMOS transistor Tn81. The line 215*g* of the second metal wiring layer is also connected to the gate electrode of the PMOS transistor Tp81 via a gate line 206*c*. Further, as illustrated in FIG. 13C and FIG. 14I, the line 215*g* of the second metal wiring layer is connected to the gate line 206*d* via a contact 214*x*, a line 213*x* of the first metal wiring layer arranged to extend in the lateral direction (the first direction), and a contact 211*x*, and is connected to the gate electrode of the NMOS transistor Tn121. The line 215*g* of the second metal wiring layer is also connected to the gate electrode of the PMOS transistor Tp121 via a gate line 206*c*. Further, as illustrated in FIG. 13D and FIG. 14K, the line 215*g* of the second metal wiring layer is connected to the gate line 206*d* via a contact 214*dd*, a line 213*dd* of the first metal wiring layer arranged to extend in the lateral direction (the first direction), and a contact 211*dd*, and is connected to the gate electrode of the NMOS transistor Tn161. The line 215*g* of the second metal wiring layer is also connected to the gate electrode of the PMOS transistor Tp161 via a gate line 206*c*.

The line 215*h* of the second metal wiring layer to which the address signal A3 is supplied is arranged to extend in the longitudinal direction (the second direction). As illustrated in FIG. 13A and FIGS. 14D and 14P, the line 215*h* of the second metal wiring layer is connected to the gate line 206*d* via a contact 214*j*, a line 213*j* of the first metal wiring layer arranged to extend in the lateral direction (the first direction), and a contact 211*j*, and is connected to the gate electrode of the NMOS transistor Tn31. The line 215*h* of the second metal wiring layer is also connected to the gate electrode of the PMOS transistor Tp31 via a gate line 206*c*. Likewise, as illustrated in FIG. 13B, the line 215*h* of the second metal wiring layer is connected to the gate line 206*d* via a contact 214*q*, a line 213*q* of the first metal wiring layer arranged to extend in the lateral direction (the first direction), and a contact 211*q*, and is connected to the gate electrode of the NMOS transistor Tn71. The line 215*h* of the second metal wiring layer is also connected to the gate electrode of the PMOS transistor Tp71 via a gate line 206*c*. Further, as illustrated in FIG. 13C, the line 215*h* of the second metal wiring layer is connected to the gate line 206*d* via a contact 214*w*, a line 213*w* of the first metal wiring layer arranged to extend in the lateral direction (the first direction), and a contact 211*w*, and is connected to the gate electrode of the NMOS transistor Tn111. The line 215*h* of the second metal wiring layer is also connected to the gate electrode of the PMOS transistor Tp111 via a gate line 206*c*. Further, as illustrated in FIG. 13D, the line 215*h* of the second metal wiring layer is connected to the gate line 206*d* via a contact 214*cc*, a line 213*cc* of the first metal wiring layer arranged to extend in the lateral direction (the first direction), and a contact 211*cc*, and is connected to the gate electrode of the NMOS transistor Tn151. The line 215*h* of the second metal wiring layer is also connected to the gate electrode of the PMOS transistor Tp151 via a gate line 206*c*.

The line 215*i* of the second metal wiring layer to which the address signal A2 is supplied is arranged to extend in the longitudinal direction (the second direction). As illustrated in FIG. 13A and FIGS. 14C and 14N, the line 215*i* of the second metal wiring layer is connected to the gate line 206*d* via a contact 214*i*, a line 213*i* of the first metal wiring layer arranged to extend in the lateral direction (the first direction), and a contact 211*i*, and is connected to the gate electrode of the NMOS transistor Tn21. The line 215*i* of the second metal wiring layer is also connected to the gate electrode of the PMOS transistor Tp21 via a gate line 206*c*. Likewise, as illustrated in FIG. 13B and FIG. 14F, the line 215*i* of the second metal wiring layer is connected to the gate line 206*d* via a contact 214*p*, a line 213*p* of the first metal wiring layer arranged to extend in the lateral direction (the first direction), and a contact 211*p*, and is connected to the gate electrode of the NMOS transistor Tn61. The line 215*i* of the second metal wiring layer is also connected to the gate electrode of the PMOS transistor Tp61 via a gate line 206*c*. Further, as illustrated in FIG. 13C and FIG. 14H, the line 215*i* of the second metal wiring layer is connected to the gate line 206*d* via a contact 214*v*, a line 213*v* of the first metal wiring layer arranged to extend in the lateral direction (the first direction), and a contact 211*v*, and is connected to the gate electrode of the NMOS transistor Tn101. The line 215*i* of the second metal wiring layer is also connected to the gate electrode of the PMOS transistor Tp101 via a gate line 206*c*. Further, as illustrated in FIG. 13D, the line 215*i* of the second metal wiring layer is connected to the gate line 206*d* via a contact 214*bb*, a line 213*bb* of the first metal wiring layer arranged to extend in the lateral direction (the first direction), and a contact 211*bb*, and is connected to the gate electrode of the NMOS transistor Tn141. The line 215*i* of the second metal wiring layer is also connected to the gate electrode of the PMOS transistor Tp141 via a gate line 206*c*.

The line 215*j* of the second metal wiring layer to which the address signal A1 is supplied is arranged to extend in the longitudinal direction (the second direction). As illustrated in FIG. 13A and FIG. 14A, the line 215*j* of the second metal wiring layer is connected to the gate line 206*d* via a contact 214*h*, a line 213*h* of the first metal wiring layer arranged to extend in the longitudinal direction (the second direction), and a contact 211*h*, and is connected to the gate electrode of the NMOS transistor Tn11. The line 215*j* of the second metal wiring layer is also connected to the gate electrode of the PMOS transistor Tp11 via a gate line 206*c*. Likewise, as illustrated in FIG. 13B, the line 215*j* of the second metal wiring layer is connected to the gate line 206*d* via a contact 214*n*, a line 213*n* of the first metal wiring layer arranged to extend in the longitudinal direction (the second direction), and a contact 211*n*, and is connected to the gate electrode of the NMOS transistor Tn51. The line 215*j* of the second metal wiring layer is also connected to the gate electrode of the PMOS transistor Tp51 via a gate line 206*c*. Further, as illustrated in FIG. 13C, the line 215*j* of the second metal wiring layer is connected to the gate line 206*d* via a contact 214*u*, a line 213*u* of the first metal wiring layer arranged to extend in the longitudinal direction (the second direction), and a contact 211*u*, and is connected to the gate electrode of the NMOS transistor Tn91. The line 215*j* of the second metal wiring layer is also connected to the gate electrode of the PMOS transistor Tp91 via a gate line 206*c*. Further, as illustrated in FIG. 13D, the line 215*j* of the second metal wiring layer is connected to the gate line 206*d* via a contact 214*aa*, a line 213*aa* of the first metal wiring layer arranged to extend in the longitudinal direction (the second direction), and a contact 211*aa*, and is connected to the gate electrode of the NMOS transistor Tn131. The line 215*j* of the second metal wiring layer is also connected to the gate electrode of the PMOS transistor Tp131 via a gate line 206*c*.

The line 215*k* of the second metal wiring layer to which the reference power supply Vss is supplied is arranged to extend in the second direction, and is connected to the sources of the NMOS transistors Tn12 and Tn22 to Tn162 via contacts 210*n*12 to 210*n*162, lines 213*g* of the first metal wiring layer, and contacts 210*n*12 to 210*n*162, respectively.

The arrangement and connections described above can provide sixteen decoders with a minimum area at a minimum pitch in both the lateral direction and the longitudinal direction.

In this exemplary embodiment, the address signal lines A1 to A8 are set to provide sixteen decoders. It is easy to increase the number of address signal lines to increase the number of decoders. For an additional address signal line, similarly to the address signal lines A1 to A8, a line of the second metal wiring layer is arranged to extend in the longitudinal direction (the second direction) and is connected to the gate lines 206*d* or 206*e* by using a line of the first metal wiring layer arranged to extend in the lateral direction (the first direction). This configuration enables the additional line of the second metal wiring layer to also be arranged at a minimum pitch that is determined by processing. Thus, large-scale decoders with a minimum area can be achieved.

According to this exemplary embodiment, a plurality of decoders, each having six SGTs that constitute a 2-input NAND decoder and an inverter and that are arranged in a line in a first direction, are arranged adjacent to each other in a second direction perpendicular to the first direction, and the power supply Vcc, the reference power supply Vss, and the address signal lines (A1 to A8) are arranged to extend in the second direction. In addition, any one of the address signal lines (A1 to A8) is connected to a gate line of the corresponding one of the 2-input NAND decoders via a line of a first metal wiring layer arranged to extend in the first direction. This configuration provides a semiconductor device including 2-input NAND decoders and inverters with a minimum area, which can be arranged at a minimum pitch in both the first direction and the second direction without any limitation as to the number of input address signal lines and also without using any extra lines or contact regions.

While in this exemplary embodiment, six SGTs are arranged such that the NMOS transistor Tn13, the PMOS transistor Tp13, the PMOS transistor Tp12, the PMOS transistor Tp11, the NMOS transistor Tn11, and the NMOS transistor Tn12 are arranged in order from right to left, the essence of the present invention is that six SGTs constituting a 2-input NAND decoder and an inverter are arranged in a line to provide a decoder with a minimum area, in which connections to lines of lower diffusion layers (silicide layers), lines of upper metal layers, and gate lines are made by effectively using lines of a second metal wiring layer and lines of a first metal wiring layer. The arrangement of the SGTs, the method for providing gate lines, the positions of the gate lines, the method for providing lines of metal wiring layers, the positions of the lines of the metal wiring layers, and so on not illustrated in the drawings of the exemplary embodiments also fall within the technical scope of the present invention so long as these are based on the arrangement methods disclosed herein.

In this exemplary embodiment, a NAND decoder including four SGTs and an inverter including two SGTs, which is also used as a buffer, are combined to provide a six-SGT positive logic decoder. The essence of the present invention is that a 2-input NAND decoder including four SGTs is efficiently arranged to have a minimum wiring area, and includes the layout arrangement of a NAND decoder including four SGTs. In this case, a decoder with a negative logic output (the output of a selected decoder is logic “0”) is provided.

While the foregoing exemplary embodiments have been described as adopting the BOX structure, the exemplary embodiments may be easily achieved by using a typical CMOS structure and are not limited to the BOX structure.

In the exemplary embodiments, for convenience of description, a silicon pillar of a PMOS transistor is defined as an n-type silicon layer and a silicon pillar of an NMOS transistor is defined as a p-type silicon layer. In a process for miniaturization, however, it is difficult to control densities through impurity implantation. Thus, a so-called neutral (or intrinsic) semiconductor with no impurity implantation is used for both the silicon pillar of a PMOS transistor and the silicon pillar of an NMOS transistor, and differences in work function that is unique to a metal gate material may be used for channel control, that is, thresholds of PMOS and NMOS transistors.

In the exemplary embodiments, furthermore, lower diffusion layers or upper diffusion layers are covered with silicide layers. Silicide is used to make resistance low and any other low-resistance material may be used. A general term of metal composites is defined as silicide.

What is claimed is:

1. A semiconductor device comprising:
a NAND decoder; and
an inverter,
the NAND decoder and the inverter including six transistors, each having a source, a drain, and a gate arranged in a layered manner in a direction perpendicular to a substrate, the six transistors being arranged on the substrate in a line in a first direction,
each of the six transistors including
a silicon pillar,
an insulator that surrounds a side surface of the silicon pillar,
a gate that surrounds the insulator,
a source region disposed in an upper portion or a lower portion of the silicon pillar, and
a drain region disposed in the upper portion or the lower portion of the silicon pillar, the drain region being located on a side of the silicon pillar opposite to a side of the silicon pillar on which the source region is located,
the NAND decoder including
a first p-channel MOS transistor,
a second p-channel MOS transistor,
a first n-channel MOS transistor, and
a second n-channel MOS transistor,
the inverter including
a third p-channel MOS transistor, and
a third n-channel MOS transistor,
the gate of the first p-channel MOS transistor and the gate of the first n-channel MOS transistor being connected to each other,
the gate of the second p-channel MOS transistor and the gate of the second n-channel MOS transistor being connected to each other,
the drain regions of the first p-channel MOS transistor, the second p-channel MOS transistor, and the first n-channel MOS transistor being located closer to the substrate than the silicon pillars of the first p-channel MOS transistor, the second p-channel MOS transistor, and the first n-channel MOS transistor, respectively, and being connected to one another via silicide regions to form a first output terminal,
the source region of the second n-channel MOS transistor being located closer to the substrate than the silicon pillar of the second n-channel MOS transistor,
the source region of the first n-channel MOS transistor being connected to the drain region of the second n-channel MOS transistor via a contact,
the source regions of the first p-channel MOS transistor and the second p-channel MOS transistor being connected to a power supply line via contacts,
the source region of the second n-channel MOS transistor being connected to a reference power supply line via a silicide region,
the gate of the third p-channel MOS transistor and the gate of the third n-channel MOS transistor being connected to each other and being connected to the first output terminal,
the drain region of the third p-channel MOS transistor and the drain region of the third n-channel MOS transistor being connected to each other to form a second output terminal,
the source region of the third p-channel MOS transistor and the source region of the third n-channel MOS transistor being respectively connected to the power supply line and the reference power supply line,
the NAND decoder further including
a first address signal line, and
a second address signal line,
the gate of the first p-channel MOS transistor and the gate of the first n-channel MOS transistor, which are connected to each other, being connected to the first address signal line,
the gate of the second p-channel MOS transistor and the gate of the second n-channel MOS transistor, which are connected to each other, being connected to the second address signal line,
the power supply line, the reference power supply line, the first address signal line, and the second address signal line being arranged to extend in a second direction perpendicular to the first direction.

2. The semiconductor device according to claim 1, wherein
the six transistors are arranged in a line in an order of one of the third n-channel MOS transistor and the third p-channel MOS transistor, the other of the third n-channel MOS transistor and the third p-channel MOS transistor, the second p-channel MOS transistor, the first p-channel MOS transistor, the first n-channel MOS transistor, and the second n-channel MOS transistor.

3. The semiconductor device according to claim 1, wherein
the gate of the first p-channel MOS transistor and the gate of the first n-channel MOS transistor are connected to each other by using a line of a first metal wiring layer arranged to extend in the first direction and are connected to the first address signal line, which is formed of a line of a second metal wiring layer arranged to extend in the second direction, and
the gate of the second p-channel MOS transistor and the gate of the second n-channel MOS transistor are connected to each other by using a line of the first metal wiring layer arranged to extend in the first direction and are connected to the second address signal line, which is formed of a line of the second metal wiring layer arranged to extend in the second direction.

4. A semiconductor device comprising:

j first address signal lines, the number of which is equal to j;

k second address signal lines, the number of which is equal to k; and j×k pairs of NAND decoders and inverters, the number of which is given by j×k, each of the j×k pairs of NAND decoders and inverters including six transistors, each having a source, a drain, and a gate arranged in a layered manner in a direction perpendicular to a substrate, the six transistors being arranged on the substrate in a line in a first direction, each of the six transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the NAND decoder in each of the j×k pairs at least including a first p-channel MOS transistor, a second p-channel MOS transistor, a first n-channel MOS transistor, and a second n-channel MOS transistor, the inverter in each of the j×k pairs including a third p-channel MOS transistor, and a third n-channel MOS transistor, the gate of the first p-channel MOS transistor and the gate of the first n-channel MOS transistor being connected to each other, the gate of the second p-channel MOS transistor and the gate of the second n-channel MOS transistor being connected to each other, the drain regions of the first p-channel MOS transistor, the second p-channel MOS transistor, and the first n-channel MOS transistor being located closer to the substrate than the silicon pillars of the first p-channel MOS transistor, the second p-channel MOS transistor, and the first n-channel MOS transistor, respectively, and being connected to one another via silicide regions to form a first output terminal, the source region of the second n-channel MOS transistor being located closer to the substrate than the silicon pillar of the second n-channel MOS transistor, the source region of the first n-channel MOS transistor being connected to the drain region of the second n-channel MOS transistor via a contact, the source regions of the first p-channel MOS transistor and the second p-channel MOS transistor being connected to a power supply line via contacts, the source region of the second n-channel MOS transistor being connected to a reference power supply line via a silicide region, the gate of the third p-channel MOS transistor and the gate of the third n-channel MOS transistor being connected to each other and being connected to the first output terminal, the drain region of the third p-channel MOS transistor and the drain region of the third n-channel MOS transistor being connected to each other to form a second output terminal, the source region of the third p-channel MOS transistor and the source region of the third n-channel MOS transistor being respectively connected to the power supply line and the reference power supply line, each of the j×k pairs of NAND decoders and inverters being configured such that the gate of the first p-channel MOS transistor and the gate of the first n-channel MOS transistor, which are connected to each other, are connected to any one of the j first address signal lines, and the gate of the second p-channel MOS transistor and the gate of the second n-channel MOS transistor, which are connected to each other, are connected to any one of the k second address signal lines, the power supply line, the reference power supply line, the j first address signal lines, and the k second address signal lines being arranged to extend in a second direction perpendicular to the first direction.

5. The semiconductor device according to claim 4, wherein the six transistors are arranged in a line in an order of one of the third n-channel MOS transistor and the third p-channel MOS transistor, the other of the third n-channel MOS transistor and the third p-channel MOS transistor, the second p-channel MOS transistor, the first p-channel MOS transistor, the first n-channel MOS transistor, and the second n-channel MOS transistor.

6. The semiconductor device according to claim 4, wherein each of the j×k pairs of NAND decoders and inverters is configured such that the gate of the first p-channel MOS transistor and the gate of the first n-channel MOS transistor are connected to each other by using a line of a first metal wiring layer arranged to extend in the first direction and are connected to any one of the j first address signal lines, each of which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to any one of the k second address signal lines, each of which is formed of a line of the second metal wiring layer arranged to extend in the second direction.

7. A semiconductor device comprising:

a NAND decoder; and an inverter, the NAND decoder and the inverter including six transistors, each having a source, a drain, and a gate arranged in a layered manner in a direction perpendicular to a substrate, the six transistors being arranged on the substrate in a line in a first direction, each of the six transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the NAND decoder including a first p-channel MOS transistor, a second p-channel MOS transistor, a first n-channel MOS transistor, and a second n-channel MOS transistor, the inverter including a third p-channel MOS transistor, and a third n-channel MOS transistor, the gate of the first p-channel MOS transistor and the gate of the first n-channel MOS transistor being connected to each other, the gate of the second p-channel MOS transistor and the gate of the second n-channel MOS transistor being connected to each other, the source regions of the first p-channel MOS transistor, the second p-channel MOS transistor, and the first n-channel MOS transistor being located closer to the substrate than the silicon pillars of the first p-channel MOS transistor, the second p-channel MOS transistor, and the first n-channel MOS transistor, the drain region of the second n-channel MOS transistor being located closer to the substrate than the silicon pillar of the second n-channel MOS transistor, the drain regions of the first p-channel MOS transistor, the second p-channel MOS transistor, and the first n-channel MOS transistor being connected to one another via contacts to form a first output terminal, the source region of the first n-channel MOS transistor being connected to the drain region of the second n-channel MOS transistor via a silicide region, the source regions of the first p-channel MOS transistor and the second p-channel MOS transistor being connected to a power supply line via silicide regions, the source region of the second n-channel MOS transistor being connected to a reference power supply line via a contact, the gate of the third p-channel MOS transistor and the gate of the third n-channel MOS transistor being connected to each other and being connected to the first output terminal, the drain region of the third p-channel MOS transistor and the drain region of the third n-channel MOS transistor being connected to each other to form a second output terminal, the source region of the third p-channel MOS transistor and the source region of the third n-channel MOS transistor being respectively connected to the power supply line and the reference power supply line, the NAND decoder further including a first address signal line, and a second address signal line, the gate of the first p-channel MOS transistor and the gate of the first n-channel MOS transistor, which are connected to each other, being connected to the first address signal line, the gate of the second p-channel MOS transistor and the gate of the second n-channel MOS transistor, which are connected to each other, being connected to the second address signal line, the power supply line, the reference power supply line, the first address signal line, and the second address signal line being arranged to extend in a second direction perpendicular to the first direction.

8. The semiconductor device according to claim 7, wherein the six transistors are arranged in a line in an order of one of the third n-channel MOS transistor and the third p-channel MOS transistor, the other of the third n-channel MOS transistor and the third p-channel MOS transistor, the second p-channel MOS transistor, the first p-channel MOS transistor, the first n-channel MOS transistor, and the second n-channel MOS transistor.

9. The semiconductor device according to claim 7, wherein the source regions of the third p-channel MOS transistor and the third n-channel MOS transistor are located closer to the substrate than the silicon pillars of the third p-channel MOS transistor and the third n-channel MOS transistor, and the six transistors are arranged in a line in an order of the third n-channel MOS transistor, the third p-channel MOS transistor, the second p-channel MOS transistor, the first p-channel MOS transistor, the first n-channel MOS transistor, and the second n-channel MOS transistor.

10. The semiconductor device according to claim 7, wherein the gate of the first p-channel MOS transistor and the gate of the first n-channel MOS transistor are connected to each other by using a line of a first metal wiring layer arranged to extend in the first direction and are connected to the first address signal line, which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to the second address signal line, which is formed of a line of the second metal wiring layer arranged to extend in the second direction.

11. A semiconductor device comprising:

j first address signal lines, the number of which is equal to j;

k second address signal lines, the number of which is equal to k; and j×k pairs of NAND decoders and inverters, the number of which is given by j×k, each of the j×k pairs of NAND decoders and inverters including six transistors, each having a source, a drain, and a gate arranged in a layered manner in a direction perpendicular to a substrate, the six transistors being arranged on the substrate in a line in a first direction, each of the six transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the NAND decoder in each of the j×k pairs at least including a first p-channel MOS transistor, a second p-channel MOS transistor, a first n-channel MOS transistor, and a second n-channel MOS transistor, the inverter in each of the j×k pairs including a third p-channel MOS transistor, and a third n-channel MOS transistor, the gate of the first p-channel MOS transistor and the gate of the first n-channel MOS transistor being connected to each other, the gate of the second p-channel MOS transistor and the gate of the second n-channel MOS transistor being connected to each other, the source regions of the first p-channel MOS transistor, the second p-channel MOS transistor, and the first n-channel MOS transistor being located closer to the substrate than the silicon pillars of the first p-channel MOS transistor, the second p-channel MOS transistor, and the first n-channel MOS transistor, the drain region of the second n-channel MOS transistor being located closer to the substrate than the silicon pillar of the second n-channel MOS transistor, the drain regions of the first p-channel MOS transistor, the second p-channel MOS transistor, and the first n-channel MOS transistor being connected to one another via contacts to form a first output terminal, the source region of the first n-channel MOS transistor being connected to the drain region of the second n-channel MOS transistor via a silicide region, the source regions of the first p-channel MOS transistor and the second p-channel MOS transistor being connected to a power supply line via silicide regions, the source region of the second n-channel MOS transistor being connected to a reference power supply line via a contact, the gate of the third p-channel MOS transistor and the gate of the third n-channel MOS transistor being connected to each other and being connected to the first output terminal, the drain region of the third p-channel MOS transistor and the drain region of the third n-channel MOS transistor being connected to each other to form a second output terminal, the source region of the third p-channel MOS transistor and the source region of the third n-channel MOS transistor being respectively connected to the power supply line and the reference power supply line, each of the j×k pairs of NAND decoders and inverters being configured such that the gate of the first p-channel MOS transistor and the gate of the first n-channel MOS transistor, which are connected to each other, are connected to any one of the j first address signal lines, and the gate of the second p-channel MOS transistor and the gate of the second n-channel MOS transistor, which are connected to each other, are connected to any one of the k second address signal lines, the power supply line, the reference power supply line, the j first address signal lines, and the k second address signal lines being arranged to extend in a second direction perpendicular to the first direction.

12. The semiconductor device according to claim 11, wherein the six transistors are arranged in a line in an order of one of the third n-channel MOS transistor and the third p-channel MOS transistor, the other of the third n-channel MOS transistor and the third p-channel MOS transistor, the second p-channel MOS transistor, the first p-channel MOS transistor, the first n-channel MOS transistor, and the second n-channel MOS transistor.

13. The semiconductor device according to claim 11, wherein in each of the j×k pairs of NAND decoders and inverters, the source regions of the third p-channel MOS transistor and the third n-channel MOS transistor are located closer to the substrate than the silicon pillars of the third p-channel MOS transistor and the third n-channel MOS transistor, and the six transistors are arranged in a line in an order of the third re-channel MOS transistor, the third p-channel MOS transistor, the second p-channel MOS transistor, the first p-channel MOS transistor, the first n-channel MOS transistor, and the second n-channel MOS transistor.

14. The semiconductor device according to claim 13, wherein the source regions of the first p-channel MOS transistors, the second p-channel MOS transistors, and the third p-channel MOS transistors in the j×k pairs of NAND decoders and inverters are connected in common via a silicide layer.

15. The semiconductor device according to claim 11, wherein each of the j×k pairs of NAND decoders and inverters is configured such that the gate of the first p-channel MOS transistor and the gate of the first n-channel MOS transistor are connected to each other by using a line of a first metal wiring layer arranged to extend in the first direction and are connected to any one of the j first address signal lines, each of which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to any one of the k second address signal lines, each of which is formed of a line of the second metal wiring layer arranged to extend in the second direction.

16. A semiconductor device comprising a NAND decoder including four transistors, each having a source, a drain, and a gate arranged in a layered manner in a direction perpendicular to a substrate, the four transistors being arranged on the substrate in a line in a first direction, each of the four transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the NAND decoder including a first p-channel MOS transistor, a second p-channel MOS transistor, a first n-channel MOS transistor, and a second n-channel MOS transistor, the gate of the first p-channel MOS transistor and the gate of the first n-channel MOS transistor being connected to each other, the gate of the second p-channel MOS transistor and the gate of the second n-channel MOS transistor being connected to each other, the drain regions of the first p-channel MOS transistor, the second p-channel MOS transistor, and the first n-channel MOS transistor being located closer to the substrate than the silicon pillars of the first p-channel MOS transistor, the second p-channel MOS transistor, and the first n-channel MOS transistor, respectively, and being connected to one another via silicide regions to form a first output terminal, the source region of the second n-channel MOS transistor being located closer to the substrate than the silicon pillar of the second n-channel MOS transistor, the source region of the first n-channel MOS transistor being connected to the drain region of the second n-channel MOS transistor via a contact, the source regions of the first p-channel MOS transistor and the second p-channel MOS transistor being connected to a power supply line via contacts, the source region of the second n-channel MOS transistor being connected to a reference power supply line via a silicide region, the decoder further including a first address signal line, and a second address signal line, the gate of the first p-channel MOS transistor and the gate of the first n-channel MOS transistor, which are connected to each other, being connected to the first address signal line, the gate of the second p-channel MOS transistor and the gate of the second n-channel MOS transistor, which are connected to each other, being connected to the second address signal line, the power supply line, the reference power supply line, the first address signal line, and the second address signal line being arranged to extend in a second direction perpendicular to the first direction.

17. The semiconductor device according to claim 16, wherein the four transistors are arranged in a line in an order of the second p-channel MOS transistor, the first p-channel MOS transistor, the first n-channel MOS transistor, and the second n-channel MOS transistor.

18. The semiconductor device according to claim 16, wherein the gate of the first p-channel MOS transistor and the gate of the first n-channel MOS transistor are connected to each other by using a line of a first metal wiring layer arranged to extend in the first direction and are connected to the first address signal line, which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to the second address signal line, which is formed of a line of the second metal wiring layer arranged to extend in the second direction.

19. A semiconductor device comprising:

j first address signal lines, the number of which is equal to j;

k second address signal lines, the number of which is equal to k; and j×k NAND decoders, the number of which is given by j×k, each of the j×k NAND decoders including four transistors, each having a source, a drain, and a gate arranged in a layered manner in a direction perpendicular to a substrate, the four transistors being arranged on the substrate in a line in a first direction, each of the four transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the NAND decoder at least including a first p-channel MOS transistor, a second p-channel MOS transistor, a first n-channel MOS transistor, and a second n-channel MOS transistor, the gate of the first p-channel MOS transistor and the gate of the first n-channel MOS transistor being connected to each other, the gate of the second p-channel MOS transistor and the gate of the second n-channel MOS transistor being connected to each other, the drain regions of the first p-channel MOS transistor, the second p-channel MOS transistor, and the first n-channel MOS transistor being located closer to the substrate than the silicon pillars of the first p-channel MOS transistor, the second p-channel MOS transistor, and the first n-channel MOS transistor, respectively, and being connected to one another via silicide regions to form a first output terminal, the source region of the second n-channel MOS transistor being located closer to the substrate than the silicon pillar of the second n-channel MOS transistor, the source region of the first n-channel MOS transistor being connected to the drain region of the second n-channel MOS transistor via a contact, the source regions of the first p-channel MOS transistor and the second p-channel MOS transistor being connected to a power supply line via contacts, the source region of the second n-channel MOS transistor being connected to a reference power supply line via a silicide region, each of the j×k NAND decoders being configured such that the gate of the first p-channel MOS transistor and the gate of the first n-channel MOS transistor, which are connected to each other, are connected to any one of the j first address signal lines, and the gate of the second p-channel MOS transistor and the gate of the second n-channel MOS transistor, which are connected to each other, are connected to any one of the k second address signal lines, the power supply line, the reference power supply line, the j first address signal lines, and the k second address signal lines being arranged to extend in a second direction perpendicular to the first direction.

20. The semiconductor device according to claim 19, wherein the four transistors are arranged in a line in an order of the second p-channel MOS transistor, the first p-channel MOS transistor, the first n-channel MOS transistor, and the second n-channel MOS transistor.

21. The semiconductor device according to claim 19, wherein each of the j×k NAND decoders is configured such that the gate of the first p-channel MOS transistor and the gate of the first n-channel MOS transistor are connected to each other by using a line of a first metal wiring layer arranged to extend in the first direction and are connected to any one of the j first address signal lines, each of which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to any one of the k second address signal lines, each of which is formed of a line of the second metal wiring layer arranged to extend in the second direction.

22. A semiconductor device comprising a NAND decoder including four transistors, each having a source, a drain, and a gate arranged in a layered manner in a direction perpendicular to a substrate, the four transistors being arranged on the substrate in a line in a first direction, each of the four transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, the NAND decoder including a first p-channel MOS transistor, a second p-channel MOS transistor, a first n-channel MOS transistor, and a second n-channel MOS transistor, the gate of the first p-channel MOS transistor and the gate of the first n-channel MOS transistor being connected to each other, the gate of the second p-channel MOS transistor and the gate of the second n-channel MOS transistor being connected to each other, the source regions of the first p-channel MOS transistor, the second p-channel MOS transistor, and the first n-channel MOS transistor being located closer to the substrate than the silicon pillars of the first p-channel MOS transistor, the second p-channel MOS transistor, and the first n-channel MOS transistor, the drain region of the second n-channel MOS transistor being located closer to the substrate than the silicon pillar of the second n-channel MOS transistor, the drain regions of the first p-channel MOS transistor, the second p-channel MOS transistor, and the first n-channel MOS transistor being connected to one another via contacts to form a first output terminal, the source region of the first n-channel MOS transistor being connected to the drain region of the second n-channel MOS transistor via a silicide region, the source regions of the first p-channel MOS transistor and the second p-channel MOS transistor being connected to a power supply line via silicide regions, the source region of the second n-channel MOS transistor being connected to a reference power supply line via a contact, the NAND decoder further including a first address signal line, and a second address signal line, the gate of the first p-channel MOS transistor and the gate of the first n-channel MOS transistor, which are connected to each other, being connected to the first address signal line, the gate of the second p-channel MOS transistor and the gate of the second n-channel MOS transistor, which are connected to each other, being connected to the second address signal line, the power supply line, the reference power supply line, the first address signal line, and the second address signal line being arranged to extend in a second direction perpendicular to the first direction.

23. The semiconductor device according to claim 22, wherein the four transistors are arranged in a line in an order of the second p-channel MOS transistor, the first p-channel MOS transistor, the first n-channel MOS transistor, and the second n-channel MOS transistor.

24. The semiconductor device according to claim 22, wherein the gate of the first p-channel MOS transistor and the gate of the first n-channel MOS transistor are connected to each other by using a line of a first metal wiring layer arranged to extend in the first direction and are connected to the first address signal line, which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to the second address signal line, which is formed of a line of the second metal wiring layer arranged to extend in the second direction.

25. A semiconductor device comprising:

j first address signal lines, the number of which is equal to j;

k second address signal lines, the number of which is equal to k; and j×k NAND decoders, the number of which is given by j×k, each of the j×k NAND decoders including four transistors, each having a source, a drain, and a gate arranged in a layered manner in a direction perpendicular to a substrate, the four transistors being arranged on the substrate in a line in a first direction, each of the four transistors including a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located, each of the j×k NAND decoders at least including a first p-channel MOS transistor, a second p-channel MOS transistor, a first n-channel MOS transistor, and a second n-channel MOS transistor, the gate of the first p-channel MOS transistor and the gate of the first n-channel MOS transistor being connected to each other, the gate of the second p-channel MOS transistor and the gate of the second n-channel MOS transistor being connected to each other, the source regions of the first p-channel MOS transistor, the second p-channel MOS transistor, and the first n-channel MOS transistor being located closer to the substrate than the silicon pillars of the first p-channel MOS transistor, the second p-channel MOS transistor, and the first n-channel MOS transistor, the drain region of the second n-channel MOS transistor being located closer to the substrate than the silicon pillar of the second n-channel MOS transistor, the drain regions of the first p-channel MOS transistor, the second p-channel MOS transistor, and the first n-channel MOS transistor being connected to one another via contacts to form a first output terminal, the source region of the first n-channel MOS transistor being connected to the drain region of the second n-channel MOS transistor via a silicide region, the source regions of the first p-channel MOS transistor and the second p-channel MOS transistor being connected to a power supply line via silicide regions, the source region of the second n-channel MOS transistor being connected to a reference power supply line via a contact, each of the j×k NAND decoders being configured such that the gate of the first p-channel MOS transistor and the gate of the first n-channel MOS transistor, which are connected to each other, are connected to any one of the j first address signal lines, and the gate of the second p-channel MOS transistor and the gate of the second n-channel MOS transistor, which are connected to each other, are connected to any one of the k second address signal lines, the power supply line, the reference power supply line, the j first address signal lines, and the k second address signal lines being arranged to extend in a second direction perpendicular to the first direction.

26. The semiconductor device according to claim 25, wherein the four transistors are arranged in a line in an order of the second p-channel MOS transistor, the first p-channel MOS transistor, the first n-channel MOS transistor, and the second n-channel MOS transistor.

27. The semiconductor device according to claim 25, wherein the source regions of the first p-channel MOS transistors and the second p-channel MOS transistors in the j×k NAND decoders are connected in common via a silicide layer.

28. The semiconductor device according to claim 25, wherein each of the j×k NAND decoders is configured such that the gate of the first p-channel MOS transistor and the gate of the first n-channel MOS transistor are connected to each other by using a line of a first metal wiring layer arranged to extend in the first direction and are connected to any one of the j first address signal lines, each of which is formed of a line of a second metal wiring layer arranged to extend in the second direction, and the gate of the second p-channel MOS transistor and the gate of the second n-channel MOS transistor are connected to each other by using a line of the first metal wiring layer arranged to extend in the first direction and are connected to any one of the k second address signal lines, each of which is formed of a line of the second metal wiring layer arranged to extend in the second direction.

* * * * *

UNITED STATES PATENT AND TRADEMARK OFFICE

CERTIFICATE OF CORRECTION

PATENT NO. : 9,590,631 B2
APPLICATION NO. : 15/214940
DATED : March 7, 2017
INVENTOR(S) : Fujio Masuoka et al.

It is certified that error appears in the above-identified patent and that said Letters Patent is hereby corrected as shown below:

On the Title Page

Left Column, item (72), after "Asano," replace "Musashino" with --Tokyo--.

In the Claims

In Column 42, Claim 13, Line 14, before "MOS transistor," replace "re-channel" with --n-channel--.

Signed and Sealed this
Ninth Day of October, 2018

Andrei Iancu
*Director of the United States Patent and Trademark Office*